United States Patent [19]
Takemae et al.

[11] Patent Number: 6,151,274
[45] Date of Patent: *Nov. 21, 2000

[54] SYSTEM CONFIGURED OF SYNCHRONOUS SEMICONDUCTOR DEVICE FOR ADJUSTING TIMING OF EACH INPUT AND SEMICONDUCTOR DEVICE USED THEREFOR

[75] Inventors: Yoshihiro Takemae; Masao Taguchi; Yasurou Matsuzaki; Hiroyoshi Tomita; Hirohiko Mochizuki; Atsushi Hatakeyama; Yoshinori Okajima, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/440,665

[22] Filed: Nov. 16, 1999

Related U.S. Application Data

[62] Division of application No. 08/924,705, Sep. 5, 1997.

[30] Foreign Application Priority Data

| Sep. 17, 1996 | [JP] | Japan | 8-245118 |
| Oct. 11, 1996 | [JP] | Japan | 8-270090 |
| Dec. 13, 1996 | [JP] | Japan | 8-334208 |
| Jun. 26, 1997 | [JP] | Japan | 9-170714 |

[51] Int. Cl.⁷ ......................................... G11C 8/00
[52] U.S. Cl. ........................... 365/233; 365/194; 365/210
[58] Field of Search .......................... 365/233, 194, 365/210

[56] References Cited

U.S. PATENT DOCUMENTS

| 4,839,907 | 6/1989 | Saneski | 375/113 |
| 5,036,529 | 7/1991 | Shin | 375/119 |
| 5,446,867 | 8/1995 | Young et al. | 395/550 |
| 5,486,783 | 1/1996 | Baumert et al. | 327/147 |
| 5,488,641 | 1/1996 | Ozkan | 375/374 |
| 5,495,452 | 2/1996 | Cha | 365/233 |
| 5,532,632 | 7/1996 | Kent | 327/141 |
| 5,539,344 | 7/1996 | Hatakenaka | 327/147 |
| 5,572,482 | 11/1996 | Hoshizaki et al. | 365/233 |
| 5,579,267 | 11/1996 | Koshikawa | 365/233 |
| 5,581,512 | 12/1996 | Kitamura | 365/233 |
| 5,621,698 | 4/1997 | Lee | 365/233 |

(List continued on next page.)

FOREIGN PATENT DOCUMENTS

| 0 575 691A2 | 12/1993 | European Pat. Off. . |
| 0 653 860A2 | 5/1995 | European Pat. Off. . |
| 2 127 594 | 4/1984 | United Kingdom . |
| 2 297 209 | 7/1996 | United Kingdom . |
| 2 316 208 | 2/1998 | United Kingdom . |
| WO94/20898 | 9/1994 | WIPO . |

*Primary Examiner*—Richard Elms
*Assistant Examiner*—Tuan T. Nguyen
*Attorney, Agent, or Firm*—Arent Fox Kintner Plotkin & Kahn PLLC

[57] ABSTRACT

A system and a semiconductor device for realizing such a system are disclosed. The system uses at least a semiconductor device for retrieving an input signal in synchronism with an internal clock generated from an external clock, the input signal remaining effectively in synchronism with the external clock. Even in the case where a phase difference develops between a clock and a signal at the receiving end, or even in the case where a phase difference develops between a clock input circuit and other signal input circuits in the semiconductor device at the receiving end, data can be transferred at high speed. Each input circuit of the semiconductor device at the receiving end includes an input timing adjusting circuit for adjusting the phase of the clock applied to the input circuit in such a manner that the input circuit retrieves the input signal in an effective and stable state. In the case where the skew between the input signals is small as compared with the skew between the input signals and the clock, an input timing adjusting circuit is shared by a plurality of the input circuits.

13 Claims, 80 Drawing Sheets

U.S. PATENT DOCUMENTS

| | | | |
|---|---|---|---|
| 5,648,931 | 7/1997 | Obara | 365/189.05 |
| 5,687,134 | 11/1997 | Sugawara et al. | 365/233 |
| 5,689,473 | 11/1997 | Toda | 365/233 |
| 5,694,371 | 12/1997 | Kawaguchi | 365/233 |
| 5,708,611 | 1/1998 | Iwamoto et al. | 365/195 |
| 5,717,652 | 2/1998 | Ooishi | 365/233 |
| 5,768,213 | 6/1998 | Jung et al. | 365/233 |
| 5,812,490 | 9/1998 | Tsukude | 365/233 |
| 5,995,441 | 11/1999 | Kato et al. | 365/233 |

Fig.29

| CONDITION | REGISTER | | | OPERATION |
|---|---|---|---|---|
| | RG0 | RG1 | RG2 | |
| 1 | H | H | H | HOLD |
| 2 | L | L | L | HOLD |
| 3 | H | H | L | DELAY CLOCK |
| 4 | H | L | L | FORWARD CLOCK |
| 5 | L | L | H | DELAY CLOCK |
| 6 | L | H | H | FORWARD CLOCK |

- HOLD SIGNAL
  - H: HOLD
  - L: CHANGE
- UP/DOWN SIGNAL
  - H: DELAY CLOCK
  - L: FORWARD CLOCK

| CONDITION | REGISTER | | | | OPERATION |
|---|---|---|---|---|---|
| | RG3 | RG0 | RG1 | RG2 | |
| Qa-1 | H | H | H | H | HOLD |
| Qa-2 | L | L | L | L | |
| Qb-1 | H | L | L | L | |
| Qb-2 | L | H | H | H | |
| Qc-1 | H | H | L | L | |
| Qc-2 | L | L | H | H | |
| Qd-1 | H | H | H | L | |
| Qd-2 | L | L | L | H | |
| Qe-1 | H | L | H | H | FORWARD CLOCK |
| Qe-2 | L | H | L | L | |
| Qf-1 | H | L | L | H | DELAY CLOCK |
| Qf-2 | L | H | H | L | |

Fig.43

| CONDITION | REGISTER | | | | OPERATION | COMPENSATION CONTROL SIGNAL (H1) |
|---|---|---|---|---|---|---|
| | RG3 | RG0 | RG1 | RG2 | | |
| Qa-1 | H | H | H | H | HOLD | ADD (H) |
| Qa-2 | L | L | L | L | | |
| Qb-1 | H | L | L | L | | NOT ADD (L) |
| Qb-2 | L | H | H | H | | |
| Qc-1 | H | H | L | H | | |
| Qc-2 | L | L | H | L | | |
| Qd-1 | H | L | H | L | | ADD (H) |
| Qd-2 | L | H | L | H | | |
| Qe-1 | H | H | H | L | FORWARD CLOCK | NOT ADD (L) |
| Qe-2 | L | L | L | H | | |
| Qf-1 | H | L | L | H | DELAY CLOCK | |
| Qf-2 | L | H | H | L | | |

Fig. 45

|  | $t_0-t_1$ | $t_1-t_2$ | $t_2-t_3$ | $t_3-t_4$ |
|---|---|---|---|---|
| Q0 | Q0B | Q0B | Q0B | Q0C |
| Q1 | Q1A | Q1B | Q1B | Q1B |
| Q2 | Q2B | Q2B | Q2C | Q2C |

SYSTEM CONFIGURED OF SYNCHRONOUS SEMICONDUCTOR DEVICE FOR ADJUSTING TIMING OF EACH INPUT AND SEMICONDUCTOR DEVICE USED THEREFOR

This application is a divisional application filed under 37 CFR § 1.53(b) of parent application Ser. No. 08/924,705, filed Sep. 5, 1997.

BACKGROUND OF THE INVENTION

1. Field of the Invention

The present invention relates to a system using a semiconductor device for retrieving an input signal effectively synchronous with an external clock in synchronism with an internal clock generated from the external clock, and a semiconductor device used for the system, or more in particular to a semiconductor device system adapted to retrieve an input signal at a predetermined timing by adjusting the timing of the internal clock in the case where a skew exists between signals or the ambient temperature or the source voltage undergoes a fluctuation, and a semiconductor device used for the system.

2. Description of the Related Art

A large-scale semiconductor device system including a computer using a semiconductor device is configured in such a manner that each portion of the system is synchronized with a clock, and the input/output operation of signals including data signals and address signals are executed in synchronism with the clock signal. A memory operated in accordance with a clock supplied from an external source is called the synchronous type, and a DRAM (dynamic random access memory) of synchronous type is called the SDRAM. The present invention primarily relates to the SDRAM, which will be mainly referred to in the description that follows. Nevertheless, the present invention is not confined to the SDRAM.

In recent years, the increased speed of clocks for CPUs or the increased processing speed of various other electronic circuits have given rise to a demand for increasing the speed of interfaces connecting semiconductor devices. The SDRAM is a semiconductor device meeting this demand for higher speed, and continuous addresses therein can be accessed very quickly. Signals on a data bus undergo a change with a very short period, and therefore it is necessary to retrieve the signals from the data bus at high speed.

In the case where a semiconductor device retrieves an input signal, a period is defined during which the input signal is required to be established before and after the timing of retrieval. The period during which the input signal is required to be established before the retrieval timing is called a set-up time, and the period during which the input signal is required to be established after the retrieval timing is called a hold time.

With the ever increasing speed of CPU clocks in computer systems and various electronic circuits in recent years, an increased speed of the interfaces connecting semiconductor devices is urgently required. In a high-speed system using such high-speed semiconductor devices, the input establishment time for each semiconductor device to retrieve the input signal defines the system speed. The input establishment time of the semiconductor devices should therefore be reduced.

In a low-speed system, the period before a signal is established is relatively small as compared with the clock period, and poses no problem. Such a period poses a very serious problem, however, for a high-speed system with a very short clock period. For this reason, in high-speed systems measure are taken to equalize the length of the clock signal line and the lengths of other signal lines as far as possible. In spite of this, it is difficult to equalize the wiring lengths and loads exactly, and some phase difference is unavoidable, thereby posing a barrier to an increased speed.

Another problem is that of the phase difference for the semiconductor device at the receiving end. The clock input circuit has a configuration equivalent to the input circuits for other input signals, so that an arrangement is made to assure the same delay of the clock period and the input signal applied to the semiconductor device before being transmitted to a latch circuit. Actually, however, it is impossible to design the circuits to be completely identical to each other. For this reason, although the delay amounts are set as close to each other as possible, somewhat different circuits and wirings are unavoidable. Taking into consideration the variations in the production process and the temperature dependency and the source voltage dependency of the delay amount, the delay amount is differentiated even in the case where the clock input circuit is equivalent to the signal input circuit. Due to the difference in delay amount, the input establishment time required by the circuit operation varies somewhat from the rising edge of the clock CLK. The input establishment time is required to be included in the effective signal period, and in the case where this condition fails to be met, a normal input signal retrieval is impossible. Conventionally, however, the input establishment time, i.e., the set-up time and the hold time required for the circuit operation are defined taking these variations into consideration.

With the recent increase in the CPU clock speed and the processing speed of various electronic circuits in the computer systems, there is an ever increasing demand for a higher speed of the interfaces connecting the semiconductor devices. In a high-speed system using such high-speed semiconductor devices, the input establishment time for each semiconductor device to retrieve the input signal defines the system speed, and it is necessary to reduce the input establishment time of the semiconductor devices.

SUMMARY OF THE INVENTION

The object of the present invention is to provide a system capable of increasing the speed of data transfer even in the case where the clock and a signal are out of phase with each other at the receiving end or even in the case where a phase difference develops between the clock input circuit and the other signal input circuits in the semiconductor device at the receiving end, and to provide a semiconductor device used for such a system.

In order to achieve the above-mentioned object, according to the present invention, there is provided a semiconductor device system comprising an input timing adjusting circuit in the semiconductor device at the receiving end for adjusting the phase of the clock supplied to the input circuit to allow the input circuit to retrieve the input signal in an effective, safe manner. The input timing adjusting circuit is preferably provided for each input circuit. In the case where the skew between input signals is smaller than the skew between the input signals and the clock, however, an input timing adjusting circuit can be shared by a plurality of input circuits.

In a semiconductor device system according to this invention, the skew which may develop between the clock and the input signal is reduced substantially to zero as a result of the adjustment made to attain the optimum timing. Therefore, the input signal can remain effective for a longer time in the input circuit.

The input timing adjusting circuit includes a delay circuit with a selectable delay amount for delaying the internal clock generated on the basis of a received clock and producing it as an input timing clock, a signal input circuit for retrieving the input signal in synchronism with the input timing clock, a phase comparator for comparing the phase of the input timing cock with that of the input signal, and a delay control circuit for changing the amount of delay of the delay circuit in such a manner as to attain a predetermined phase of the input timing clock with respect to the input signal on the basis of the decision of the phase comparator.

In the case where the input timing adjusting circuit includes such a feedback circuit, some time is required before the control value of the feedback circuit converges. In the case where such a semiconductor device system is started, therefore, a predetermined time adjust mode is always necessary. In this adjust mode, a signal suitable for feedback of the input timing adjusting circuit can be applied as an input. Even after this adjust mode, the feedback control is continued or the control value as of the time point at the end of the adjust mode is stored and maintained. In the case where the feedback control is continued even after the adjust mode, any phase change that may occur after the adjust mode can be handled. Since a signal associated with normal operation is input after the adjust mode, however, it is necessary that the feedback control can be carried out with such a signal for normal operation. In the case where the control value as of the time point at the end of the adjust mode is stored and maintained, on the other hand, the configuration is simpler than in the case where the feedback control is continued after the adjust mode, but any phase change that may occur after the adjust mode cannot be handled appropriately. For this reason, an adjust mode is preferably inserted at regular intervals of time.

In the case where two signal phases are compared, it is generally determined whether the changing edge of one signal is advanced of that of the other signal by comparing the temporal relation between the two signals. As for an input circuit, however, the input timing clock is a signal changing with the input signal in a stable state, and therefore the phases thereof cannot be compared. As a result, it is necessary that the phase of the input timing clock is displaced by a predetermined amount to generate a shift clock changing in phase with the input signal, so that the phase of the shift clock is compared with that of the input signal, or that the input signal phase is displaced by a predetermined amount to compare the phase of the input timing clock with that of the shift input signal thus displaced. In the case where a shift clock or a displaced input signal is generated at the receiving end, the input signal can be retrieved by the input timing clock while comparing the phases thereof and therefore it is possible to continue the feedback control after completion of the adjust mode. In the case where a signal with a phase displaced by a predetermined amount is generated at the driving end, however, the signal displaced by a predetermined amount of phase different from the signal for normal operation is required to be transmitted to the receiving end. Such a signal, however, cannot be transmitted in a normal mode. A signal displaced by a predetermined amount of phase can be generated at the driving end, therefore, only in the case where the feedback control is not carried out after the adjust mode. In the case where an input signal displaced by a predetermined amount of phase is generated at the receiving end, on the other hand, the input signals received by a current mirror circuit and a buffer circuit are required to be used directly for comparison without latching the input signals. Under such a condition, however, pulse quality of the input signals are deteriorated and therefore satisfactory comparison is impossible. In the case where a signal displaced by a predetermined amount of phase is generated at the receiving end, therefore, a shift clock is desirably generated. An alternative is to generate a shift clock at the driving end and transmit it in the adjust mode. In view of the fact that the clock constitutes a reference for synchronous operation, however, different clock phases are not desirable even in the adjust mode. In the case where a signal displaced by a predetermined amount of phase is generated and transmitted at the driving end, therefore, it is desirable to produce such a signal in synchronism with the shift clock in the adjust mode and produce it in synchronism with the clock at the time of normal operation.

In phase comparison, the phase of the input signal before being latched can be compared with that of the timing signal or the shift clock. The problem, however, is that the deteriorated input signal as described above makes satisfactory phase comparison difficult. In view of this, according to this invention, phase comparison is done taking advantage of the fact that in the case where an input signal changing in one direction is latched by a timing signal in the neighborhood of the changing edge thereof, the latched value is different depending on whether the phase is advanced or delayed.

In the presence of a receiving timing adjust mode, the signal retrieved by a signal input circuit can be used always as a signal changing in predetermined periods. As a result, in the case where a signal is involved which changes a predetermined time before the timing of retrieving the signal value to be decided, i.e., in the case where a signal changing each period is involved, for example, it can be decided whether the signal changes from "low" to "high" or from "high" to "low" by determining a signal value one-half period before. In the case where a decision is made in normal mode, in contrast, the signal retrieved by the signal input circuit is a normal signal and therefore the manner in which it changes cannot be determined. In such a case, the signal values before and after the timing of retrieving Lhe signal value to be determined are handled to determine whether the input signal has changed and, if so, the direction in which it may have changed.

At higher speeds, the value of the input signal which may change for each clock cycle may change to the next value before a full change to a value. In view of the fact that the input signal has changed sufficiently to a value in the case where the same values succeed, however, the waveform changing to the next value is different, thereby generating a phase difference. In the case where the input timing is adjusted, therefore, it is necessary to take the previous state of the input signal into consideration. In a semiconductor device system according to this invention, the receiving end thereof includes a minimum period change detection circuit for detecting any continuous change of the input signal during the immediately preceding two clock cycles, wherein the delay control circuit carries out the feedback control to change the amount of delay of the delay circuit only when the input signal changes continuously during the immediately preceding two clock cycles but carries out no feedback control on other occasions. This control leads to the adjustment to attain the optimum timing in the case where the input signal value changes at each clock cycle. When the input signal value continues to remain the same, therefore, the input timing signal is desirably corrected by a corresponding amount. In view of this, the receiving end of the semiconductor device system according to this invention includes a timing correction circuit for selecting whether the timing of retrieval at the signal input circuit should be delayed by a predetermined amount or not and an immediately preceding change detection circuit for detecting any change of the input signal which may occur during the immediately preceding clock cycle. Thus, in the case where the input signal fails to change during the immediately preceding clock cycle, the timing of retrieval at the signal input circuit is delayed a predetermined amount by the timing correction circuit. As a result, regardless of whether the input signal value changes for each clock cycle or continues to assume the same value, the input signal can be retrieved at appropriate timings.

Further, since the input timing is adjusted by an input timing adjusting circuit included in each input circuit, each input circuit can retrieve an input signal at optimum timing. In spite of this, the outputs of the input circuits are out of phase and fail to be in phase. This out-of-phase condition is not desirable in view of the fact that the operation of the internal circuits is performed in synchronism with the clock, and the signals applied to the internal circuits are desirably in phase. For this reason, the receiving end of the semiconductor device system according to this invention further includes an inter-signal timing adjusting circuit for detecting the phase difference between the output signals of the input circuits and regulating the signals into phase.

The inter-signal timing adjusting circuit includes, for example, a common effective period detection circuit for detecting the period during which all the outputs of a plurality of input circuits are in the same cycle and for producing a common effective signal during the same period, and a plurality of latch circuits for latching the outputs of the plurality of the input circuits during the common effective signal period. As an alternative, the inter-signal timing adjusting circuit includes a signal delay circuit for delaying the outputs of the plurality of the input circuits and a delay control register for detecting a signal most delayed among the outputs of the input circuits and controlling the amount of delay of the signal delay circuit in such a manner as to meet the need of the most delayed signal. For this adjustment to be carried out, it is necessary to change all the input signals in the same pattern and also to provide an adjust mode for this purpose. The phase difference between the outputs of the input circuits can also be detected by the control value of the input timing adjusting circuit inserted in each input circuit. In such a case, the inter-signal timing adjusting circuit can detect the phase difference between the output signals of the signal input circuits on the basis of the control value of the delay control circuit.

BRIEF DESCRIPTION OF THE DRAWINGS

The present invention will be more clearly understood from the description as set below with reference to the accompanying drawings, wherein:

FIG. 29 is a truth table for the phase judging operation according to the second embodiment;

FIG. 43 is a diagram showing a truth table for a phase judge circuit according to the sixth embodiment;

FIG. 45 is a diagram showing a change in the signal value within a clock cycle of the output of the input circuit according to the invention shown in FIG. 8;

DESCRIPTION OF THE PREFERRED EMBODIMENTS

Prior to the description of the preferred embodiments of the present invention, input timing in a synchronous DRAM of a prior art will be described for a better understanding of the difference between the present invention and the prior art. The embodiments in which the present invention is adapted to a synchronous DRAM will be described later. As mentioned previously, the present invention is not limited to the synchronous DRAM but can apply to any semiconductor integrated circuit for receiving an input signal synchronously with an externally-input signal.

Figure 1:
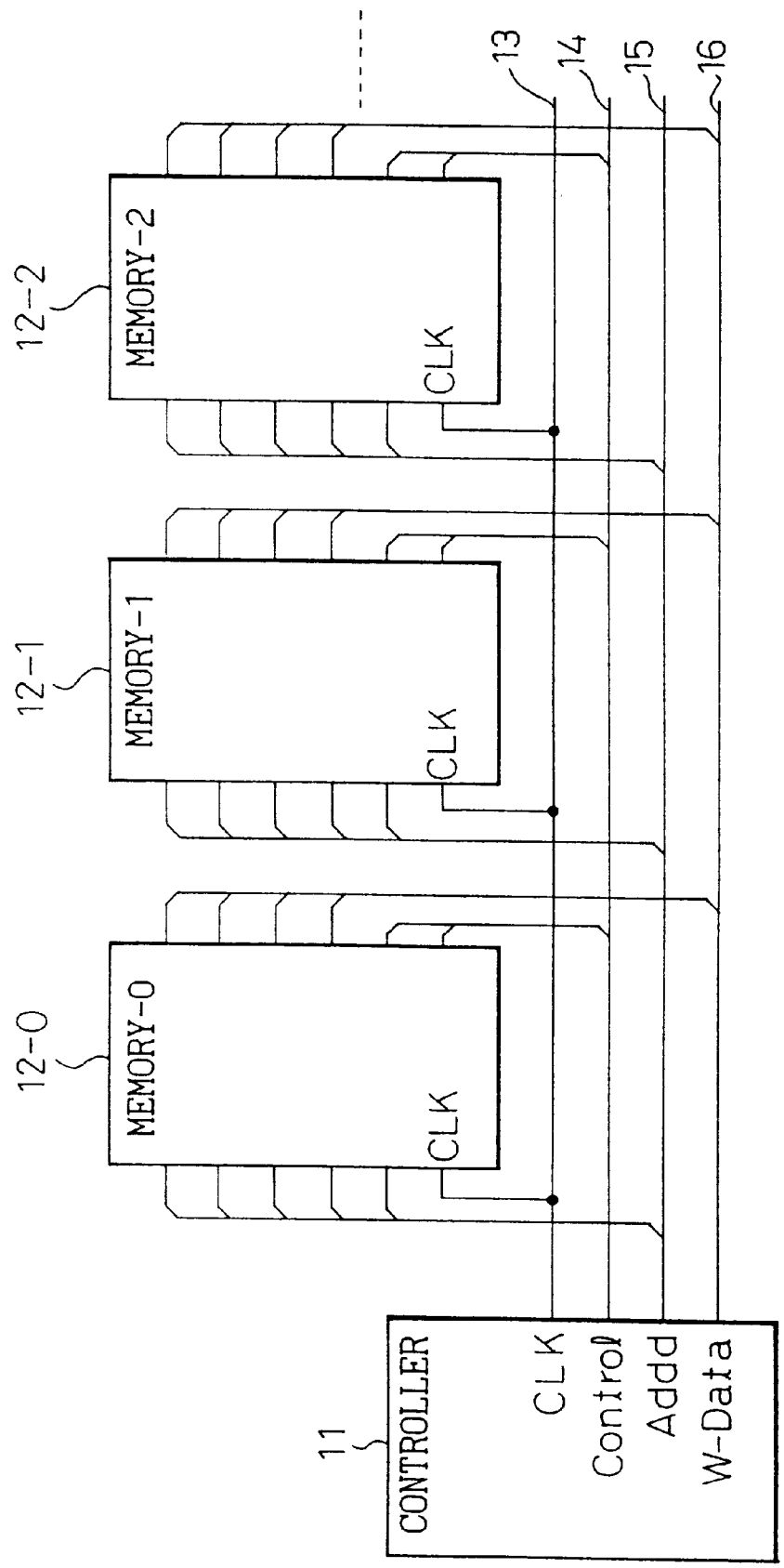
FIG. 1 is a diagram showing an example configuration of a semiconductor device system.

FIG. 1 is a diagram showing an example configuration of a typical conventional semiconductor device system. The system shown in FIG. 1 is for controlling the data input/output to and from a plurality of memories 12-0, 12-1, 12-2 by a controller 11, and especially represents a configuration for writing data into the memories. As shown in FIG. 1, a clock signal line 12, a control signal bus 14, an address signal bus 15 and a write data bus 16 extending from the controller 11 are arranged in parallel. The memories 12-0, 12-1, 12-2 are arranged along these signal lines. Each of the terminals of the memories 12-0, 12-1, 12-2 is connected to a corresponding wire. In FIG. 1, the memories 12-0, 12-1, 12-2 are shown to be arranged above the signal lines and buses. Actually, however, the wiring is arranged to pass between the terminals of the memories 12-0, 12-1, 12-2. A signal is output from the controller 11 to the clock signal line 13, the control signal bus 14, the address signal bus 15 and the write data bus 16. Each memory retrieves the clock, generates an internal clock, retrieves the signals from the control signal bus 14, the address signal bus 15 and the write data bus 16 on the basis of the internal clock thus generated, and after the required processing, stores the data output on the write data bus. The memories 12-0, 12-1, 12-2 are SDRAMs operating in accordance with the clock supplied from an external source.

Figure 2:
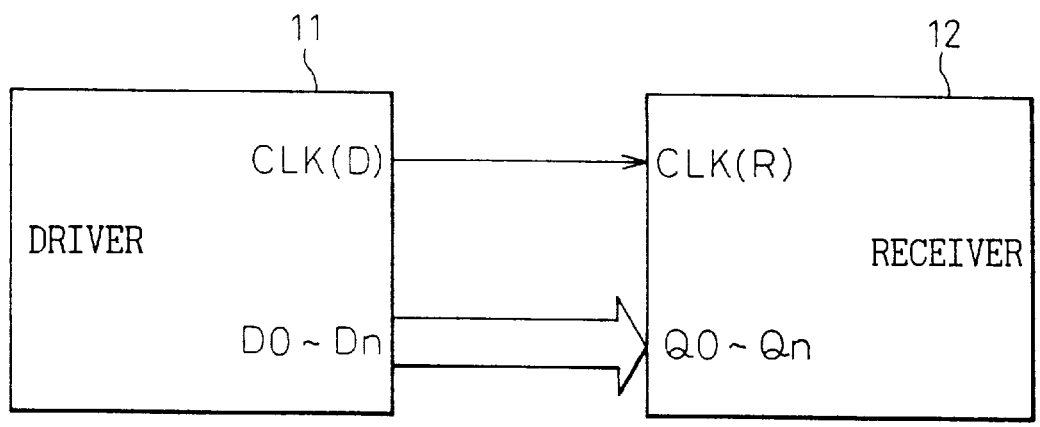
FIG. 2 is a diagram showing a basic configuration of a transmission system of a signal synchronous with a clock.

FIG. 2 is a diagram showing an example of a most basic configuration of such a semiconductor device system as described above. As shown in FIG. 2, this system includes a semiconductor device 11 at the driving end for sending out a signal and a semiconductor device 12 at the receiving end for receiving the signal. Output signals D0 to Dn are output in synchronism with a clock signal CLK as well as the clock signal CLK from the semiconductor device 11 at the driving end. The signals sent from the semiconductor device 11 at the driving side in synchronism with the received clock CLK are retrieved as input signals Q0 to Qn by the semiconductor device 12 at the receiving end. The semiconductor devices making up the semiconductor device system transmit and receive signals to and from other semiconductor devices, and can therefore operate either at the driving end or at the receiving end depending on the operation involved.

Figure 3:
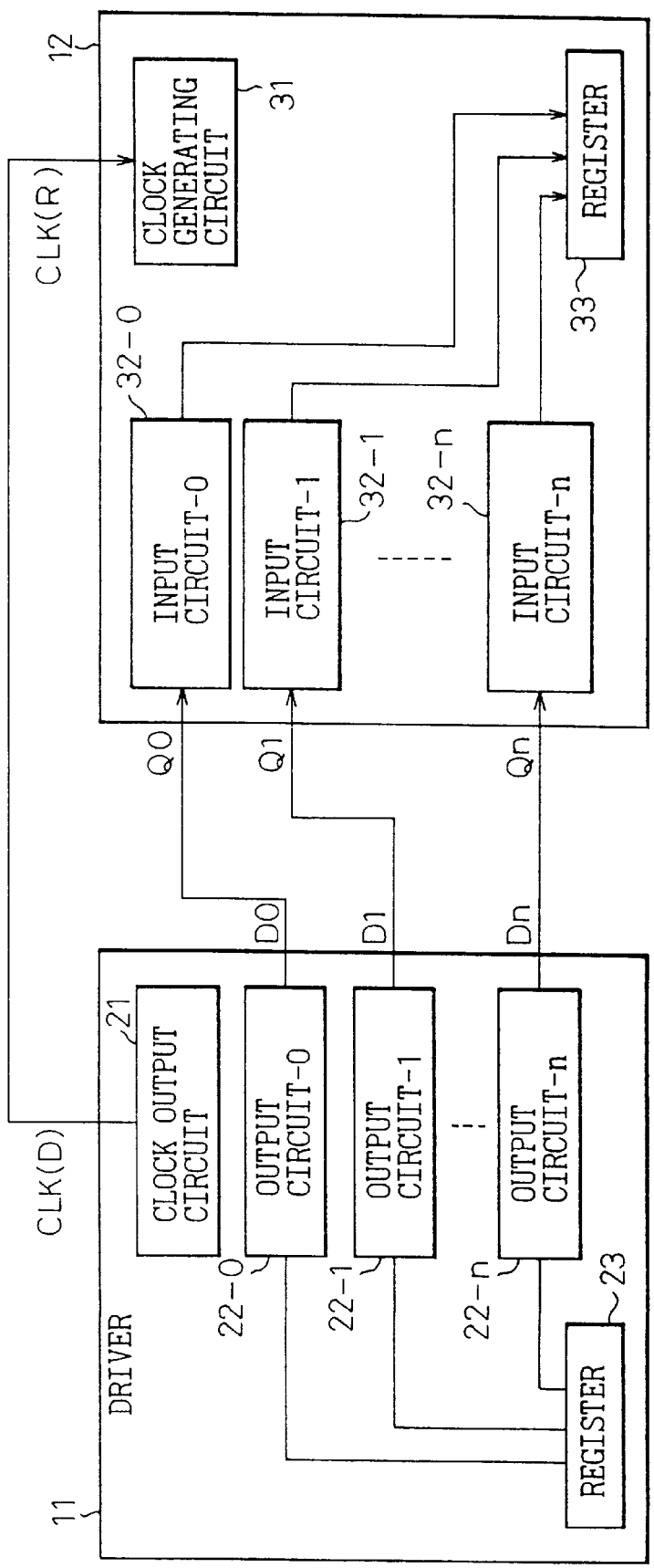
FIG. 3 is a diagram showing a configuration for clock synchronous transmission in a semiconductor device system.

FIG. 3 is a diagram showing in detail a route of signal transmission and receiving for the semiconductor devices at the driving and receiving ends. As shown in FIG. 3, the driving-end semiconductor device 11 outputs a clock signal CLK(D) from a clock output circuit 21. Output signals D0, D1, . . . , Dn generated by a register 23 are output through output circuits 22-0, 22-1, . . . , 22-n, respectively. The receiving-end semiconductor 12, on the other hand, includes a clock generating circuit 31 for generating an internal clock in response to the clock signal CLK, input circuits 32-0, 32-1, . . . , 32-n for retrieving input signals Q0, Q1, . . . , Qn corresponding to the output signals D0, D1, . . . , Dn, respectively, and a register 33 arranged for receiving these signals in an internal circuit for processing the outputs of the input circuits 32-0, 32-1, . . . , 32-n.

Figure 4:
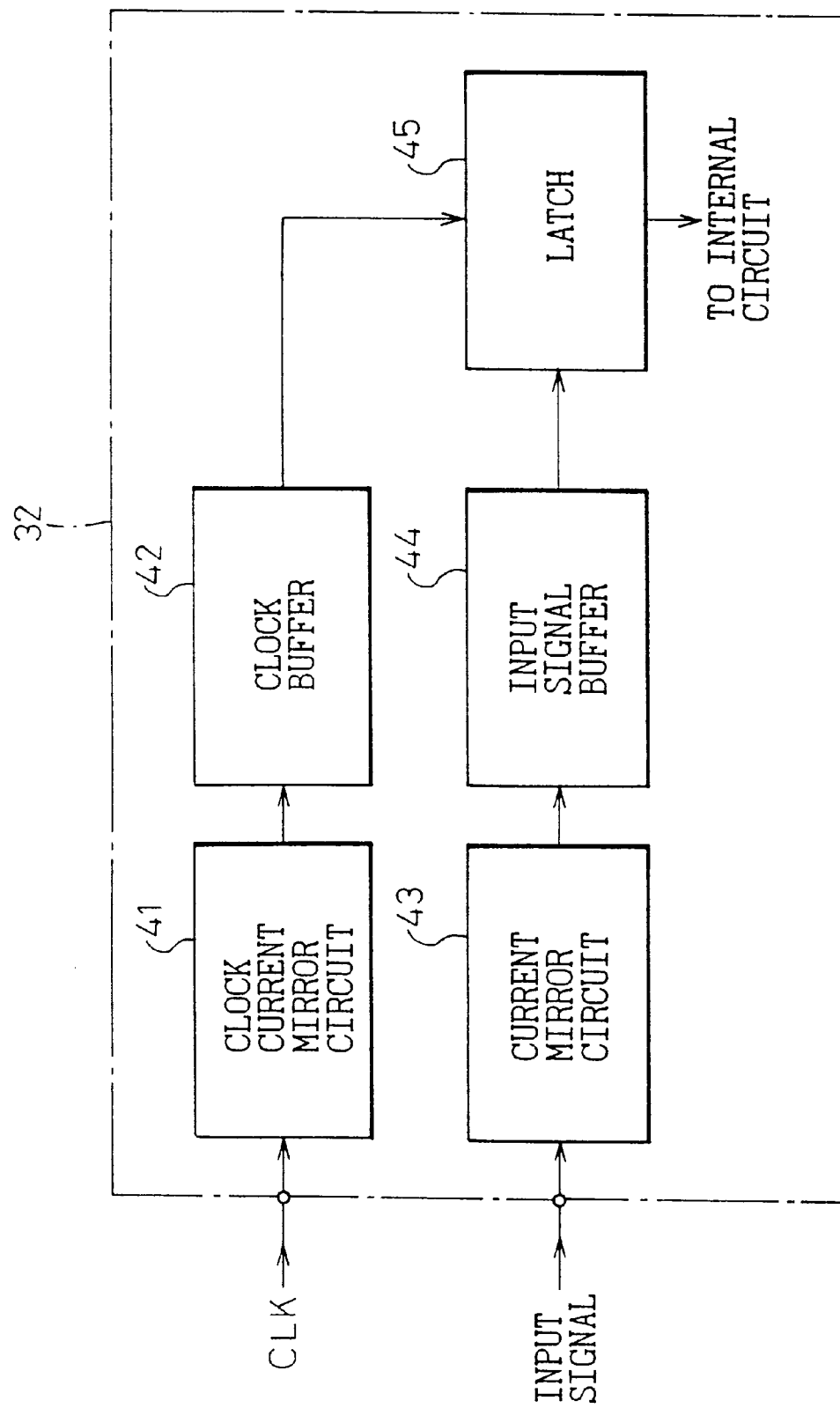
FIG. 4 is a diagram showing an example of a conventional input circuit of a semiconductor device.

FIG. 4 is a diagram showing a conventional input circuit of a semi-conductor device at the receiving end.

As shown in FIG. 4, an input circuit 32 has a clock current mirror circuit 41 supplied with a clock CLK input from an external source. The output of this circuit is transmitted as an internal clock to each part of the semiconductor device from a clock buffer circuit. In similar fashion, the input signal, after being input to the current mirror circuit 43, is applied through an input signal buffer circuit 44 to a latch circuit 45. The latch circuit 45 latches the input signal produced from the input signal buffer circuit 44 in synchronism with the rising edge of the internal clock from the clock buffer circuit 42. The input signal thus is retrieved into the semiconductor device. The input signal thus latched at the latch circuit 45 is transmitted to each part of the internal circuit. The current mirror circuit is used for accurately receiving the signals input from an external source. In FIG. 4, only one input signal and only one input circuit are shown. Actually, however, a plurality of input signals are available, and there are as many input circuits as there are input signals, each input circuit including the current mirror circuit 43, the input signal buffer circuit 44 and the latch circuit 45.

In the circuit of FIG. 4, the clock input circuit and the input circuits for other input signals have an equivalent circuit configuration. The delay of the clock input to the semiconductor device and transmitted to the latch circuit 45 is set to the same as the delay amount of the input signal. The timing relation between the clock input to the clock input terminal of the semiconductor device and the other input signals can also be maintained by a latch circuit 135.

Figure 5:
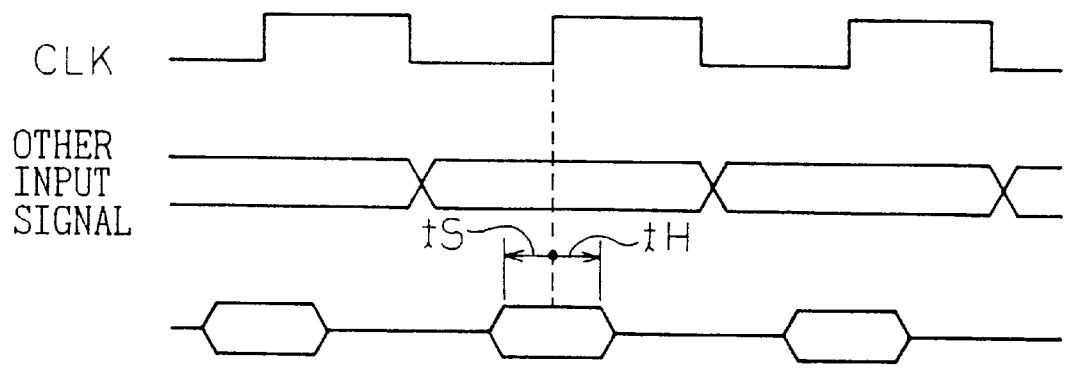
FIG. 5 is a diagram showing an example of correlation between a clock and other signals in a semiconductor device system.

FIG. 5 is a diagram showing a clock CLK and a signal on a bus in a semiconductor device system. The driving-end semiconductor device 11 changes the signal output to the control signal bus 14, the address signal bus 15 and the write data bus 16 in synchronism with the rising edge of the clock CLK. In response to this, the receiving-end semiconductor device 12 retrieves the output signal of the driving-end semiconductor device 11 in synchronism with the rising edge of the clock CLK as an input signal. This specification describes a case in which the output signal is changed in synchronism with the falling edge of the clock CLK and retrieved as an input signal in synchronism with the rising edge of the clock CLK. Nevertheless, the input signal may be changed out of phase with the rising edge or the falling edge of the clock CLK and may be retrieved by the semi-conductor device in an out-of-phase state.

In the case where a semiconductor device retrieves an input signal, a certain period is defined where the input signal is required to be established before and after the timing of retrieval. As shown in FIG. 5, the period during which the input signal is required to be established before the retrieval timing is called a set-up time tS, and the time during which the input signal is required to be established after the retrieval timing is called a hold time tH.

Figure 6:
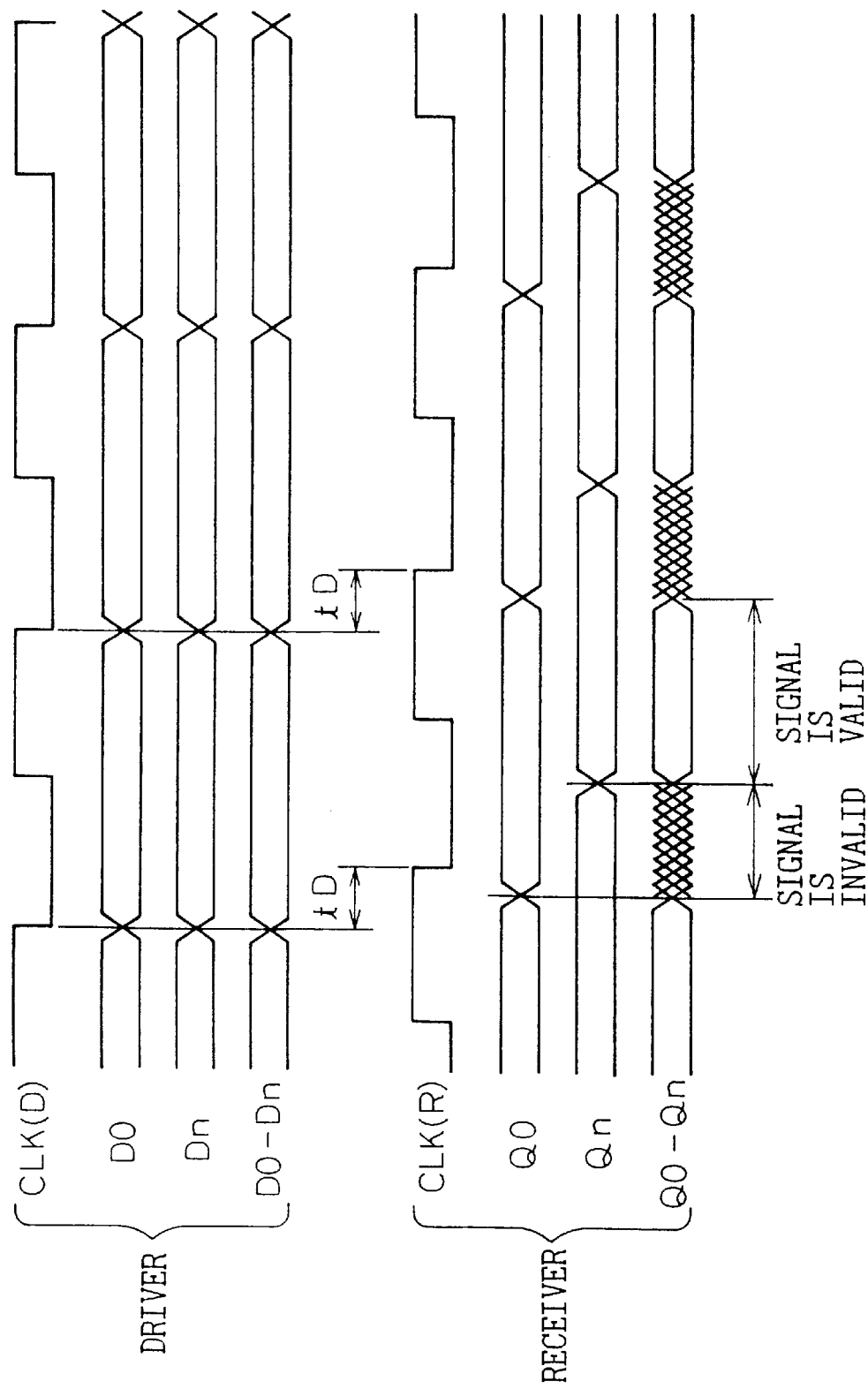
FIG. 6 is a diagram showing an effective period attributable to the correlation between a clock and other signals in a semiconductor device system.

FIG. 6 is a diagram showing a clock CLK and signals on the bus of a semiconductor device system of FIG. 2. The upper part of the drawing shows the clock CLK (D) and the output signals D0 to Dn produced from the driving end, and the lower part the state of these signals retrieved at the receiving end as the clock CLK (R) and the output signals Q0 to Qn. The driving-end semiconductor device 11 changes the output signals D0 to Dn in synchronism with the falling edge of the clock (D). The receiving-end semiconductor device 12 retrieves the output signals D0 to Dn as the input signals Q0 to Qn in synchronism with the rising edge of the clock signal retrieved.

In FIGS. 5 and 6, it is assumed that the output signals are changed at the falling edge of the clock CLK and are retrieved as input signals in synchronism with the falling edge of the clock CLK. Nevertheless, the input signals may change and may be retrieved into the semiconductor device out of phase with the falling edge or the rising edge of the clock CLK. In the description that follows, however, it is assumed, for the simplicity of explanation, that the input signals are changed in synchronism with the falling edge of the clock CLK and the input signals are retrieved in synchronism with the rising edge of the clock CLK. The present invention, however, is not limited to such functions.

In the semiconductor device system shown in FIG. 2, the time of signal transmission from the driving-end semiconductor device 11 to the receiving-end semiconductor device 12 is defined by the length of the signal line on the one hand and is subject to change by the load of the signal line on the other hand. The length and the load cannot be exactly the same for different signals lines. As shown in FIG. 6, therefore, even when an output signal is output from the driving end in such a manner as to change in synchronism with the falling edge of the clock, therefore, a phase difference occurs between the signals at the time point when the signals are input to the input terminal of the receiving-end semiconductor 12. In FIG. 6, time tD is required for the clock to be transmitted from the driving end to the receiving end. Specifically, the clock CLK (R) received is delayed by tD from the clock CLK (D) output from the driving-end semiconductor device 11. The output signal D0 output from the driving-end semiconductor device 11 is transmitted with a smaller delay than the clock, and therefore the input signal Q0 changes more rapidly than the falling edge of the clock CLK (R). In a similar fashion, the change in the input signal Qn is delayed from the falling edge of the clock CLK (R). Assume that Q0 is most advanced, and that Qn is most delayed. During the period from the change of Q0 to the change of Qn shown in FIG. 6 represents the state where incorrect signal is input. During this period, therefore, the signal is not established. As a result, the period when the signal is effective is the period excluding the signal change, i.e., constitutes one clock period less the period during which the signal is not established.

Figure 7:
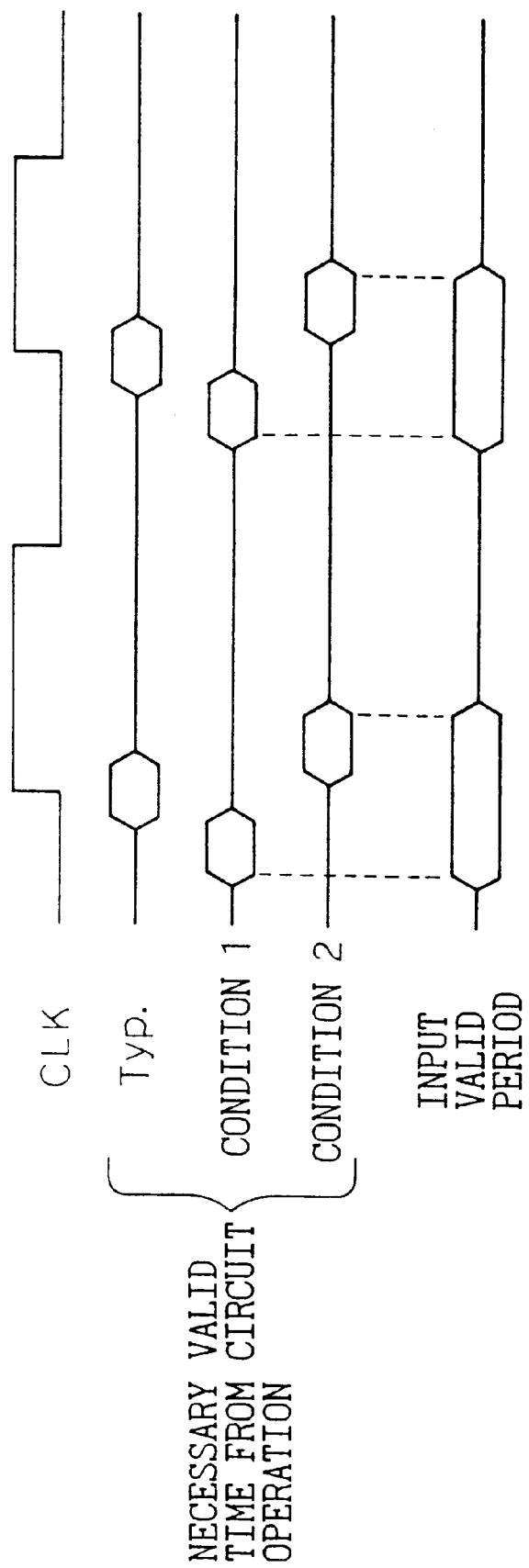
FIG. 7 is a diagram for explaining the problem points of a conventional semiconductor device system.

FIG. 7 is a diagram for explaining the time required for signal establishment for the receiving-end semiconductor device. In the circuit of FIG. 4, the latch circuit 45 naturally has a set-up time tS and a hold time tH required for the operation thereof. FIG. 7 shows such times as input establishment times required for circuit operation. As described above, the circuit of FIG. 4 includes the clock input circuit having a circuit configuration equivalent to the input circuit for the input signal so as to assure the same delay for the clock and the input signal from the time when they are input to the semiconductor device until they reach the latch circuit 45. Actually, however, it is impossible to design exactly the same circuit, and therefore circuits and lines having some difference in delay amount are unavoidable in spite of efforts to equalize the delay amount as much as possible. Considering the variations in the fabrication process, the dependence of the delay amount on the temperature and the source voltage, therefore, there occurs a difference in delay even in the case where the clock input circuit is made equivalent to the input circuits for other input signals as shown in FIG. 4. This difference in delay amount causes some variations in the time required for input establishment with respect to the rising edge of the clock CLK between conditions 1 and 2 as shown in FIG. 4. Consequently, the input establishment time of FIG. 7 is required to be included in the effective signal time of FIG. 6. In the case where this condition is not met, normal signal retrieval is impossible. In the prior art, the input establishment time, i.e., the set-up time tS and the hold time tH required by the circuit operation are defined taking these variations into consideration.

Figure 8:
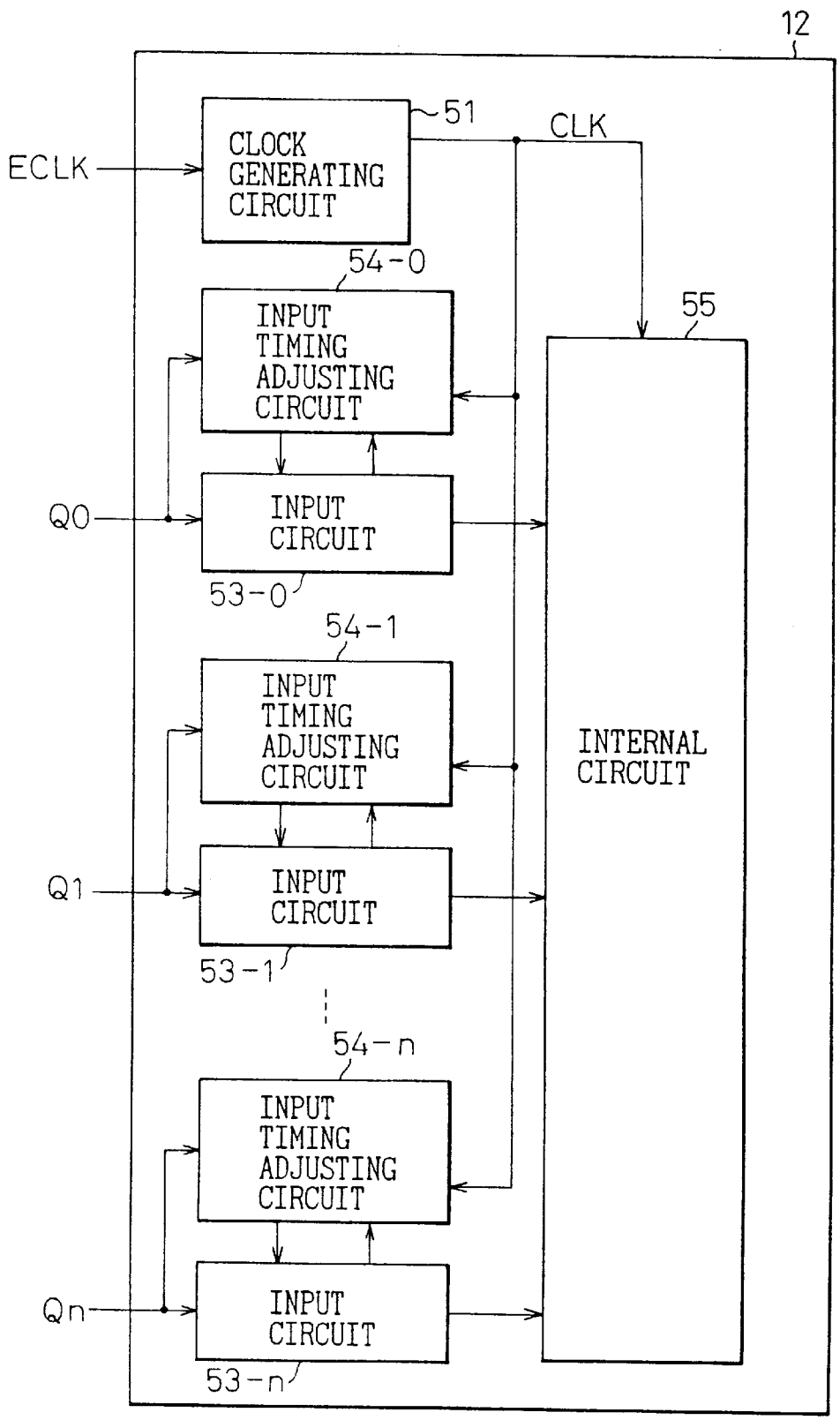
FIG. 8 is a diagram showing a basic configuration of the present invention.

FIG. 8 is a diagram showing a basic configuration of a semiconductor device used at the receiving end according to this invention. The semiconductor device according to this invention, in order to achieve the above-mentioned object, comprises input timing adjusting circuits 54-0, 54-1, . . . 54-n for adjusting the phase of the clock supplied to the input circuit to enable the input circuits 53-0, 53-1, . . . , 53-n to retrieve the input signals in effective and stable state. In FIG. 8, reference numeral 1 designates a clock input circuit, and numeral 5 designates an internal circuit supplied with the clock and the input signals retrieved by the input circuits 53-0, 53-1, . . . , 53-n.

Figure 9:
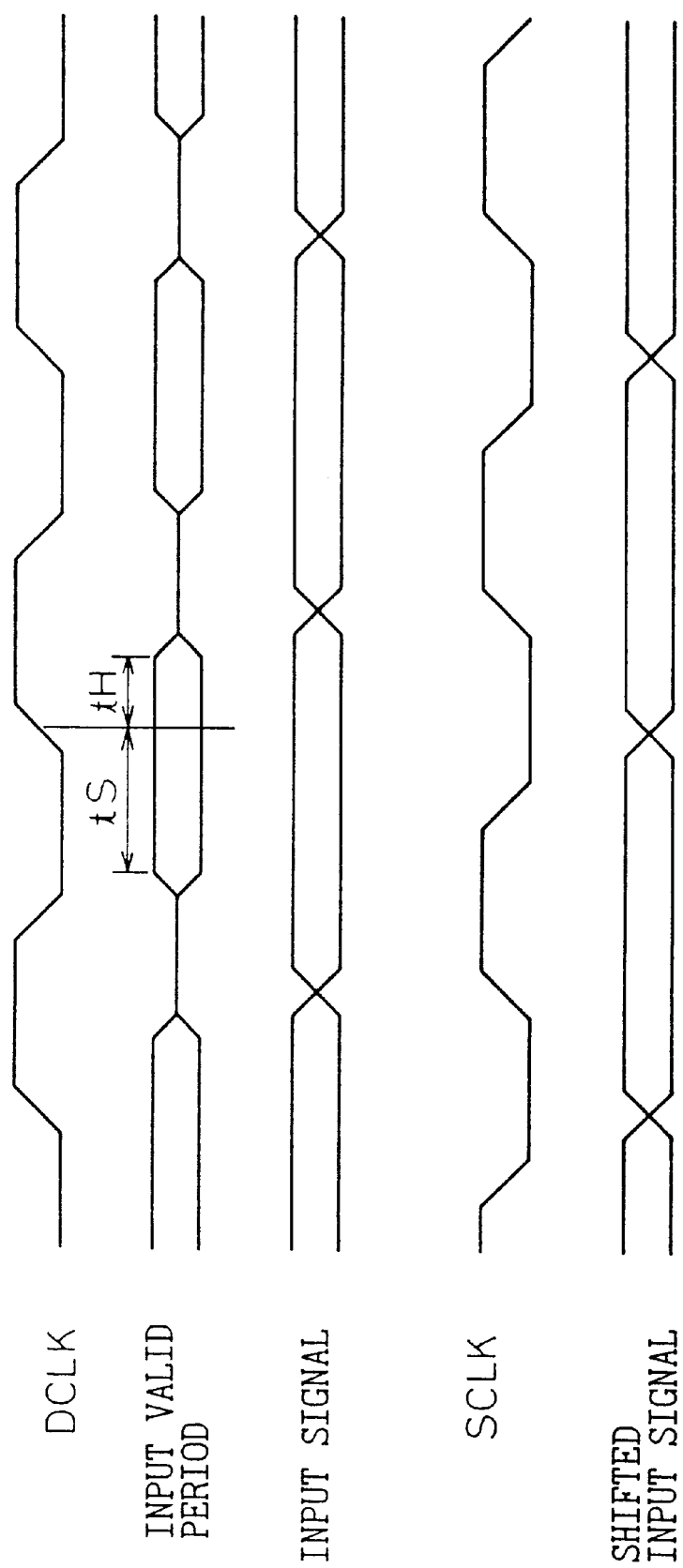
FIG. 9 is a diagram for explaining the principle of phase judgement for the input signal retrieved according to the invention.

FIG. 9 is a diagram for explaining the principle of phase comparison for input signal retrieval. When the phases of two signals are compared, the temporal relation between a specific changing edge of one signal and that of the other signal are usually determined thereby to determine whether one signal is advanced or retarded with respect to the other signal. In the case of the input circuit, however, the input timing clock DCLK is a signal changing while the input signal is stable as shown in the drawing. The input signal is required to be stable before the set-up time tS when the input timing clock rises, and remains stable during the period from the rising edge of the input timing clock through the hold time tH. For this reason, the input signal is desirably changed tP×tS/(tS+tH) before the rising edge of the input timing clock, where tP represents one clock cycle. This input signal and the input timing clock DCLK cannot be compared in phase with each other at the changing edges thereof. In view of this, it is necessary that the input timing clock is displaced by a predetermined amount of phase to generate a shift clock SCLK changing in phase with the input signal, and the phase of this shift clock is compared with that of the input signal, or the input signal phase is displaced by a predetermined amount so that the phase of the input timing clock is required to be compared with that of the shift input signal. In the case where the shift clock SCLK or the displaced input signal are generated at the receiving end, the input signal can be retrieved by the input timing clock DCLK while comparing the phases thereof. Thus the feedback control can be continued after completion of the adjust mode. In the case where a signal displaced by a predetermined amount of phase is generated at the driving end, in contrast, a signal displaced by a predetermined amount of phase and having an operation different from a normal operation is required to be transmitted to the receiving end. In normal mode, such a signal cannot be transmitted. A signal displaced by a predetermined amount of phase can be generated at the driving end, therefore, only when the feedback control is not carried out after the adjust mode. In the case where an input signal displaced by a predetermined amount of phase is generated at the receiving end, the input signals received by a current mirror circuit and a buffer circuit are required to be used directly without being latched. A satisfactory comparison is impossible, however, because the input signal is dulled. When generating a signal displaced by a predetermined amount of phase at the receiving end, therefore, it is desirable to generate a shift clock. A possible alternative is to generate a shift clock at the driving end and transmit it in the adjust mode. However, the clock provides a reference for synchronous operation and different clock phases are not desirable even in the adjust mode. In the case where a signal displaced by a predetermined amount of phase is generated at the driving end, therefore, it is desirable to produce an output in synchronism with the shift clock in the adjust mode and to produce an output in synchronism with the clock in normal operation.

Now, an explanation will be given of a basic configuration of the present invention based on the foregoing description. First, in adjust mode, assume a configuration in which an output signal displaced by a predetermined amount of phase as compared with the signal in normal operation mode is output from the driving end.

Figure 10:
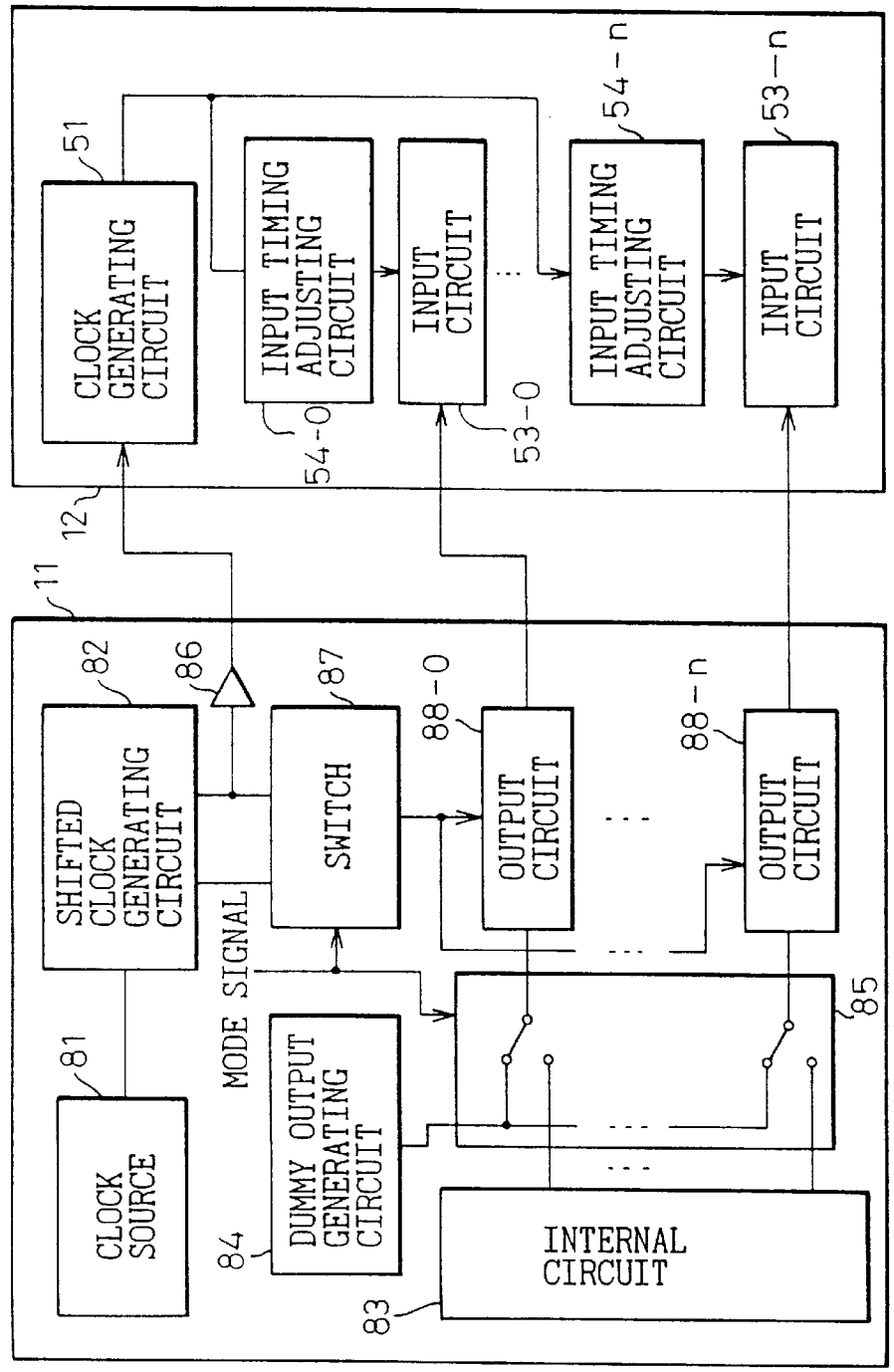
FIG. 10 is a diagram showing a basic configuration of a semiconductor device system according to a first aspect of the invention.

FIG. 10 is a diagram showing a basic configuration of a semiconductor device system according to a first aspect of the invention. The semiconductor device at the driving end of this system includes a clock generating circuit for generating and selectively producing a clock and a shift clock displaced by a predetermined amount of phase from the first clock, and signal output circuits 88-0, 88-1, . . . , 88-*n* for producing an output signal in synchronism with the clock or the shift clock generated by the clock generating circuit. This system can be selectively set either in normal mode for producing an output signal in synchronism with a clock, or in receiving-end timing adjust mode for receiving an output signal in synchronism with the shift clock. In FIG. 10, the clock generating circuit includes a clock source 81 for generating a basic clock, a shift clock generating circuit 82, and a switch 87 for selecting the basic clock or the shift clock among the clocks applied from the shift clock generating circuit 82 to the output circuits 88-0, 88-1, . . . , 88-*n*. The system further comprises a dummy output circuit 84 for producing a signal in adjust mode suitable for adjusting the input timing adjusting circuit, and a switch 85 for selecting the output of the internal circuit 83 or the output from the dummy output circuit 84. With this configuration, an output signal changing at the rising edge of the clock is produced in adjust mode, and an output signal changing with a predetermined amount of phase displaced from the rising edge of the clock is produced in a normal mode.

The shift clock generating circuit 82 includes a plurality of shift delay circuits having the same delay in each stage as a selectable amount, with the output of each stage being applied to the following stage, and with the first stage thereof supplied with the basic clock, a clock phase comparator for comparing the phase of the output in the last stage of the shift delay circuits with that of the basic clock, and a delay control circuit for controlling the delay amount of the plurality of shift delay circuits having a plurality of stages in such a manner that the phase of the output of the last stage coincides with that of the basic clock on the basis of the result of comparison at the clock phase comparator.

At the receiving end of the semiconductor device system according to the first aspect, the phase of the received clock is compared with that of the received input signal and the timing of retrieving the input signal is adjusted in adjust mode, while when entering the normal mode after the adjust mode, the control value at the end of the adjust mode is stored and continues to be held. The input signal sent from the driving end in the adjust mode is adapted to change at the rising edge of the clock and can be compared directly. Therefore, this signal can be used for determining the value retrieved by latching in the input circuit.

Figure 11:
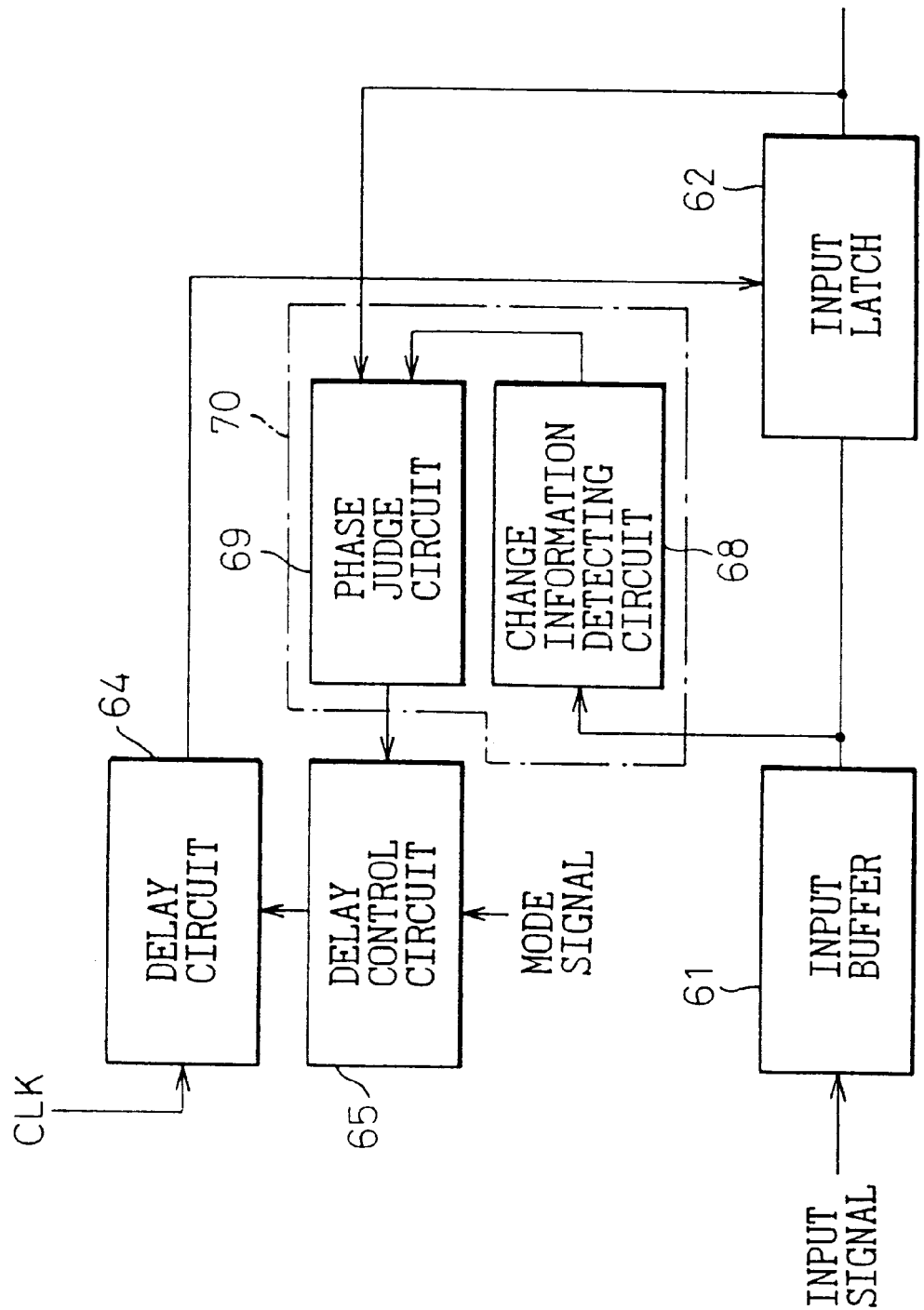
FIG. 11 is a diagram showing a basic configuration at the receiving end according to the first aspect.

FIG. 11 is a diagram showing a basic configuration at the receiving end of the semiconductor device system according to the first aspect. As shown in FIG. 11, a phase comparator 70 includes a change information detection circuit 68 and a phase judge circuit 69. The phase judge circuit 69 compares the phase of the value latched at the input latch 62 with the phase of the input signal detected by the change information detecting circuit 68 according to whether the input signal has changed, or, if changed, according to the direction of the changing edge involved. Especially, in the case where the input signal sent from the driving end in adjust mode changes per clock cycle, the change information detecting circuit 68 is not required to detect whether or not the input signal has undergone a change but only the direction of the changing edge.

Figure 12:
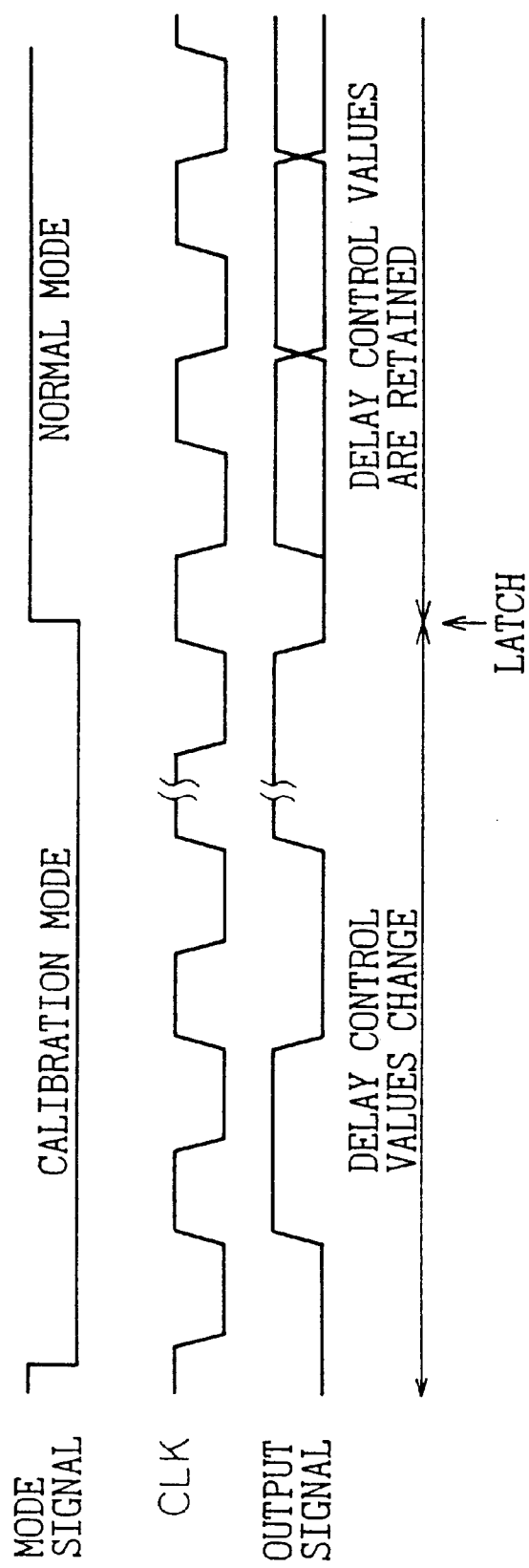
FIG. 12 is a diagram showing a basic operation according to the first aspect.

FIG. 12 is a diagram showing an example of an output signal and a clock CLK produced from the driving end in normal mode and in the receiving time adjust mode (calibration mode) for the semiconductor device system according to the first aspect. The particular diagram shows the case in which the output signal changes per clock cycle in the adjust mode. As shown in FIG. 12, the clock CLK is a signal remaining the same and continuous over both the calibration mode and the normal mode. The output signal is adapted to change for each rising edge of the clock in calibration mode. The output signal may change, but not always, in normal mode at the falling edge of the clock.

Now, a configuration will be explained in which the input timing adjusting circuit is controlled by feedback even after the adjust mode. In this case, the driving-end semiconductor device has the same configuration as the conventional device.

Figure 13:
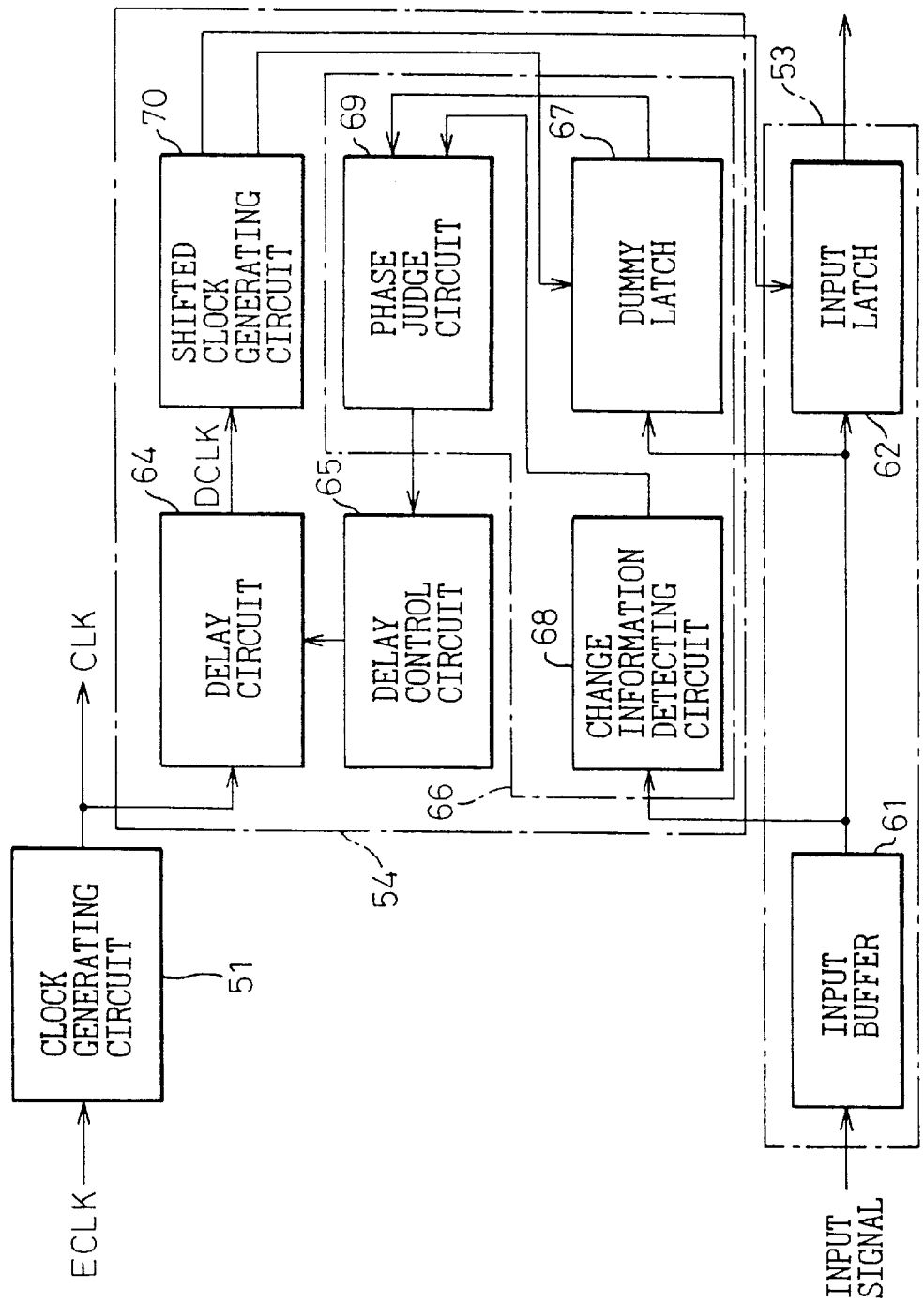
FIG. 13 is a diagram showing a basic configuration of a semiconductor device at the receiving end according to a second aspect of the invention.

FIG. 13 is a diagram showing a basic configuration of a receiving-end semiconductor device according to the second aspect of the invention. As shown in FIG. 13, this semiconductor device includes a clock generating circuit 51 supplied with an external clock ECLK for generating an internal clock CLK, an input circuit 53 having an input buffer 61 and an input lath 62, and an input timing adjusting circuit 54 for adjusting the phase of the internal clock CLK supplied to the input latch 62 in such a manner that the input circuit may retrieve the input signal in effective and stable way. The input timing adjusting circuit 54 includes a delay circuit 64 with the delay amount thereof selectable for delaying the received internal clock CLK and producing it as an input timing clock DCLK, a phase comparator 66 for determining the phase of the input timing clock and the input signal, a delay control circuit 65 for changing the amount of delay of the delay circuit in such a manner that the input timing clock has a predetermined phase relationship with the input signal on the basis of the result of comparison at the phase comparator, and a shift clock generating circuit 70 for shifting the input timing clock by a predetermined amount of phase and generating a shift clock changing in phase with the input signal. The phase comparator 66 includes a dummy latch 67 for latching the input signal in synchronism with the shift clock, a change information detecting circuit 68 for detecting whether the input signal has undergone a change, and if so, the direction of such a change, and a phase judge circuit 69 for determining the phase on the basis of the result of detection at the change information detecting circuit 68 and the value latched at the dummy latch 67.

The shift clock is a signal displaced by a predetermined amount of phase from the input timing signal, and in the case where the phase of the input timing signal is adjusted and changed, it must be changed accordingly. For this purpose, according to the second aspect, a shift clock is generated from the input timing signal output from the delay circuit of the input timing adjusting circuit. The shift clock generating circuit 70 can have the same configuration as the shift clock generating circuit 82 of FIG. 10.

Figure 14:
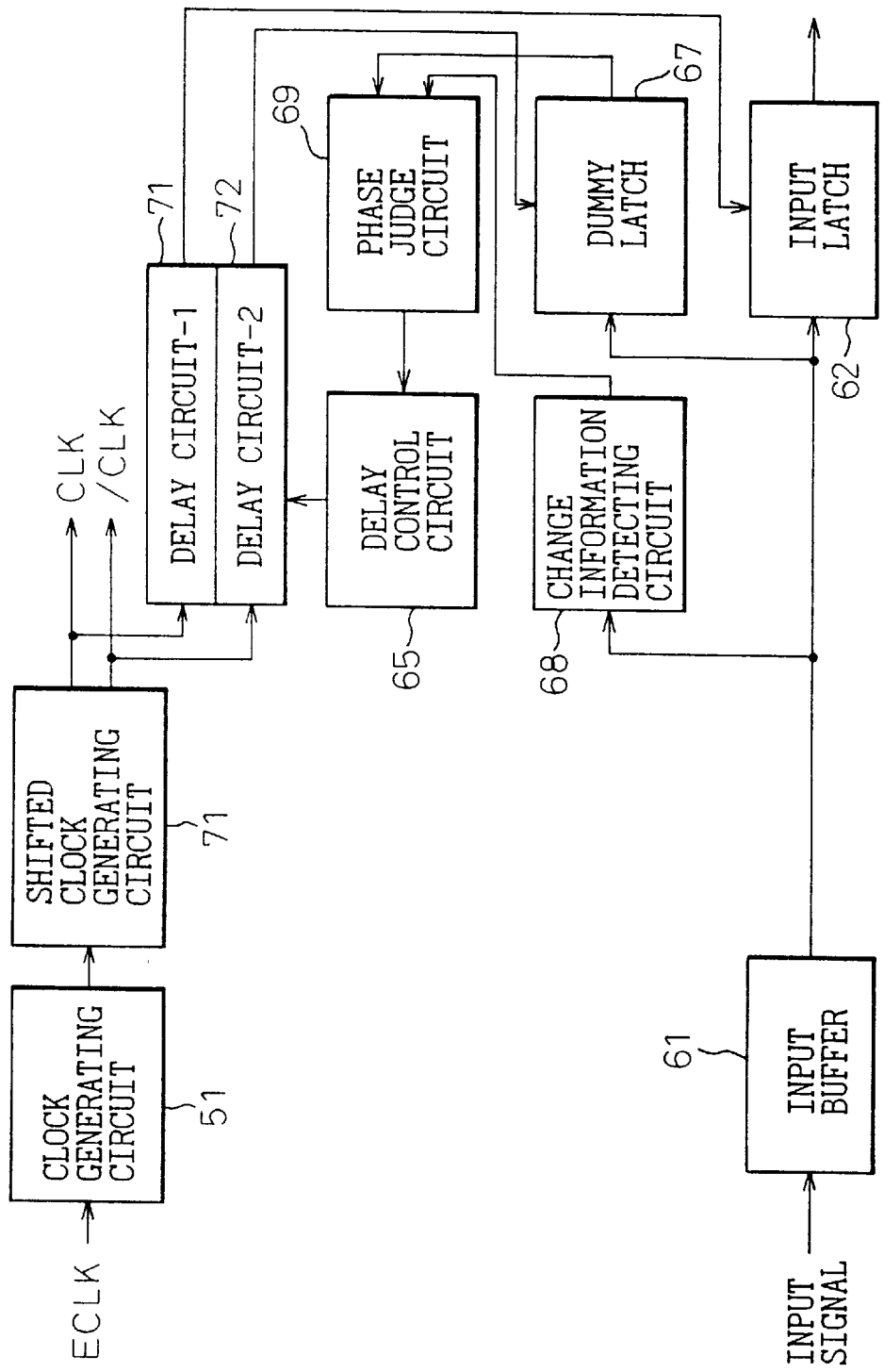
FIG. 14 is a diagram showing a basic configuration of a semiconductor device at the receiving end according to a third aspect of the invention.

In a semiconductor device of clock synchronous type, on the other hand, a clock of a phase opposite to the internal clock is often used within the device and an internal clock exactly 180% out of phase is generated in many cases. In the case where the input signal changes 180% out of phase with the rising edge of the clock, i.e., in the case where the input signal changes at the falling edge of the clock, then a clock of an opposite phase can be used as a shift clock. FIG. 14 is a diagram showing a basic configuration of a receiving-end semiconductor device according to a third aspect of the invention which is applicable in such a case. As shown in FIG. 14, this semiconductor device, unlike the device according to the second aspect, includes a shift clock generating circuit 71 for generating an opposite-phase clock /CLK exactly 180% out of phase with the internal clock CLK and comprises a delay circuit including two delay circuits, –1 and –2, for delaying CLK and /CLK by the same amount.

According to the second and third aspects described above, a shift clock with the input timing signal displaced by a predetermined amount of phase is generated at the receiving end, and the input signal, being the one in a normal mode, can be controlled by being fed back in a normal operation mode. The semiconductor devices according to the second and third aspects are applicable also in the case where the control value at the end of adjust mode is maintained after the adjust mode. In such a case, a signal suitable for operation of the input timing adjusting circuit is desirably output at the driving end.

Embodiments of the present invention will be described below. A first embodiment is associated with a semiconductor device system according to the first aspect shown in FIG. 10.

Figure 15:
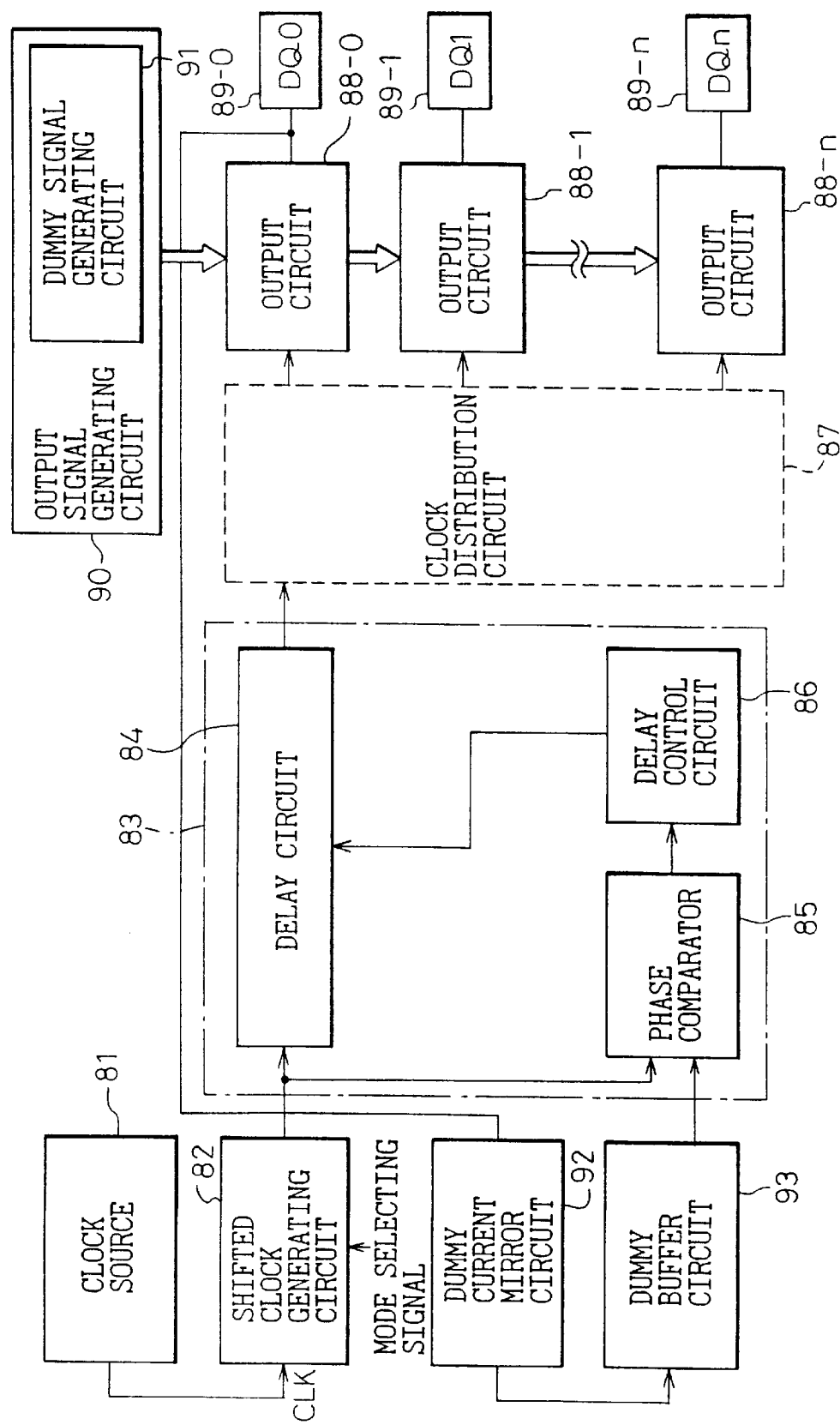
FIG. 15 is a diagram showing a configuration of a clock generating circuit and an output timing adjusting section of a semiconductor device at the driving end according to a first embodiment of the invention.

FIG. 15 is a diagram showing a configuration of a portion of the signal output circuit and the clock generating circuit of a driving-end semiconductor device of a semiconductor device system according to the first embodiment of the invention. The first embodiment, as shown in FIG. 12, can switch between both the normal mode and the receiving timing adjust mode. In starting the system, first, the timing is adjusted by setting to the receiving timing adjust mode, and then the normal mode is entered. Also, the normal mode is interrupted to transfer to the receiving timing adjust mode as required, in which case the normal mode can be restored again after the timing adjustment.

As shown in FIG. 15, the driving-end semiconductor device according to the first embodiment includes a clock source 81 for generating and supplying a clock CLK to each part of the device, a shift clock generating circuit 82 for generating and outputting a selected one of a basic clock providing the base of the output timing from the input clock CLK and a 1/2 shift clock shifted a one-half cycle from the basic clock, a delay adjusting circuit 83 for adjusting the delay amount of the clock produced from the shift clock generating circuit 82 and adjusting and outputting the output timing clock in such a manner that the output signal is synchronized with the clock produced to an external unit, a clock distribution circuit 87 with equidistant wirings for distributing the output timing clock among the output circuits, output circuits 88-1 to 88-*n* for producing a signal output from the output signal generating circuit 90 in synchronism with the output timing clock from the clock distribution circuit 87, the output signal generating circuit having a dummy signal generating circuit 91, a dummy current mirror circuit 62 for receiving the output signal input from the output circuit 88-0, and a dummy buffer circuit 93 for receiving the output of the dummy current mirror circuit 92 and applying it to the delay adjusting circuit 83. The delay adjusting circuit 83 includes a delay circuit 84 capable of adjusting the delay amount, a phase comparator 85 and a delay control circuit 86. The phase of the output signal input through the dummy current mirror circuit 92 and the dummy buffer circuit 93 is compared with that of the output timing clock produced from the shift clock phase shift circuit 82. The delay control circuit 86 adjusts the delay amount of the delay circuit 84 based on the result of comparison in such a manner that the phase of the output signal coincides with that of the output timing clock. As a result, regardless of the difference between the internal circuits, the output signal is produced in phase with the clock as shown in FIG. 9. The feature of the driving-end semiconductor device according to the first embodiment exists in the shift clock generating circuit 82, therefore, the remaining circuit components are not described.

Figure 16:
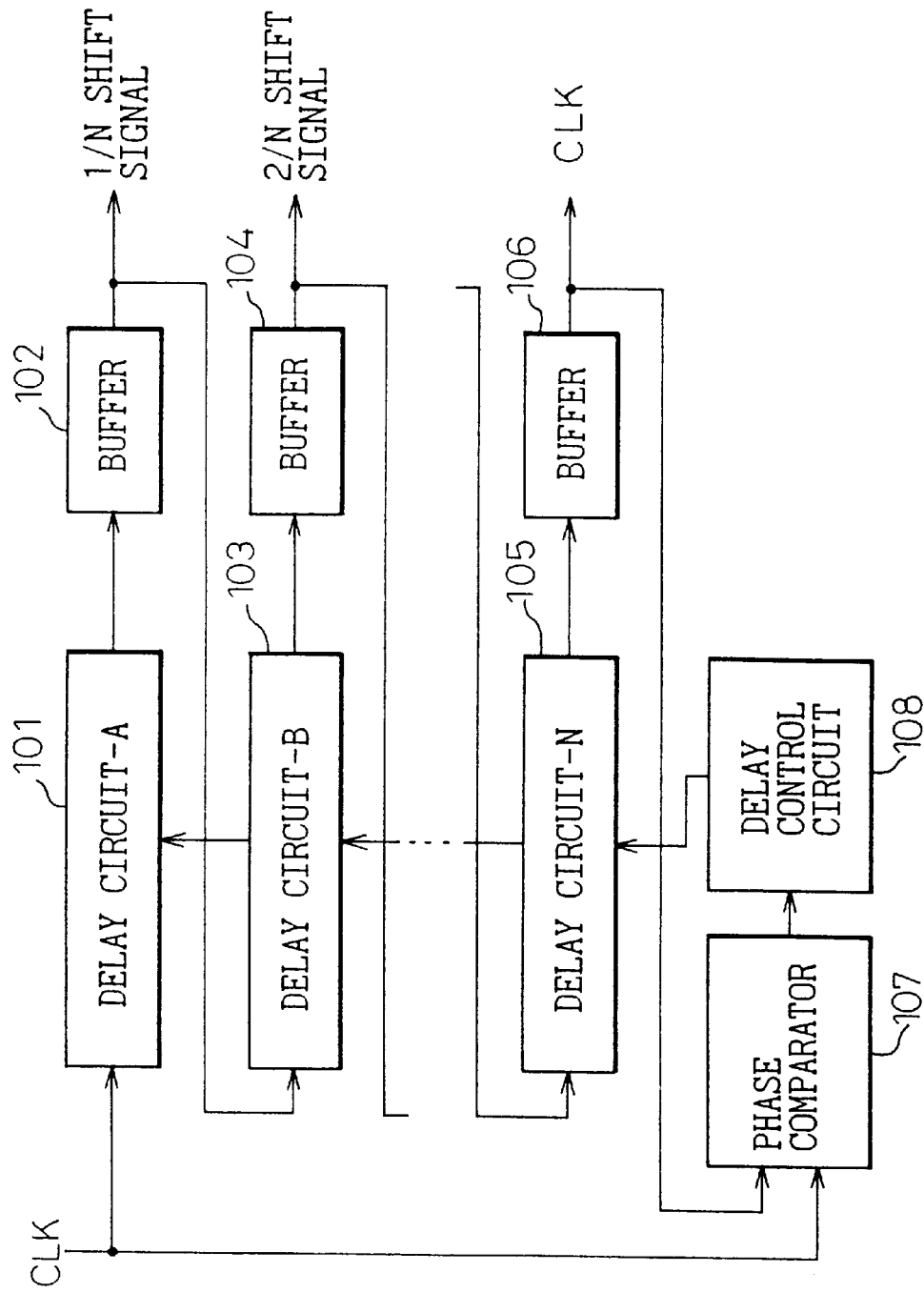
FIG. 16 is a diagram showing a basic configuration of a shift clock generating circuit according to the first embodiment of the invention.

Prior to the shift clock generating circuit 82 according to the first embodiment, an explanation will be given about a circuit for generating a clock displaced exactly by a predetermined amount of phase. FIG. 16 is a diagram showing a circuit configuration for generating a shift clock displaced by 2 πi/N from the phase of the clock CLK. As shown in FIG. 16, a combination of a delay circuit A 101 and a buffer 102, a combination of a delay circuit B 103 and a buffer 104, . . . , a combination of a delay circuit N 105 and a buffer 106 having the same configuration are connected in N stages in series in such a manner that the output of the first stage is applied to the next stage. Each delay circuit is supplied with the same control value by the delay control circuit 108 and therefore the delay amount is changed at the same time, so that each delay circuit has the same delay amount. The phase comparator 107 compares the phase of the output of the buffer 106 in the last stage with that of the clock CLK. Based on the result of this comparison, the delay control circuit 106 changes the delay amount of the delay circuit in such a manner that the phase of the output at the last stage coincides with that of the clock CLK. In the case where the phase of the output at the last stage coincides with the phase of the clock CLK, the output at each stage is a signal having a phase shifted exactly 1/N of a cycle. Consequently it suffices if the output at any one of the stages is a clock displaced by a predetermined amount of phase, and the number of stages that causes such a phase displacement is determined. As described above, for the present purpose, the set-up time and the hold time are equal to each other. In a normal mode, therefore, the output signal changes in synchronism with the falling edge of the clock. Since the input circuit retrieves the input signal in synchronism with the rising edge of the clock, a shift clock 180% out of phase, i.e., a signal displaced by one half clock cycle serves the purpose, which can be realized by constructing two stages.

Figure 17:
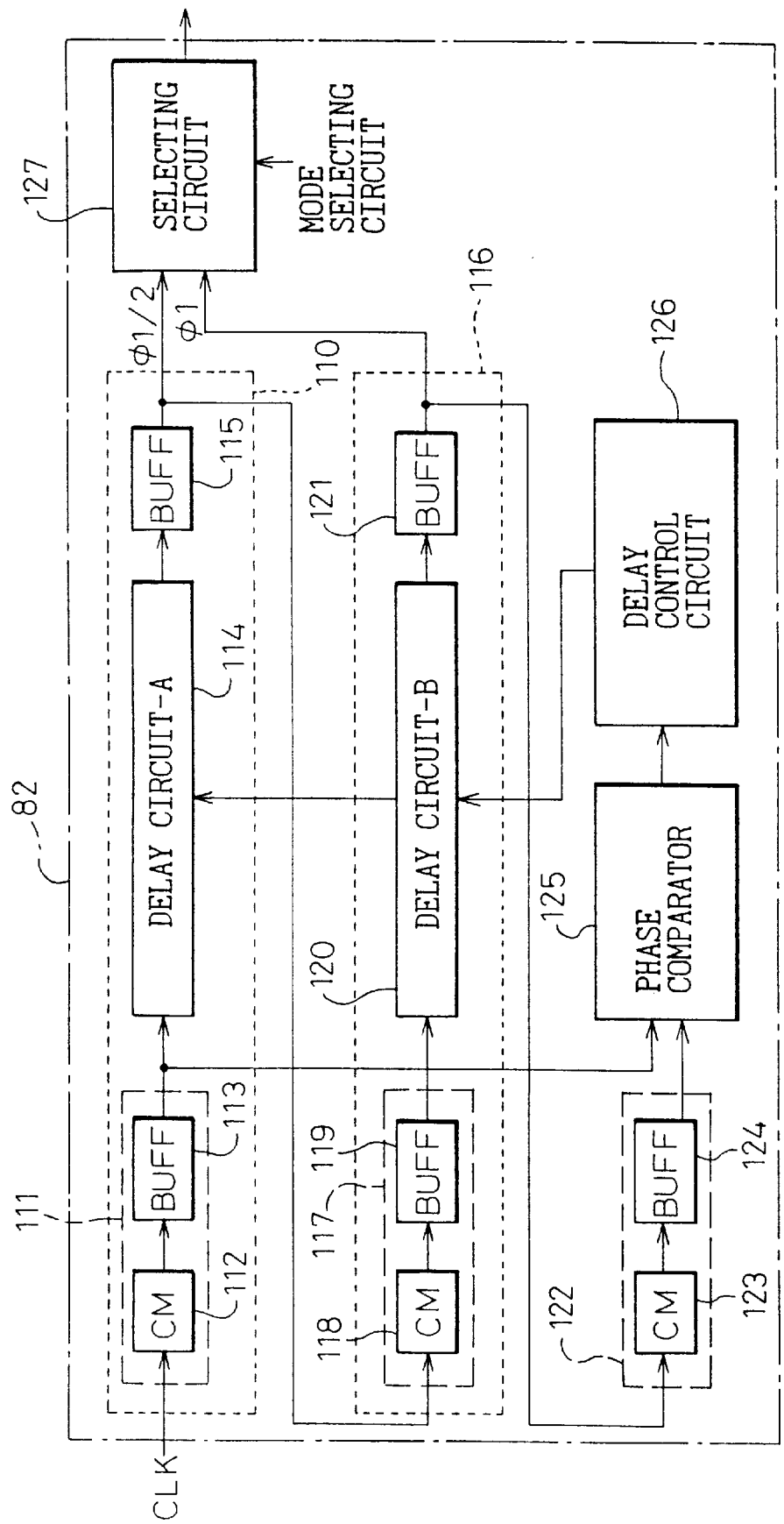
FIG. 17 is a diagram showing a configuration of a shift clock generating circuit according to the first embodiment.

FIG. 17 is a diagram showing a configuration of the shift clock generating circuit 82 according to the first embodiment. A shown in FIG. 17, the shift clock generating circuit 82 includes first and second 1/2φ delay circuits 110 and 116 having the same configuration, an input stage 122, a phase comparator 125, a delay control circuit 126 and a mode selecting circuit 127. The first and second 1/2φ delay circuits 110 and 116 each include input stages 111 and 117, respectively, identical to the input stage 122, delay circuits 114 and 120, respectively, adjustable in delay amount, and buffer circuits 115 and 121, respectively. The input stages 111, 117, 122 have current mirror circuits (CM) 112, 118, 123 and buffer circuits 113, 119, 124, respectively. The current mirror circuit is for retrieving the change in the input signal accurately.

The clock produced from the input stage 111 is delayed in the delay circuit A 114, then applied to the delay circuit B 120 through the buffer circuit 115 and the input stage 117, and thus delayed by the same amount as the delay circuit A 114. The resulting signal is applied to the phase comparator 125 through the buffer circuit 125 and the input stage 122. The phase comparator 125 compares the phase of the clock produced from the input stage 111 with that of the clock produced from the input stage 122. On the basis of the result of comparison, the delay control circuit 126 changes the amount of delay in the delay circuit A 114 and the delay amount in the delay circuit B 120 in such a manner that the two phases coincide with each other. When the two phases coincide with each other, the phase of the signal input to the delay circuit B 120 is displaced by exactly one half period from the phase of the signal applied to the delay circuit A 114, in view of the fact that the route from the delay circuit A 114 through the buffer 115 and the input stage 117 to the delay circuit A 114 is identical to the route from the delay circuit B 120 through the buffer 121 and the input stage 122 to the phase comparator 125. As a result, the clocks produced from the buffer circuits 115 and 121 are also out of phase from each other by one half period, so that the buffer circuit 121 outputs a clock signal φ1 while the buffer circuit 115 produces a 1/2 shift clock φ1/2 shifted by one half period. The selecting circuit 127 is for selecting which outputs are to be produced, the clock signal φ1 and the 1/2 shift clock φ1/2, in accordance with the mode select signal. When the mode select signal indicates the normal mode, the clock signal φ1 is produced, while when the receiving timing adjust mode is indicated, the 1/2 shift clock φ1/2 is selectively produced. As is apparent from the drawing, the clock CLK input to the phase shift circuit 82 is in phase with the clock signal φ1 output from the buffer 121.

Returning to FIG. 15, in the receiving timing adjust mode, the output signal generating circuit 90 outputs a dummy output signal for the receiving timing adjustment generated by the dummy signal generating circuit 91, so that the output circuits 88-0, 88-1, . . . , 88-n produce a dummy output signal in synchronism with the 1/2 shift clock φ1/2. The dummy output signal is one changing at each clock period, for example. Though not shown, the clock output circuit produces a clock φ1. In the receiving timing adjust mode, the other portions of the circuit all operate in synchronism with the clock CLK, i.e., the clock φ1, except for output timing-adjusting portion and the dummy signal generating circuit 81 which operate in synchronism with the 1/2 shift clock φ1/2.

The output timing-adjusting portion operates normally when the signal output from the shift clock generating circuit 82 is switched to the clock φ1. The dummy signal generating circuit 91, therefore, is not required in normal mode. No problem occurs when the receiving timing adjust mode is switched to the normal mode.

The foregoing is a description of a driving-end semiconductor device according to the first embodiment. Now, the receiving-end semiconductor device will be explained.

Figure 18:
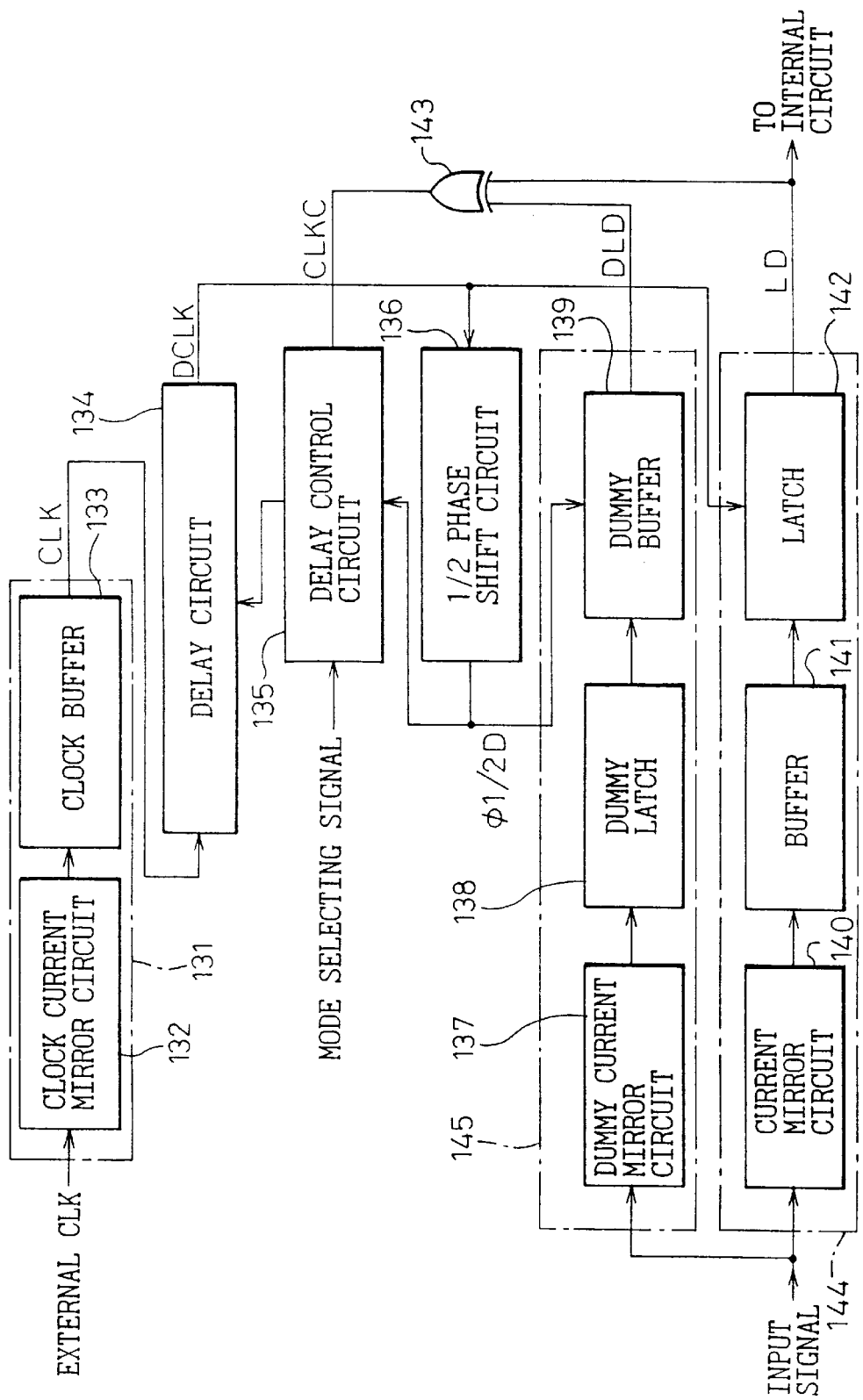
FIG. 18 is a diagram showing a configuration of a clock generating circuit and an input circuit of a semiconductor device at the receiving end according to the first embodiment.

FIG. 18 is a diagram showing a configuration of a signal input circuit and a clock input circuit of the receiving-end semiconductor device according to the first embodiment. Although only the clock input circuit, a set of an input circuit and an input timing adjusting circuit are shown, this semiconductor device actually includes as many combinations of these circuits as the number of input signals. An internal clock CLK is supplied from the clock input circuit shown.

As shown in FIG. 18, the receiving-end semiconductor device according to the first embodiment includes a clock input circuit 131 supplied with a clock from the driving-end semiconductor device for generating an internal clock CLK, and an input circuit 144 for retrieving as an input signal the signal transmitted thereto from the driving-end semiconductor device. The input signal retrieved by the input circuit 144 is sent to the internal circuit, as in the prior art. The clock input circuit 131 includes a clock current mirror circuit 132 and a clock buffer circuit 133. The input circuit 144 includes a current mirror circuit 140, a clock buffer circuit 141 and a latch circuit 142. As described earlier, the current mirror circuit is used for accurately receiving the signal sent thereto. The same current mirror circuit, the same buffer circuit and the same latch circuit as in the prior art are used as they are. The current mirror circuit and the buffer circuit, therefore, will not be described. The latch circuit which is related to the description of other component parts, however, will be described later.

The receiving-end semiconductor device according to the first embodiment, in addition to the configuration described above, includes a delay circuit 134 supplied with the internal clock CLK output from the clock input circuit 131 for delaying it by a specified amount, a delay control circuit 135 for controlling the delay amount of the delay circuit 134, a 1/2 phase shift circuit 136 for producing a clock φ1/2 delayed by one half period from the delay clock DCLK output from the delay circuit 134, a dummy input circuit 145 having a configuration equivalent to the input circuit 144, and an exclusive-OR (EXOR) gate 143. The dummy input circuit 145 includes a dummy current mirror circuit 137, a dummy clock buffer circuit 138 and a dummy latch circuit 139 corresponding to the current mirror circuit 140, the clock buffer circuit 141 and the latch circuit 142, respectively, of the input circuit 144. The clock φ1/2D does not require such an accurate delay amount, and therefore the 1/2 phase shift circuit 136 can be realized by connecting an appropriate number of inverters. The input signal is applied to the input circuit 144 and the dummy input circuit 145. The latch circuit 142 of the input circuit 144 retrieves an input signal in synchronism with the delayed clock DCLK. The dummy latch circuit 139 of the dummy input circuit 145, on the other hand, retrieves the input signal in synchronism with the clock φ1/2D. The signal values LD and DLD latched by the latch circuit 142 and the dummy latch circuit 139, respectively, are applied to an EXOR gate 143 where an exclusive OR is calculated to determine the phase displacement. The delay control circuit 135 changes the delay amount of the delay circuit 134 step by step in such a manner as to eliminate the out-of-phase condition on the basis of the result of judgement of the out-of-phase condition.

Figure 19:
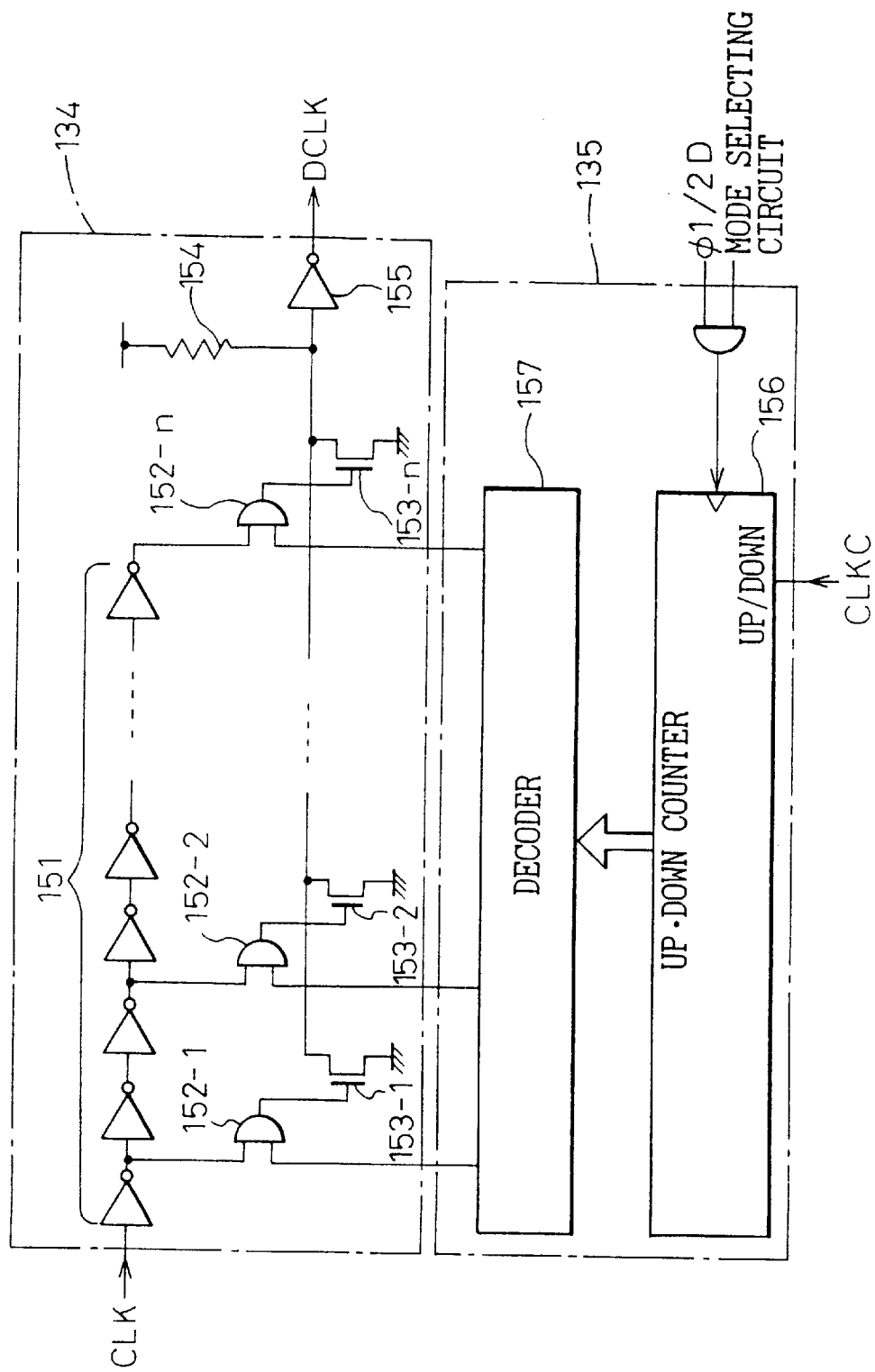
FIG. 19 is a diagram showing an example configuration of a delay circuit and a delay control circuit of a semiconductor device at the receiving end according to the first embodiment.

FIG. 19 is a diagram showing an example configuration of the delay circuit 134 and the delay control circuit 135. As shown in FIG. 19, the delay circuit 134 includes an inverter string 11 including a plurality of inverters connected in series, an AND gate string including a plurality of AND gates 152-1 152-2, . . . , 152-n each having one of the input terminals thereof adapted to receive the output of each two stages of the inverter string 151, a transistor string including N-channel transistors 153-1, 153-2, . . . , 152-n each having the gate thereof supplied with the output of each AND gate, the source thereof grounded and the drain connected to the drains of the remaining N-channel transistors in common, a resistor 154 inserted between the high potential side of a power supply and a signal line shared by the drains of the N-channel transistors, and a buffer 155 with the input terminals thereof connected to the signal line for producing the internal clock DCLK. The delay control circuit 135 includes an up-down counter 156 for switching between count-up and count-down in accordance with the level of the output CLKC of the EXOR gate 143 and a decoder 157 for decoding the output of the up-down counter 150. The up-dowr counter 156 performs the counting operation when the mode select signal indicates the receiving timing adjust mode and the clock φ1/2D rises. The count-up or count-down operation is determined in accordance with the prevailing value of the CLKC. The decoder 157 sets one of the outputs to H level and the other output to L level in accordance with the output of the up-down counter 156. In the case where the up-down counter 156 counts up, the output position associated with H level is shifted rightward, while the output position associated with H level is shifted to the left when the up-down counter 156 counts down. The output of the decoder 157 is connected to the remaining input terminal of each of the AND gates 152-1, 152-2, ... , 152-n in that order, so that only the AND gate supplied with H signal from the decoder 157 is activated.

Among the output signals of the inverter string, the signal applied to the activated AND gate is output as an internal clock DCLK. The number of stages of the inverter string affected is varied depending on the particular AND gate activated. In this way, the delay amount of the internal clock can be selected. The unit of adjustment for delay amount control is thus represented by each two inverters. By the way, the configuration shown in FIG. 19 can be used for the delay circuit and the delay control circuit shown in FIGS. 15 and 16.

Figure 20:
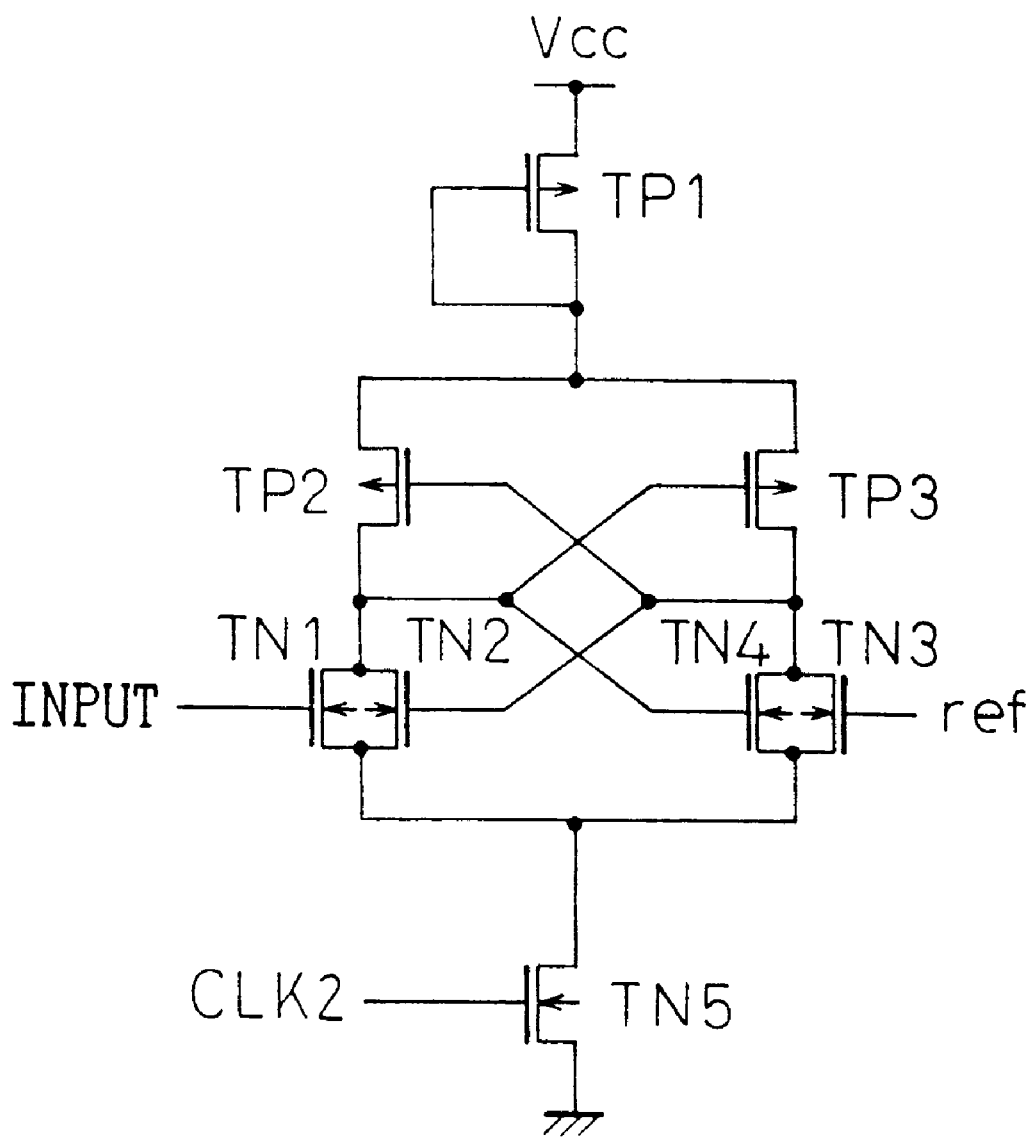
FIG. 20 is a diagram showing an example configuration of a latch circuit.

FIG. 20 is a diagram showing a circuit configuration of the latch circuit 142. The dummy latch circuit 139 also has the same circuit configuration. This circuit configuration is widely known and will not be described.

Figure 21:
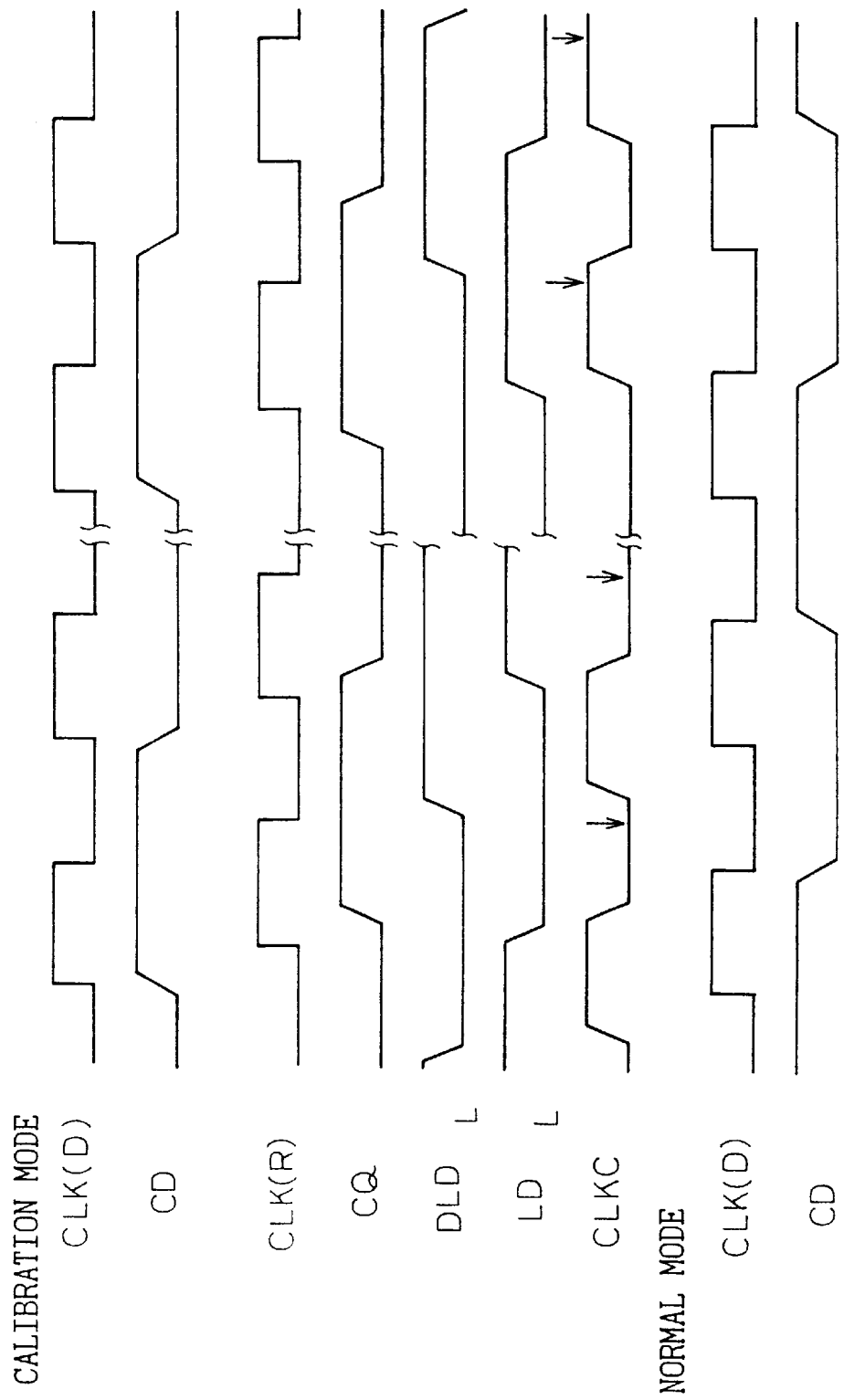
FIG. 21 is a time chart for explaining the operation of the first embodiment.

FIG. 21 is a time chart for explaining the operation of the system according to the first embodiment. In the receiving timing adjust mode, the driving-end semiconductor device 11 outputs an output signal CD changing for every period in synchronism with the rising edge of the clock CLK (D). The left portion of the drawing shows the case in which such a signal is transmitted to the receiving-end semiconductor device 12 when the input signal CQ is delayed behind the clock CLK (R), and the right portion of the drawing shows the case in which the input signal CQ is transmitted earlier than the clock CLK (R).

Now, assume that the delay amount in the delay circuit 134 Is equal to one clock period. The basic clock DCLK output from the delay circuit 134 is identical to the clock CLK (R) delayed by the delay amount of the clock input circuit 131. The current mirror circuit 140 and the buffer circuit 141 are identical to the clock current mirror circuit 132 and the clock buffer circuit 133 of the clock input circuit 131, respectively. The delay amount of the input signal CQ before being applied to the latch circuit 142, therefore, is the same as that for the clock input circuit 131. The phase relation therefore is the same as when the input signal CQ is retrieved at the rising edge of the clock CLK (R). For a similar reason, the dummy latch circuit 139 retrieves the input signal in synchronism with the falling edge of the clock CLK (R).

As shown in FIG. 21, the output signal CD changes for each period in synchronism with the rising edge of the clock CLK (D). Once it is known whether or not the input signal rises or falls, therefore, it is possible to judge whether the rising edge of the clock CLK (R) is advanced or retarded with respect to the changing edge of the input signal CQ by judging the signal value retrieved by the latch circuit 142 in synchronism with the rising edge of the clock CLK (R).

When the input signal CQ rises, for example, the phase is delayed if the signal value is L, while it is advanced if the signal value is H. The relation is opposite when the input signal CQ falls. Since the input signal CQ changes for each period, judgement of the signal value one half period before can determine the manner in which the signal changes next. According to the first embodiment, this judgement is effected from the signal value DLD of the dummy latch circuit 139.

The outputs DLD and LD of the dummy latch circuit 139 and the latch circuit 142, respectively, undergo a change as shown in the drawing, so that the exclusive-OR CLKC of the DLD and LD changes in the manner shown in the drawing. Therefore, the judgement as to whether the count-up or the count-down is involved is required to be made after DCLK rises and LD changes before DCL rises and DLD changes. According to the first embodiment, as shown in FIG. 19, the counting operation of the up-down counter 156 is performed in accordance with the value of CLKC when the clock φ1/2 D rises. Specifically, judgement is made at the timings indicated by arrows at the portion of CLKC in FIG. 21. In the case where the input signal CQ on the left side is delayed from the clock CLK (R), therefore, the CLKC is "L". Since the basic clock CLK2 is advanced, the up-down counter 156 is counted up and the delay amount in the delay circuit 134 is increased. In the case where the input signal CQ on the right side is advanced of the clock CLK (R), on the other hand, CLKC is "H", so that the up-down counter 156 is counted down thereby to reduce the delay amount in the delay circuit 134. The count-up and the count-down operations are repeated until the out-of-phase condition is eliminated, and then the count-up and the count-down are repeated. When the mode select signal is switched to normal mode under this condition, the application of the clock to the up-down counter 156 is interrupted by the AND gate of FIG. 19. Thus the up-down counter 156 holds the count. The condition is the one in which the rising edge of the delay clock DCLK coincides with the changing edge of the input signal.

In a normal mode, the output signal CD output from the driving-end semiconductor device 11 is switched to change in synchronism with the falling edge of the clock CLK (D). As explained with reference to FIGS. 16 and 17, it is possible to displace it by exactly one half period. The rising edge of the clock CLK (D), therefore, is located in the middle of the changing edge of the output signal CD. In the receiving-end semiconductor 12, the rising edge of the DCLK is adjusted in the manner described above. When the input signal is displaced by one half period, therefore, the rising edge of DCLK is situated in the middle of the changing edge of the input signal CQ. As a consequence, the period during which the input signal 1s required to be stable is the sum of the time lengths required for the latch circuit 142 to set up and hold. Thus the period during which the input signal is required to be stable can be minimized. As a result, the clock frequency can be increased until the clock period is equal to this time, thereby making it possible to increase the operation speed.

The first embodiment refers to the case including the receiving timing adjust mode. Now, explanation will be made about the second embodiment, in which the receiving timing adjust mode is not provided but the receiving timing is constantly adjusted in normal mode. In the second embodiment, therefore, the driving-end semiconductor device can produce an output signal in synchronism with the clock and can have a configuration shown in FIG. 15 lacking the shift clock generating circuit 82.

Figure 22:
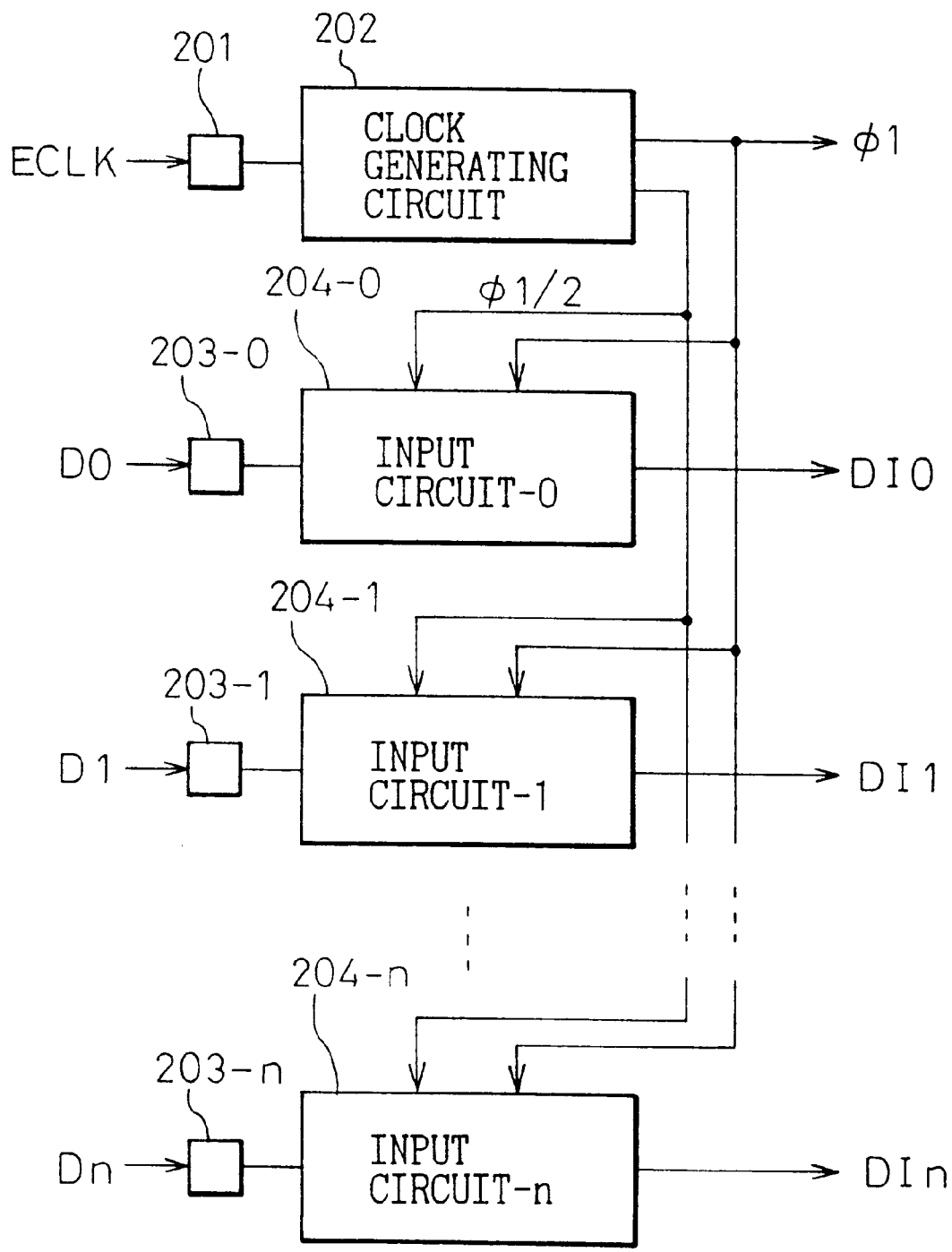
FIG. 22 is a diagram showing a configuration of an input section of a semiconductor device at the receiving end according to a second embodiment.

FIG. 22 is a diagram showing a configuration of the receiving section of the receiving-end semiconductor device according to the second embodiment. The second embodiment corresponds to the third aspect of the invention shown in FIG. 14.

The receiving-end semiconductor device according to the second embodiment includes a clock generating circuit 202 for retrieving the clock ECLK input to the terminal 201 from the driving-end semiconductor device and generating an internal clock φ1 and a 1/2 shift clock φ1/2 displaced by one half period from the internal clock φ1, and input sections 204-0, 204-1, . . . , 204-n for retrieving the input signals D0 to Dn synchronous with the clock ECLK input to the terminals 203-0 to 203-n, respectively.

Figure 23:
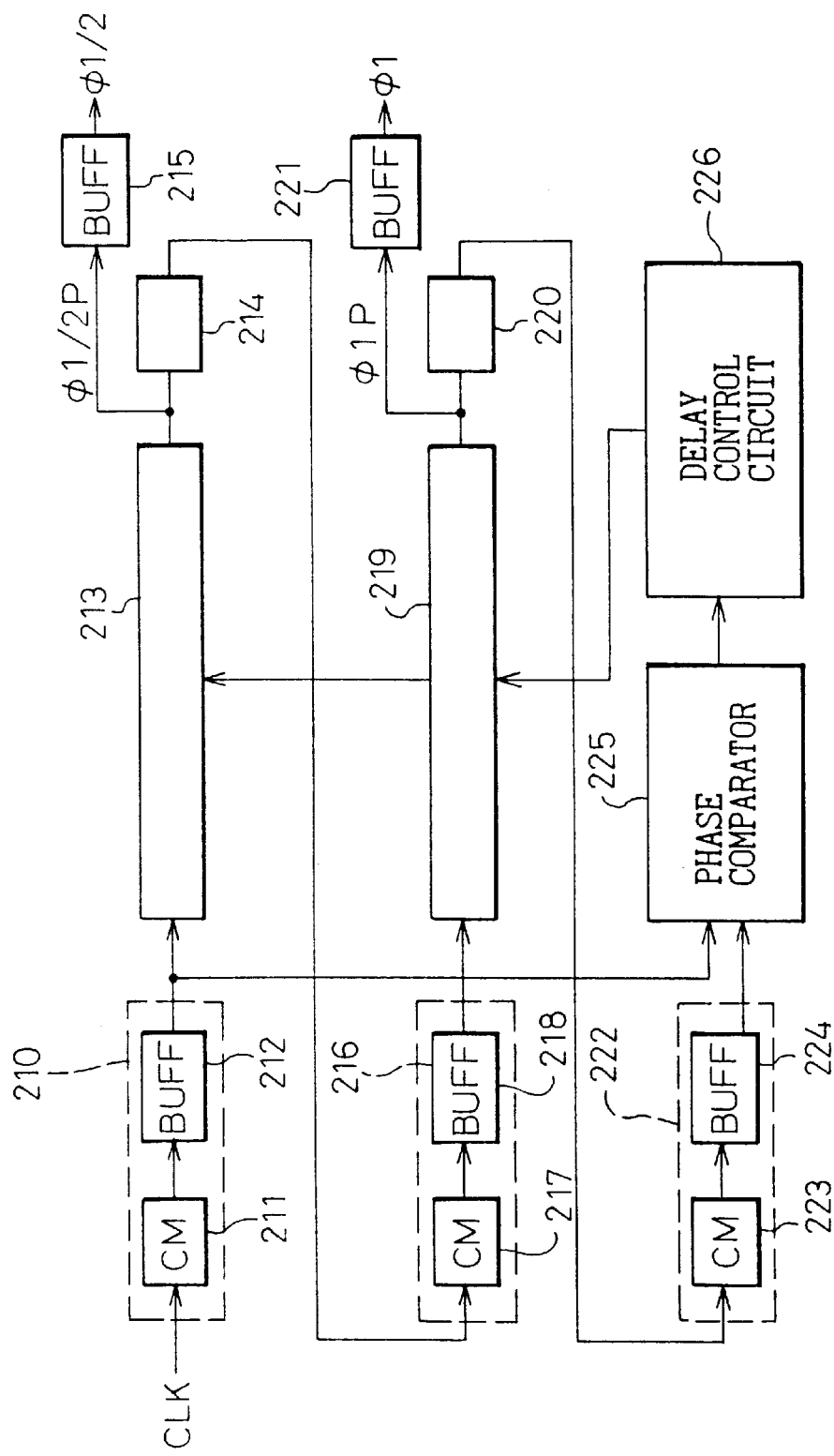
FIG. 23 is a diagram showing a configuration of a clock generating circuit according to the second embodiment.

FIG. 23 is a diagram showing a configuration of the clock generating circuit 202. In FIG. 23, reference numerals 210, 216, 222 designate input circuits 1, 2, 3, respectively, having the same configuration, numerals 213, 219 delay circuits A, A1, respectively, having the same configuration, numerals 214, 220 auxiliary delay circuits B, B1, respectively, having the same configuration, numerals 215, 221 buffer circuits having the same configuration, numeral 225 a phase comparator, and numeral 226 a delay control circuit. As is clear from the diagram, the clock generating circuit 202 has substantially the same configuration as the shift clock generating circuit shown in FIG. 17, except that the select circuit 127 is lacking, that both φ1 and φ1/2 are produced, that the buffers 115, 121 are replaced by the auxiliary delay circuits 214, 220, respectively, and that the outputs of the delay circuits 213, 219 are output through the buffers 215, 221, respectively. The clock generating circuit shown in FIG. 23 can also produce a clock signal exactly one half period out of phase like the shift clock generating circuit shown in FIG. 17.

Figure 24:
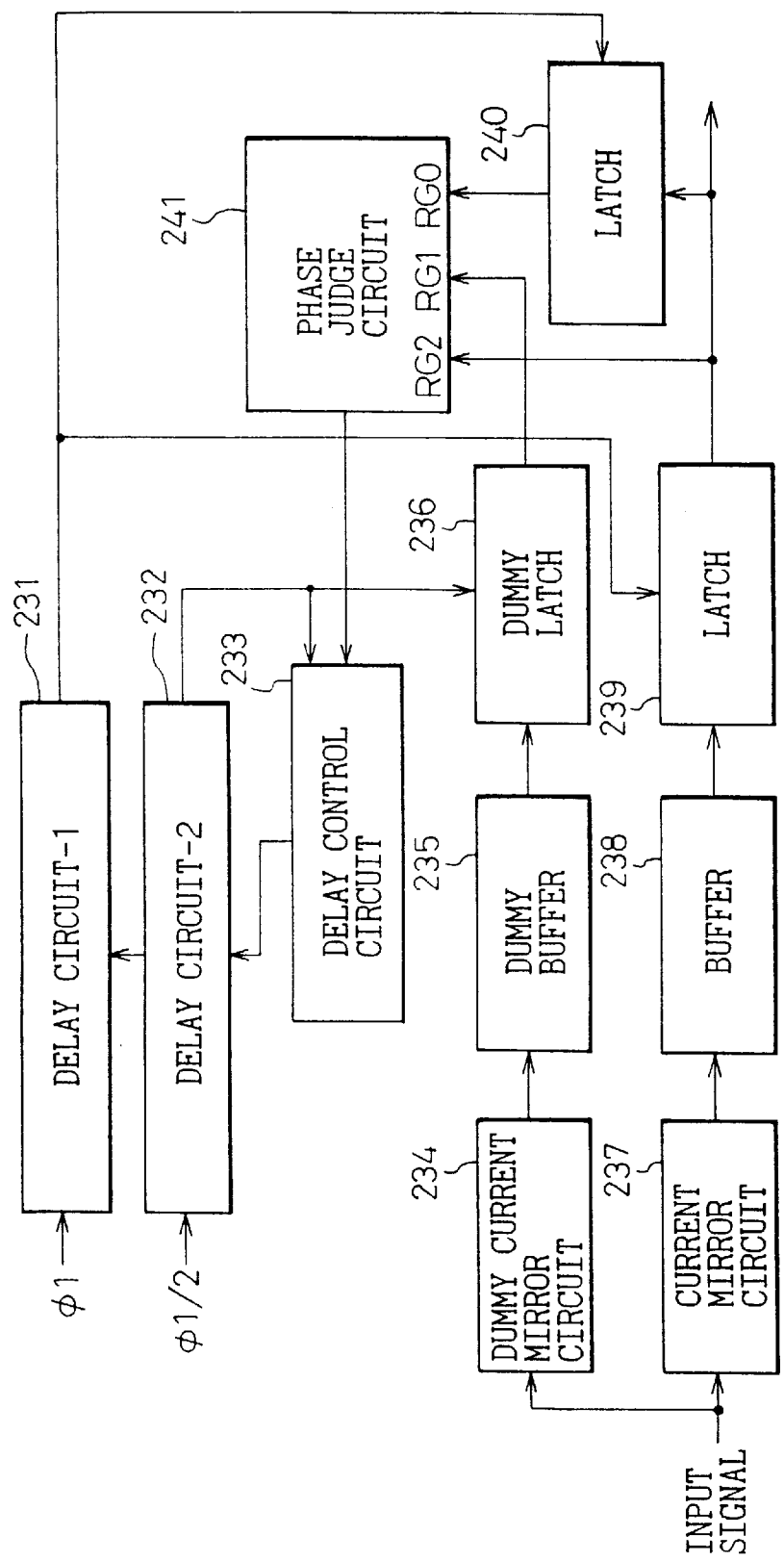
FIG. 24 is a diagram showing a configuration of an input circuit according to the second embodiment.

FIG. 24 is a diagram showing a configuration of each input section of the second embodiment. As shown, the input section has a configuration similar to that of the corresponding configuration shown in FIG. 18. The difference lies, however, in that separate delay circuits 231 and 232 are provided in order to adjust the phases of the clocks φ1 and φ1/2 and in that the EXOR gate 143 is replaced by a latch circuit 240 and a phase judge circuit 241.

In the input circuit according to the second embodiment, the input signal is normally retrieved in synchronism with the clock φ1, while the input signal for judging the out-of-phase condition is retrieved by a dummy input circuit in synchronism with the clock φ1/2. Consequently, the clock φ1 and the clock φ1/2 supplied to the latch circuit are required to be out of phase with each other by one half period exactly. For this purpose, the delay circuits 231 and 232 are controlled in common by the delay control circuit 233 to have the same delay amount, so that the clocks output from the delay circuits 231 and 232 maintain relative phases exactly one half period out of phase with each other. As a result, the signal value retrieved by the dummy input circuit can be judged in synchronism with the clock φ1/2 to thereby judge the out-of-phase condition.

The input signal is a normal signal. It changes at every rising edge as in the first embodiment, but it may or may not change so in the second embodiment. As a result, according to the second embodiment, a signal value one half period displaced is detected before and after the rising edge of the clock φ1/2, and by judging the three signal values, it is judged whether the input signal has changed or not, and if it has changed, the direction in which it has changed and the direction of phase shift. The signal value at the time point one half period displaced before and after the rising edge of the clock φ1/2 represents an input signal normally retrieved and therefore utilizes the output of the latch circuit 239. The signal value retrieved at the time point one half period displaced in a forward direction in the first half period undesirably undergoes a change if an input signal is retrieved at the time point one half period displaced backward in the last half period. It is therefore necessary to store the signal value before the change and hold it for one period. The latch circuit 240 has this function. It stores the signal value immediately before the output change of the latch 239 in synchronism with the rising edge of φ1, and holds it for one period before the next rising edge of φ1. The phase judging circuit 241 is a circuit for judging whether the input signal has changed or not, and if changed, the direction of change and the direction of phase shift, from the three signal values including the rising edge of the clock φ1/2 and the two time points one half period displaced before and after it. The signal value at the time point one half period displaced in forward direction is RG0, the signal value at the rising edge of the clock φ1/2 is RG1, and the signal value at the time point one half period displaced backward is RG2.

Figure 25:
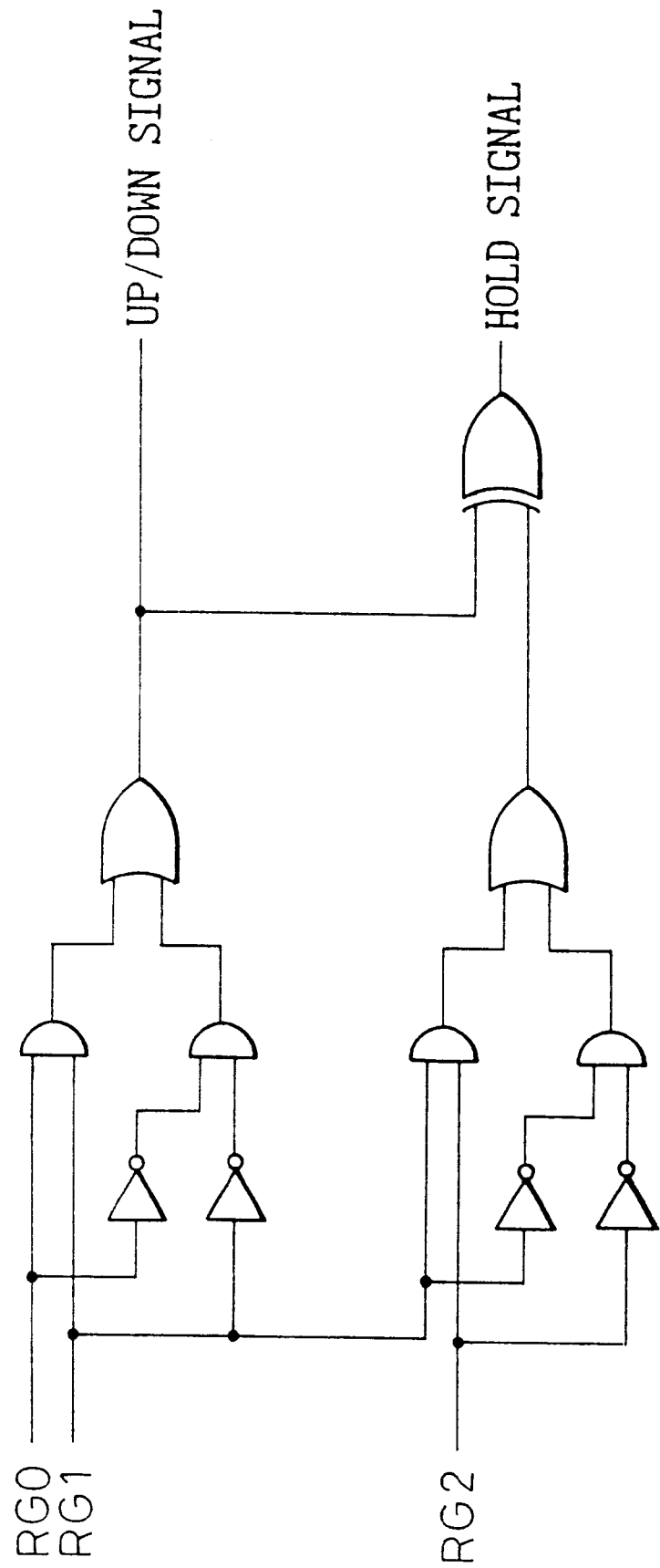
FIG. 25 is a diagram showing a configuration of a phase judge circuit.
Figure 26:
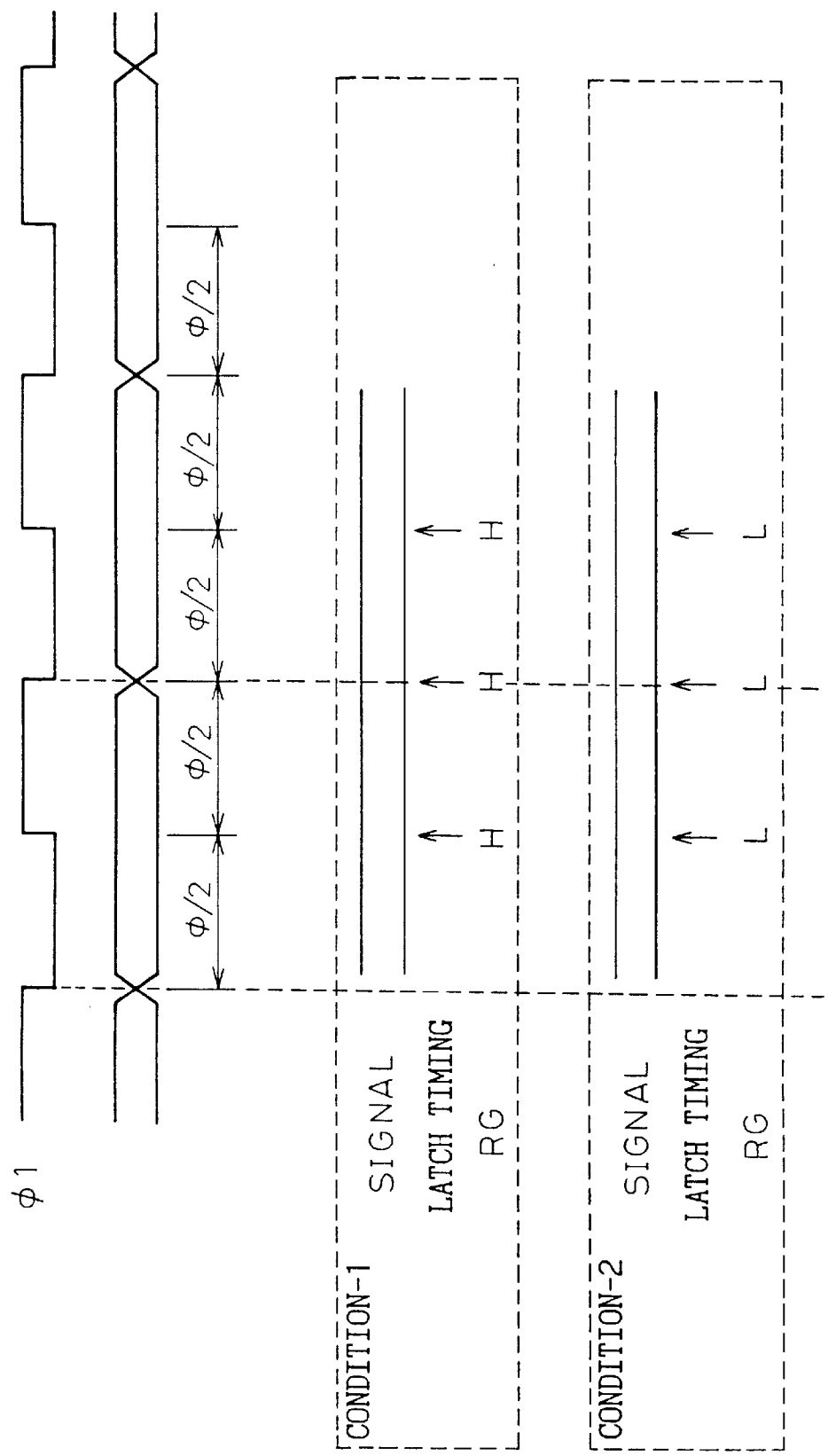
FIG. 26 is a diagram for explaining the phase judging operation according to the second embodiment.
Figure 27:
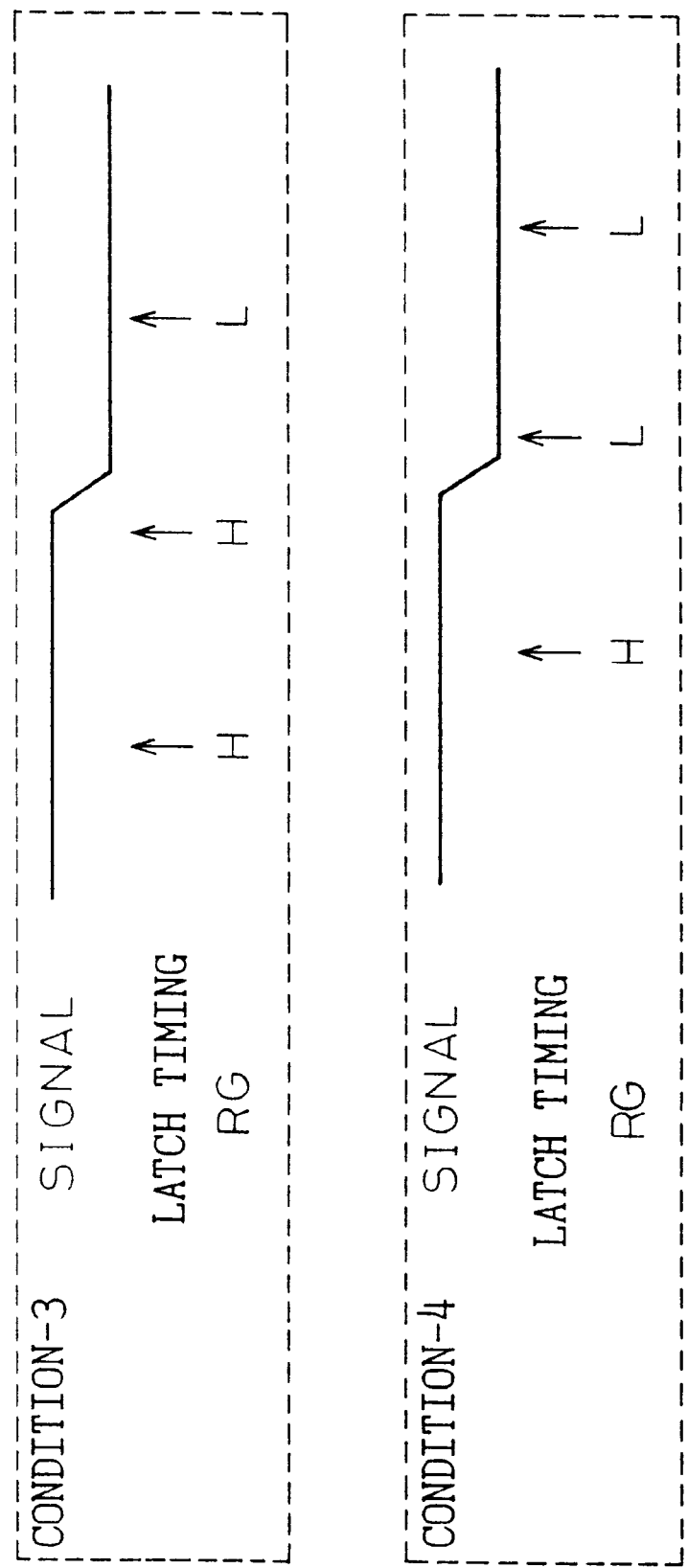
FIG. 27 is a diagram for explaining the phase judging operation according to the second embodiment.

FIG. 25 is a circuit diagram showing a configuration of a phase judging circuit 241. The operation of the phase judging circuit 241 will be explained with reference to FIGS. 26 to 29.

As long as there is no out-of-phase condition, the input signal changes at the falling edge of φ1. The state 1 represents the time point when the input signal remains unchanged at "H". Under this condition, RG0, RG1, RG2 are all "H", and the out-of-phase condition cannot be judged, so that no counting operation is performed. In similar fashion, the state 2 represents the time when the input signal remains unchanged at "L", when all of RG0, RG1, RG2 are "L". The out-of-phase condition cannot be judged also in this case, and therefore no counting operation is performed.

The states 3 and 4 shown in FIG. 24 represent the case in which the input signal changes from "H" to "L". In the case where the changing edge of the input signal is delayed behind the rising edge of φ1/2 as in the state 3, RG0, RG1, RG2 assume "H", "H" and "L", respectively. In such a case, the delay amount of the delay circuits 231 and 232 is increased. In the case where the changing edge of the input signal is advanced of the rising edge of φ1/2 as in state 4, on the other hand, RG0, RG1, RG2 assume "H", "L", "L", respectively. In this case, the delay amount of the delay circuits 231 and 232 is reduced.

Figure 28:
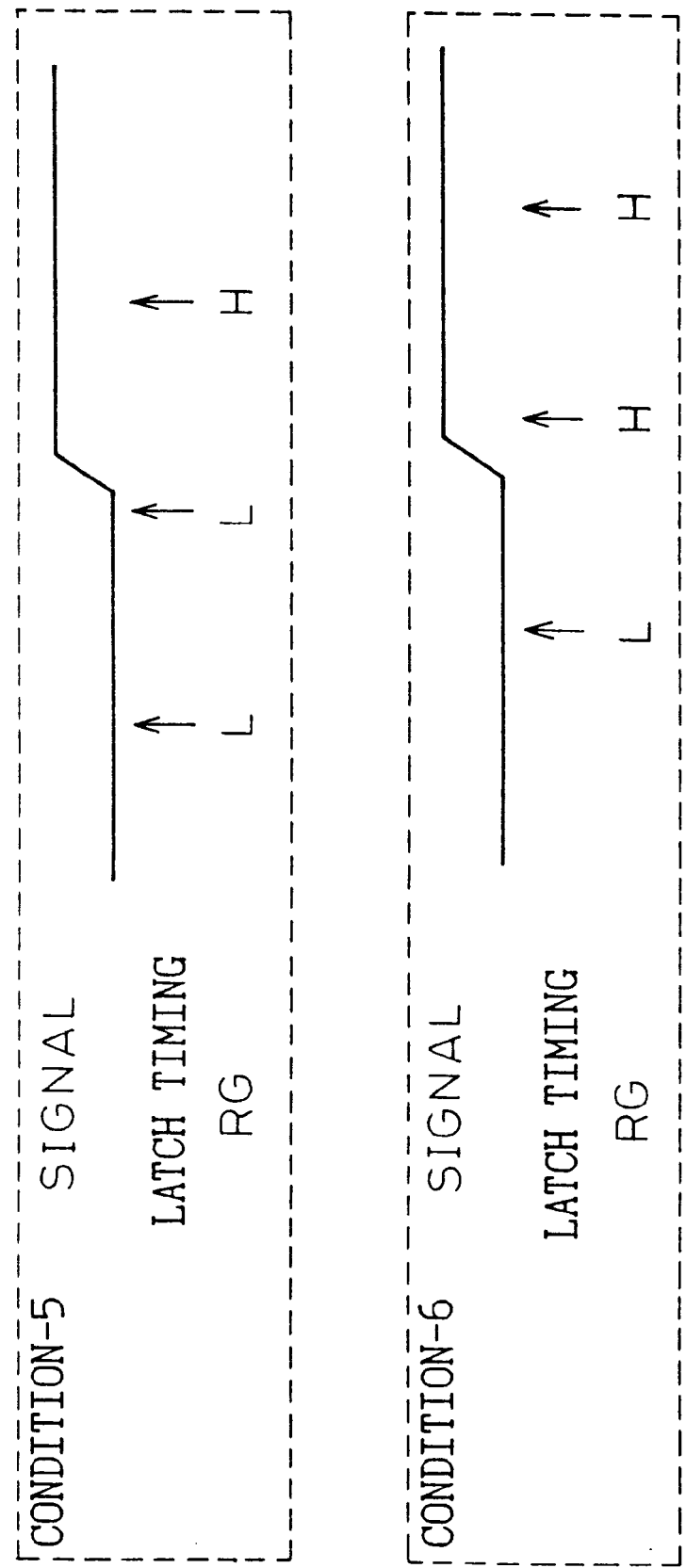
FIG. 28 is a diagram for explaining the phase judging operation according to the second embodiment.

The states 5 and 6 shown in FIG. 28 represent the case in which the input signal changes from "L" to "H". In the case where the changing edge of the input signal is delayed behind the rising edge of φ1/2 as in state 5, RG0, RG1, RG2 assume "L", "L", "H", respectively. In such a case, the delay amount of the delay circuits 231 and 232 is increased. In the case where the changing edge of the input signal is in advance of the rising edge of φ1/2 as in state 6, on the other hand, RG0, RG1, RG2 assume "L", "H", "H", respectively. In such a case, the delay amount of the delay circuits 231 and 232 is reduced.

FIG. 29 is a table showing each of the above-mentioned states, the associated values of RG0, RG1, RG2 and the required operation.

The phase judging circuit of FIG. 25 outputs a "L" signal as a hold signal and a "H" signal as an up/down signal in states 1 and 2, and a "H" signal as a hold signal in states 3 to 6, In addition, it outputs a "H" signal for indicating the count-up as an up/down signal in states 3 and 5, and a "L" signal for indicating the count-down as an up/down signal in states 4 and 6.

Figure 30:
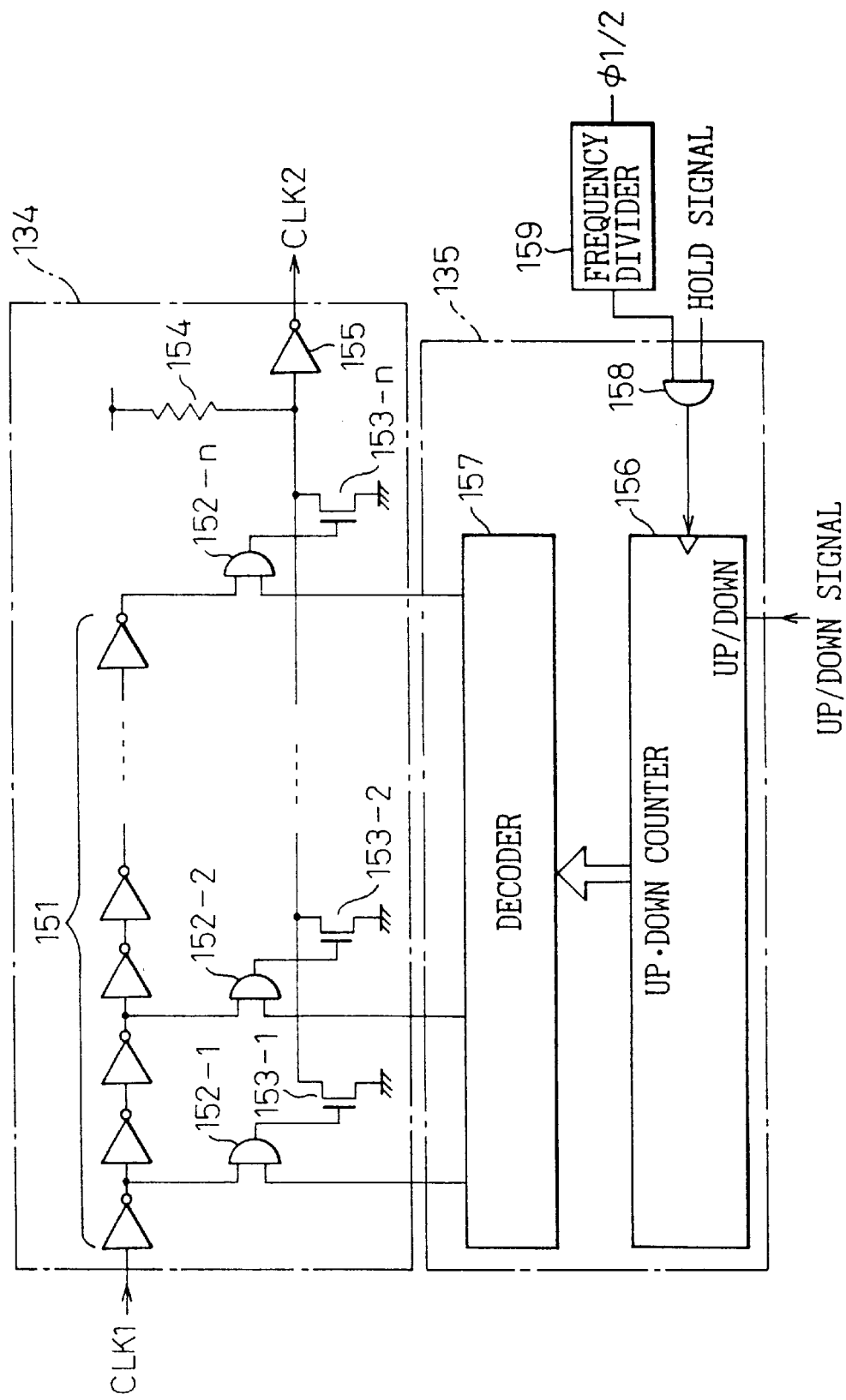
FIG. 30 is a diagram showing an example configuration of a delay circuit and a delay control circuit of a semiconductor device at the receiving end according to the second embodiment.

FIG. 30 is a diagram showing a configuration of the delay circuit 231 and the delay control circuit 233 according to the second embodiment. As shown in FIG. 24, these circuits have the same configuration as the delay circuit 231. A delay circuit 232, though not shown, has the same configuration as the delay circuit 231 and is controlled by the same control value as the delay control circuit 233. As shown in FIG. 30, this configuration is similar to that of FIG. 19, the difference being that an up/down signal is applied as a CLKC, a hold signal is input in place of the mode select signal, and the clock $\phi 1/2$ output from the delay circuit 2 and frequency-divided by the frequency divider 159 is input in place of $\phi 1/2D$. Some time is required before the delay amount in the delay circuit 134 is changed by the arithmetic operation in the phase judge circuit 241 and the operation of changing the control value at the decoder 157 and the up/down counter 156 based on the result of calculation in the phase judge circuit 241. In the case where this time is longer than the one-half period, the delay amount based on the judgement is actually changed after the next judgement, thereby causing a time delay of feedback operation. This time delay of feedback would cause a periodical fluctuation of the delay amount in the time range corresponding to the two stages of the delay circuit where the phases almost coincide with each other. According to this embodiment, the clock $\phi 1$ is applied after being frequency-divided in the frequency divider 159 in order to obviate this problem. As a result, only one feedback is executed for each group of clocks, and no problem occurs.

The input circuit of a semiconductor device according to the second embodiment constantly performs the operation of adjusting the out-of-phase condition during the operation of the semiconductor device. During the operation of the semiconductor, the out-of-phase condition is thus always adjusted. Even in the case where there occurs any difference in delay amount due to temperature changes or the like, therefore, the adjustment for preventing the out-of-phase condition is automatically carried out. The input circuit of the semiconductor device according to the second embodiment requires no process of switching the mode. In view of the possibility of a large displacement occurring immediately after starting the system, however, it is necessary to provide an appropriate initialization period corresponding to an appropriate number of clocks for calibration. According to the second embodiment, therefore, an initialization time is set which is longer than the number of clocks required for convergence from the maximum displacement, and a dummy signal generating circuit is inserted in the driving-end semiconductor device, so that a periodically-changing dummy signal suitable for the adjustment of the receiving timing is output during the initialization period. The receiving-end semiconductor device adjusts the input timing adjusting circuit based on this dummy signal during the initialization period, and adjusts the input timing adjusting circuit by a normal input signal after the initialization period.

Figure 31:
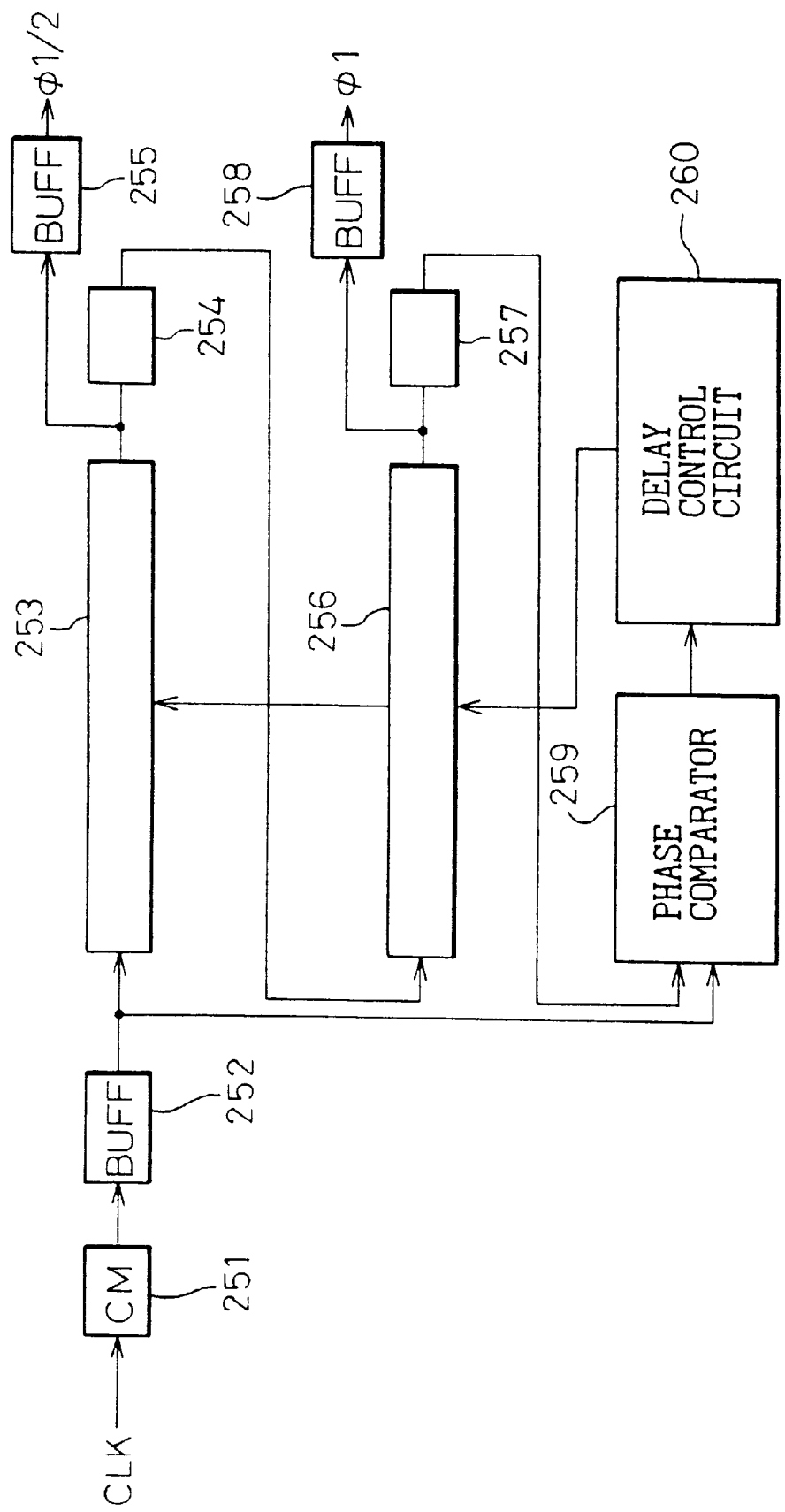
FIG. 31 is a diagram showing a configuration of a clock generating circuit according to a third embodiment.
Figure 32:
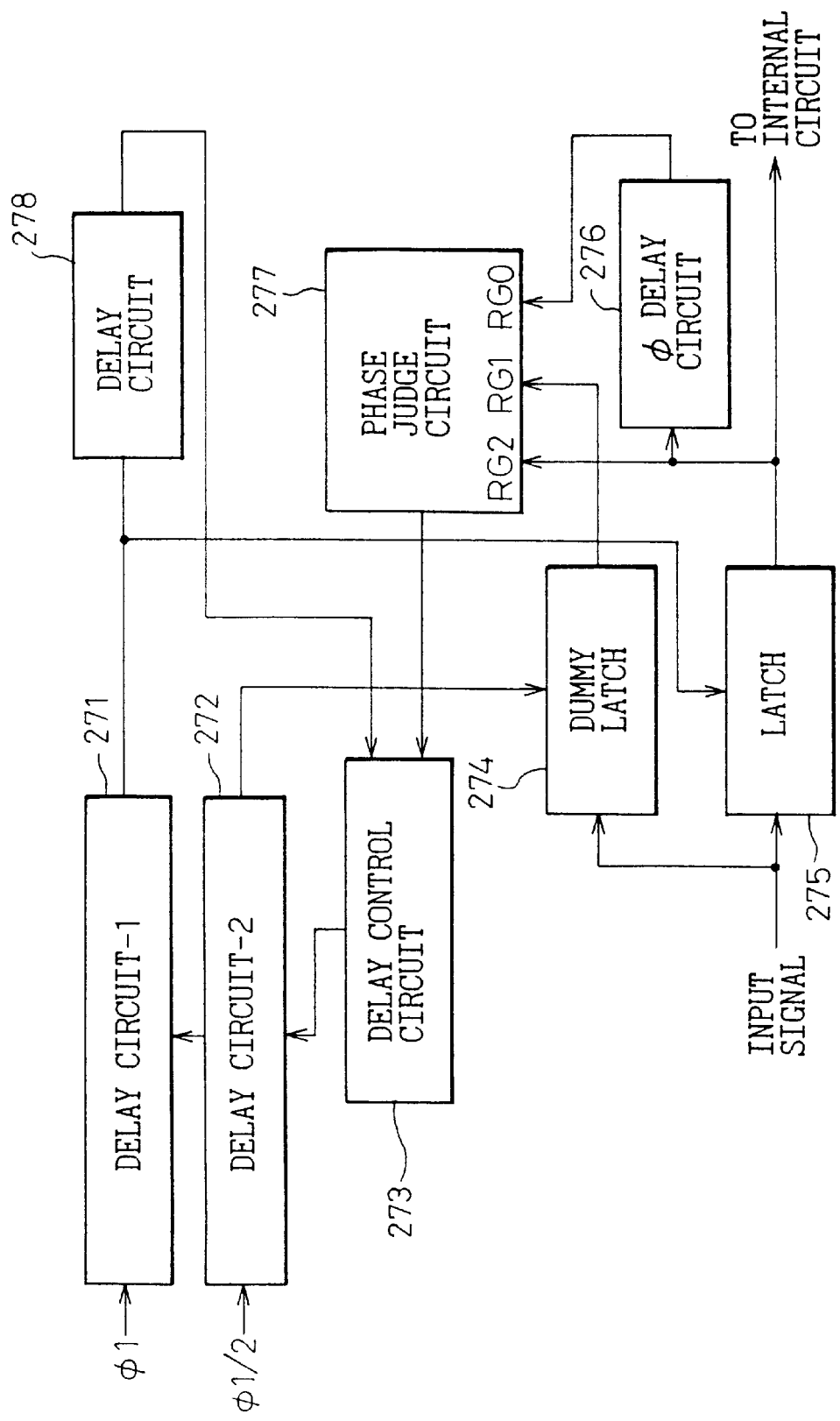
FIG. 32 is a diagram showing a configuration of an input circuit according to the third embodiment.

FIG. 31 is a diagram showing a clock generating circuit of the receiving-end semiconductor device according to a third embodiment, and FIG. 32 is a diagram showing a configuration of the input section of the receiving-end semiconductor device according to the third embodiment. The third embodiment represents the case in which the input circuit and the clock generating circuit according to the second embodiment are partially modified, and has the same basic configuration as the second embodiment.

As shown in FIG. 31, the clock generating circuit according to the third embodiment is similar to the clock generating circuit according to the second embodiment shown in FIG. 23 lacking the input circuits 216 and 222. Since the two input circuits 216 and 222 are removed at the same time, the route leading from the delay circuit 253 to the delay circuit 256 is identical to the route leading from the delay circuit 256 to the phase comparator 259, so that the clock $\phi 1$ and the clock $\phi 1/2$ displaced from the clock $\phi 1$ by exactly one half period are output. The current mirror circuit is used for retrieving the signal with accurate timing. The present invention in which the phase is adjusted, however, is relatively free of this restriction and can be done without the current mirror circuit.

As shown in FIG. 32, the input section according to the third embodiment (including the input circuit and the input timing adjusting circuit) constitutes a circuit lacking the current mirror circuit 237, the buffer circuit 238, the dummy current mirror circuit 234 and the dummy buffer circuit 235 included in the input section of the second embodiment shown in FIG. 24. Instead, it includes a $\phi$ delay circuit 276 in place of the latch circuit and also a delay circuit 278 for adjusting the timing of the counting operation in accordance with the result of judgement at the delay control circuit 273.

As described above, the current mirror circuit is used for retrieving the signal with accurate timing. According to the present invention, in contrast, the phase is adjusted, and therefore the need of the current mirror circuit is reduced and therefore eliminated. The current mirror circuit in which current constantly flows consumes a large power. The elimination of the current mirror circuit, therefore, can reduce the power consumption.

The second embodiment is such that the clock $\phi 1$ is frequency-divided by a frequency divider circuit to prevent the problem which otherwise might be posed by the feedback delay. According to the third embodiment, in contrast, an appropriate timing signal is generated by the delay circuit 278, and this timing signal is used to perform the up/down counting operation. Therefore, the feedback delay is reduced and no such problem as described above occurs.

In the second and third embodiments, the clock generating circuit generates an internal clock and a shift clock just one half period displaced from the internal clock, and the input timing adjusting circuit includes two delay circuits for delaying the two clocks, respectively. It is also possible to generate a shift clock just one half period displaced from the output of the delay circuit for adjusting the input timing as according to the second aspect of the invention shown in FIG. 13. The fourth embodiment is such an example.

Figure 33:
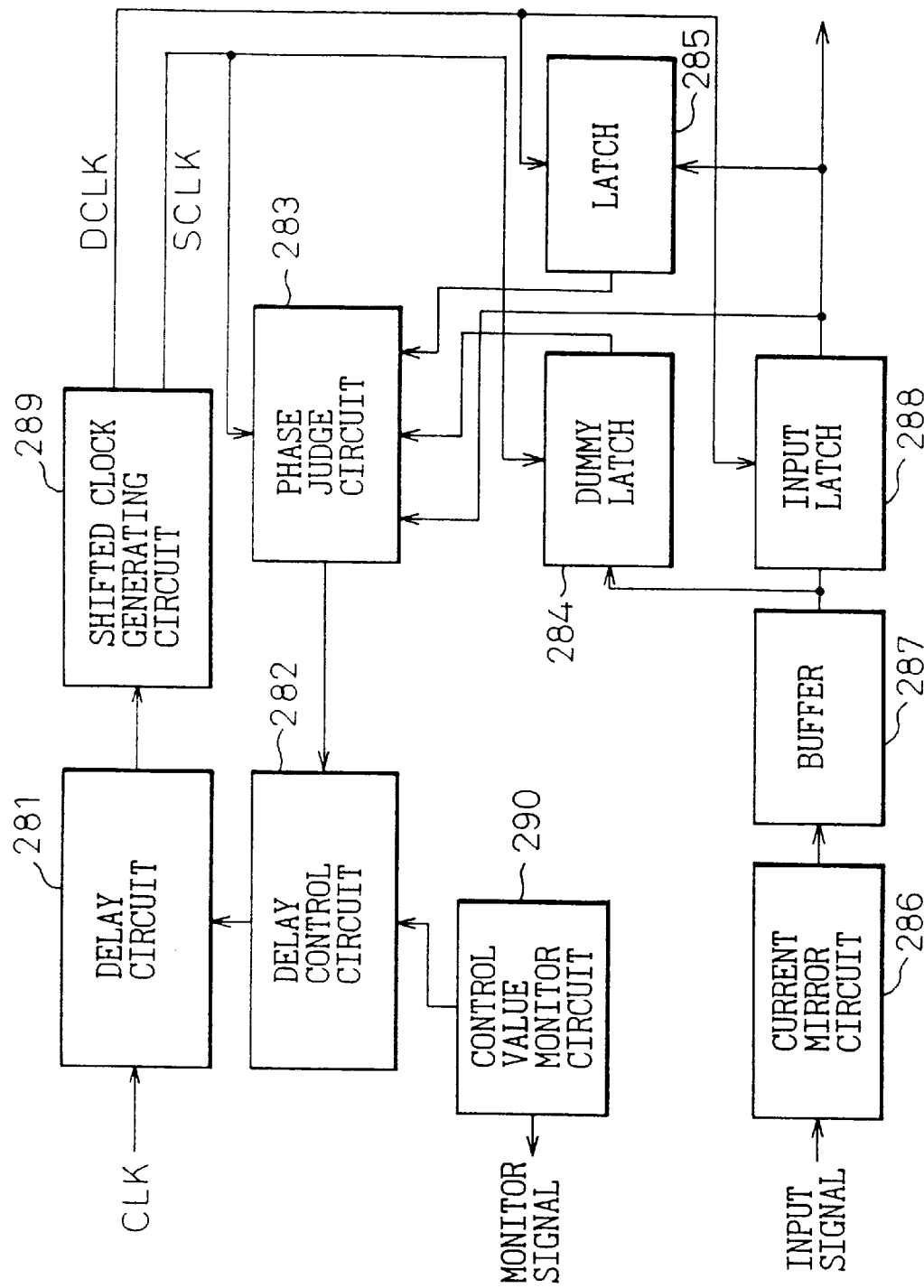
FIG. 33 is a diagram showing a configuration of an input circuit according to a fourth embodiment.

FIG. 33 is a diagram showing a configuration of an input circuit and an input timing adjusting circuit according to the fourth embodiment. The input circuit and the input timing adjusting circuit according to the fourth embodiment, as shown, have a configuration similar to the corresponding circuits of the second embodiment shown in FIG. 24. The difference, however, lies in that the present embodiment has only one delay circuit and includes a shift clock generating circuit 289 for generating a shift clock from the output of the delay circuit, that the dummy latch 284 is supplied with the output of the buffer circuit 287 of the input circuit without the dummy current mirror circuit and the dummy buffer circuit, and that a control value monitor circuit 290 is provided for monitoring whether or not the control value of the delay control circuit 282 has ceased to change or not. The same shift clock generating circuit 289 as the described above is used. The input circuit and the input timing adjusting circuit according to the fourth embodiment operate substantially the same way as the corresponding circuits of the second embodiment except for the above-mentioned points.

As described above, in the circuit according to the second embodiment, a sufficiently long initialization period is inserted after starting the system so that the control value may converge within the initialization period from the state which may be displaced to a maximum. According to the fourth embodiment, the control value monitor circuit 290 checks for the fluctuations of the control value of the delay control circuit 282. In the case where the input timing signal is set in optimum state, the control value of the delay control circuit 282 is considered to cease to change. If the continuation of the same control value is detected by the control value monitor circuit 290, therefore, it is judged that the input timing signal is set in optimum state.

Figure 34:
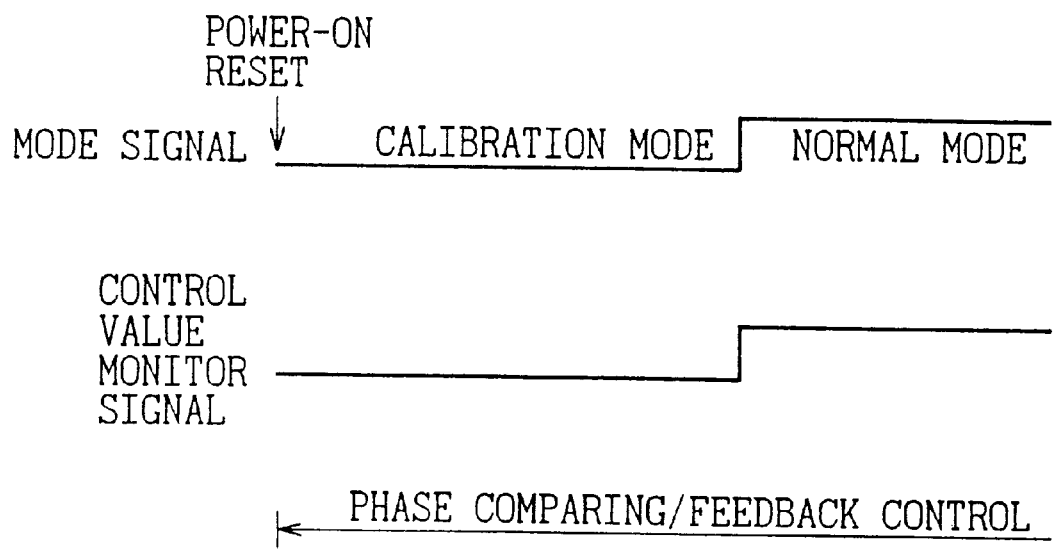
FIG. 34 is a diagram showing the operation modes according to a fourth embodiment.

FIG. 34 is a diagram showing an operation mode according to the fourth embodiment. With the start of the system, a power-on reset signal is produced to thereby start the initialization mode (calibration mode). In the calibration mode, the driving-end semiconductor device produces a signal of a value changing in predetermined cycles. The receiving-end semiconductor device, upon receipt of this signal, changes the control value of the input timing adjusting circuit gradually to an optimum timing. Once the input timing is optimized, as described above, the control value of the delay control circuit 282 ceases to change. The control value monitor circuit 190 thus detects that the same control value is generated continuously and turns on the control value monitor signal. In response to this, the system switches the mode signal to normal mode for starting the normal operation. The input timing adjusting circuit of the receiving-end semiconductor device, even after entering the normal mode, compares the phase of the input signal and on the basis of the comparison result, continues the feedback control.

In the first to fourth embodiments described above, the phases of the input signal and the input timing signal are compared by judging the value of the input signal actually retrieved to attain the optimum timing. In the case where the clock period has become very short, however, the optimum input timing develops a difference between when the input signal changes every clock cycle and when the same value is continued.

Figure 35:
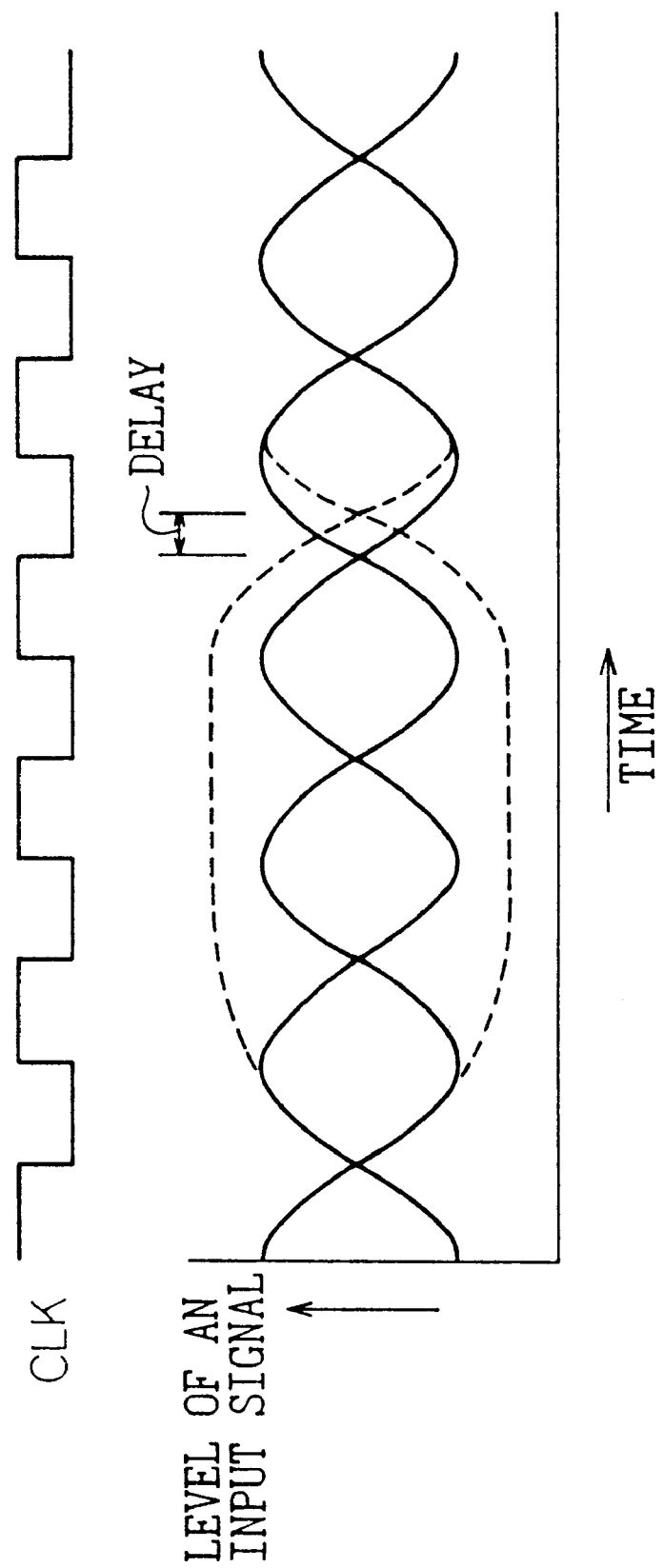
FIG. 35 is a diagram showing the difference of the optimum timing due to the pattern of an input signal.

FIG. 35 is a diagram for explaining this problem. The solid lines represent the level change of the input signal with the input signal undergoing a change in every clock cycle, and the dashed lines the level change of the input signal with the same value continued. As shown, when the input signal changes every clock cycle, the input signal begins to change to the next level before reaching to a sufficient level. Specifically, the input signal changes only up to midway of the level, resulting in a small amplitude. In the case where the input signal continues with the same value, on the other hand, the input signal reaches a sufficient level. In the case where a signal that has reached a sufficient level assuming the same value undergoes a change, the amplitude changes greater than in the case where the input signal changes in the immediately preceding two cycles and reaches only up to midway of the level. Thus the time before changing while passing the intermediate level is delayed. Consequently, the phase comparison at the falling edge of the clock CLK develops a difference by the amount of the delay between when the input signal value changes and when the input signal value remains the same in the immediately preceding two cycles. As a result, a displacement occurs by the amount of the delay as shown depending on the type of the input signal pattern for which the input timing is adjusted. Also, as shown, the optimum timing for retrieving the changing input signal is different when the input signal value changes in the immediately preceding two cycles than when the input signal value remains the same during the same period.

According to a fifth embodiment, the problem of the difference in the input timing adjustment due to the input signal pattern is solved by comparing the phases and correcting the result of comparison by feedback only when the input signal value changes in the immediately preceding two cycles.

Figure 36:
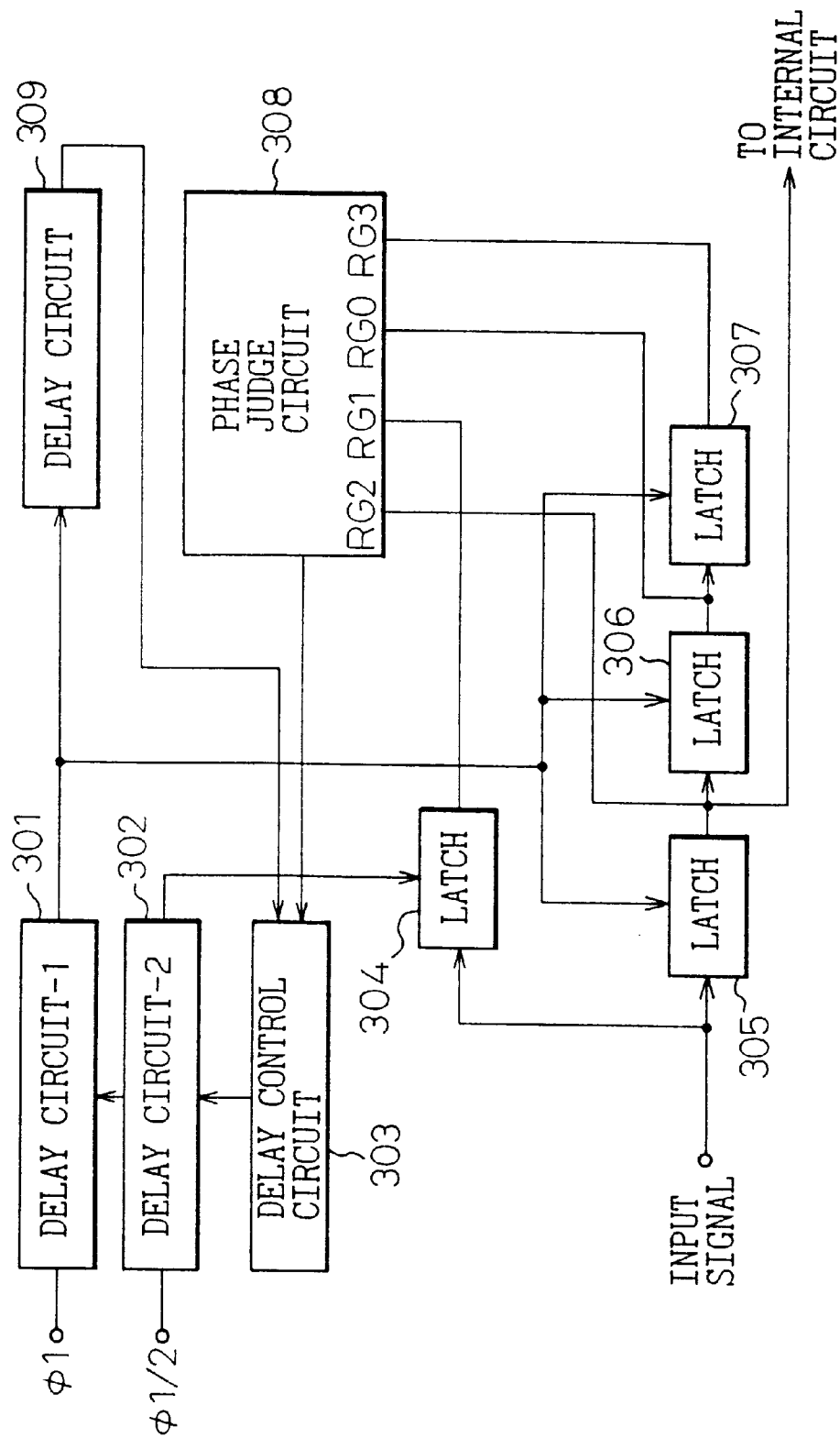
FIG. 36 is a diagram showing a configuration of an input circuit according to a fifth embodiment.

FIG. 36 is a diagram showing a configuration of the input circuit and the input timing adjusting circuit of the receiving-end semiconductor device according to the fifth embodiment. As shown in FIG. 36, the input circuit and the input timing adjusting circuit according to the fifth embodiment, which are similar to the input section of the second embodiment shown in FIG. 24, includes a latch 307 for further latching the output of the latch 306, and the output of the latch 307 is applied as RG3 to the phase judge circuit 308. The latch 307, like the latch 306, retrieves the output of the latch 306 in synchronism with the input timing signal output by the delay circuit 1. The latch 307 thus displays the function of holding the output of the latch 306 for another one clock cycle. Also, the output signal of the delay circuit 301 delayed by the delay circuit 309 is applied as a timing signal for changing the control value of the delay control circuit 303 in a manner similar to the input section according to the third embodiment shown in FIG. 32.

Figure 37:
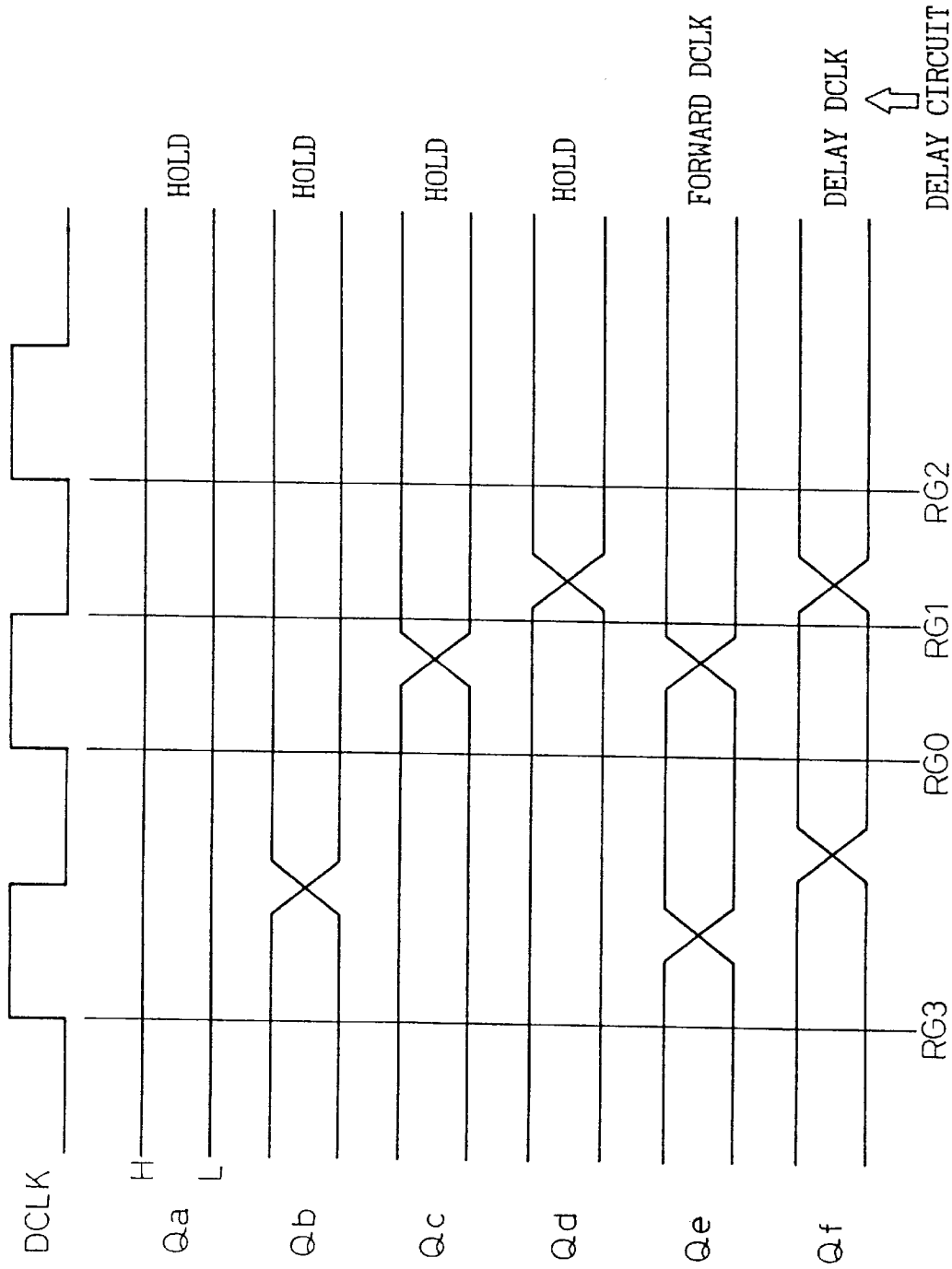
FIG. 37 is a diagram for explaining the phase judging operation according to the fifth embodiment.

FIG. 37 is a diagram for explaining the relation between the input signal pattern, the values retrieved by each latch and the phase judgement according to the fifth embodiment. The latches 305, 306, 307 retrieve the input signal and the output of the preceding stage, respectively, in synchronism with an input timing signal and output them as RG2, RG0, RG3, respectively. The latch 304 retrieves the input signal at a timing just one half period displaced from the input timing signal and outputs it as RG1. The relations, therefore, between RG0, RG1, RG2, RG3, are as shown. Character Qa designates an input signal that remains unchanged at "high" (H) or "low" (L), and character Qb an input signal that has changed in the immediately preceding cycle but one but has remained unchanged in the immediately preceding cycle. Characters Qc and Qd, on the other hand, designate input signals that have not changed in the immediately preceding cycle but have changed in the immediately preceding cycle. Character Qc represents the case in which the phase of the input timing signal DCLK is advanced, while Qd the case in which the phase of the input timing signal DCLK is delayed. Characters Qe and Qf represent the case in which the input signal has changed successively in the immediately preceding two cycles, Qe the case in which the phase of the input timing signal DCLK is advanced, and Qf the case in which the phase of the input timing signal DCLK is delayed. As described above, according to the fifth embodiment, the phase comparison and the feedback correction are carried out only when the input signal value changes in the immediately preceding two cycles. As for the input signal Qe, therefore, the control value of the delay control circuit 303 is changed in such a manner as to delay the input timing signal DCLK, and as for the input signal Qf, the control value of the delay control circuit 303 is changed in such a manner as to advance the input timing signal DCLK. As for other input signals, the control value of the delay control circuit 303 is held.

Figures 38, 39:
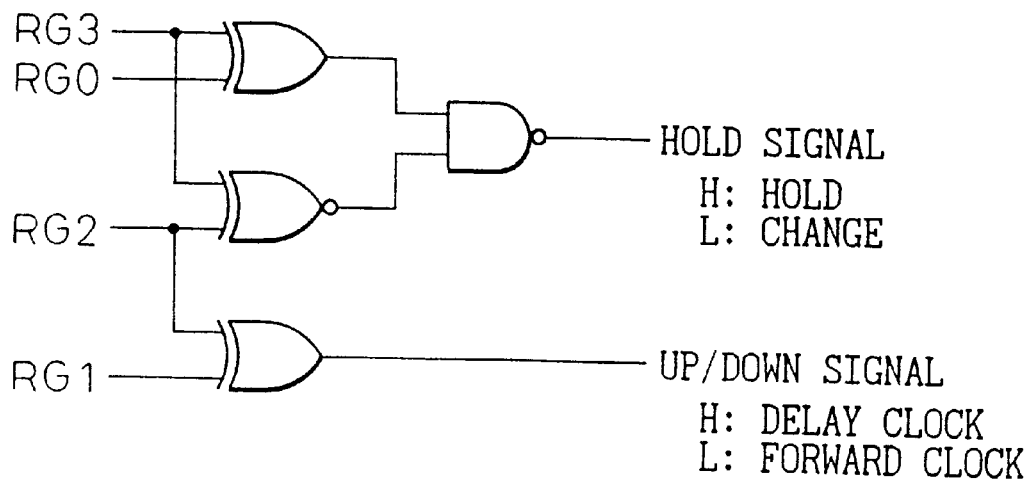
FIG. 38 is a diagram showing a configuration of a phase judge circuit according to the fifth embodiment.
FIG. 39 is a diagram showing a truth table for a phase judge circuit according to the fifth embodiment.

FIG. 38 is a circuit diagram showing a phase judging circuit 308, and FIG. 39 a truth table therefor. The truth table of FIG. 39 is derived from the circuit of FIG. 38. Only in the case where the input signal is Qe or Qf in FIG. 37, therefore, the hold signal assumes a "low" (L) level, so that the control value of the delay control circuit 303 is changed in accordance with the up/down signal. In the case where the input signal assumes any one of Qa to Qd, on the other hand, the hold signal turns "high" (H) thereby to hold the control value of the delay control circuit 303.

As described above, the optimum timing for retrieving the changing input signal is differentiated between when the input signal value changes in the immediately preceding two cycles and when the input signal remains the same value in the same two cycles. According to a sixth embodiment, as in the fifth embodiment, the input timing is adjusted, and if the input signal assumes different values in the immediately preceding two cycles, the input signal is retrieved in synchronism with the particular input timing signal. In the case where the input signal remains the same during the immediately two preceding cycles, in contrast, the next input timing signal is retrieved by delaying it by a predetermined amount.

Figure 40:
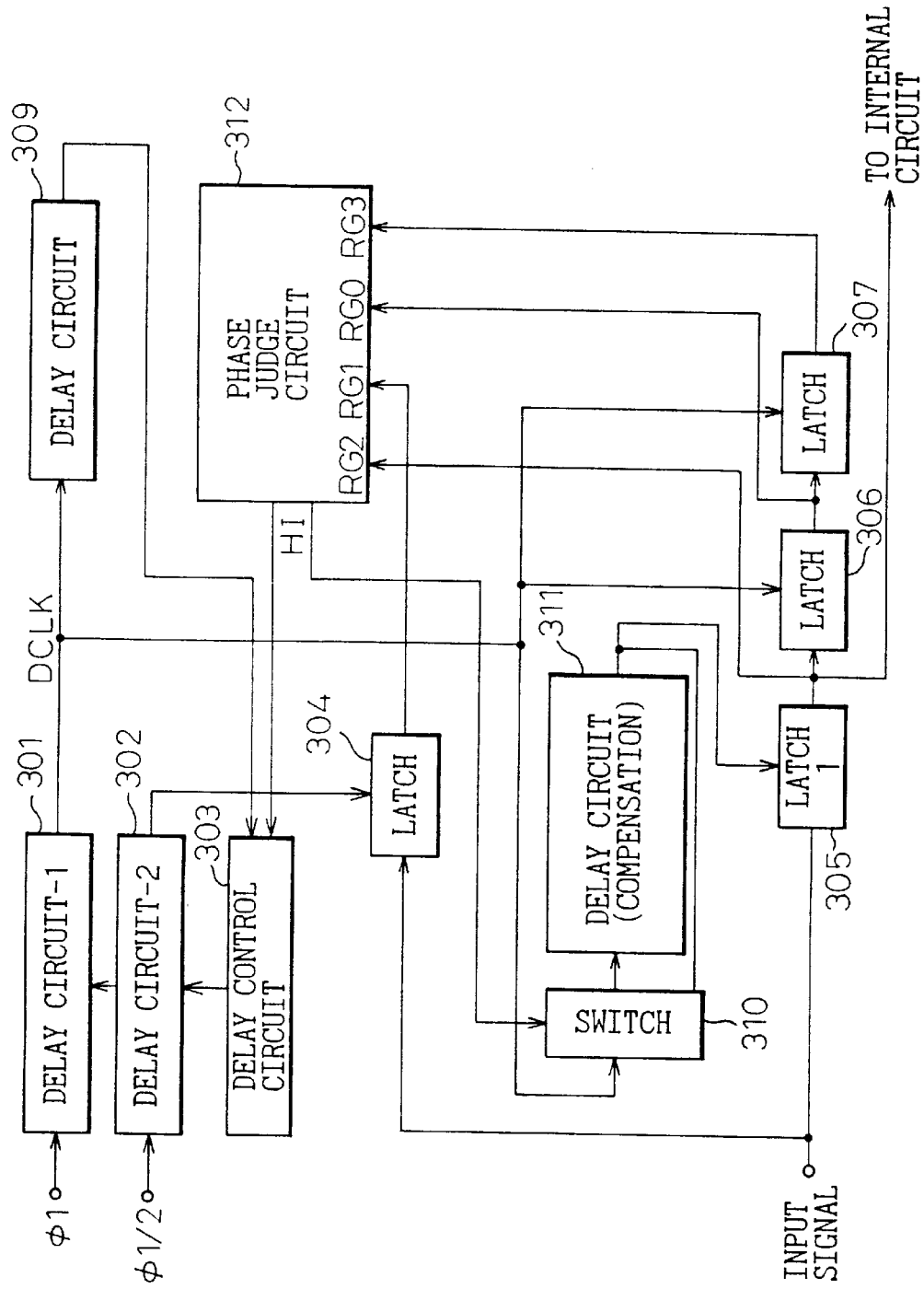
FIG. 40 is a diagram showing a configuration of an input circuit according to a sixth embodiment.
Figure 41:
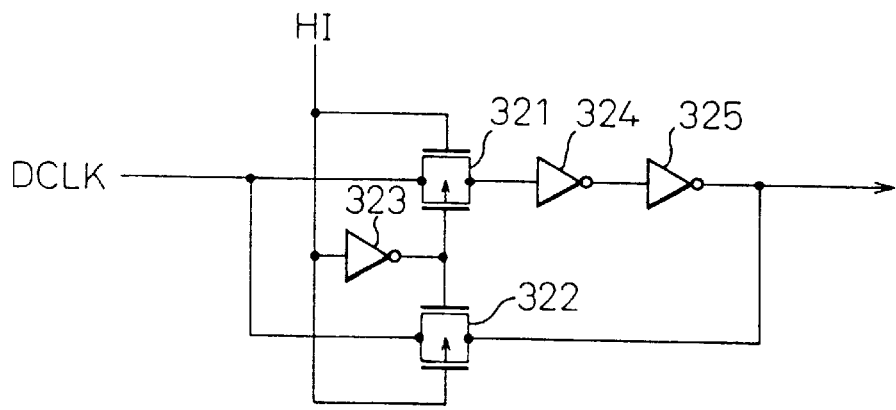
FIG. 41 is a diagram showing a configuration of a timing correction circuit according to the sixth embodiment.

FIG. 40 is a diagram showing a configuration of an input circuit according to a sixth embodiment. The difference of this embodiment from the fifth embodiment shown in FIG. 36 resides in that the present embodiment further includes a switch 310 and a correction delay circuit 311, and that the input timing signal DCLK supplied to the latch 305 can be selectively delayed by a predetermined amount in accordance with a compensation control signal H1. FIG. 41 is a diagram showing a configuration of the switch 310 and the compensation delay circuit 311 according to the sixth embodiment. Transfer gates 321, 322 and an inverter 323 make up the switch 310, and two inverters 324 and 325 constitute the compensation delay circuit 311. The compensation control signal H1 output from the phase judge circuit 308 assumes a L level when the input signal value has changed in the immediately preceding two cycles, and a H level when it remains the same value. When the correction control signal H1 is at L level, the transfer gate 322 opens, so that the input timing signal DCLK is applied to the latch 305 directly without being delayed. In the case where the compensation control signal H1 is at H level, on the other hand, the transfer gate 321 opens and therefore the input timing signal DCLK is input to the latch 305 after being delayed by the amount corresponding to the two inverters 324 and 325.

Figure 42:
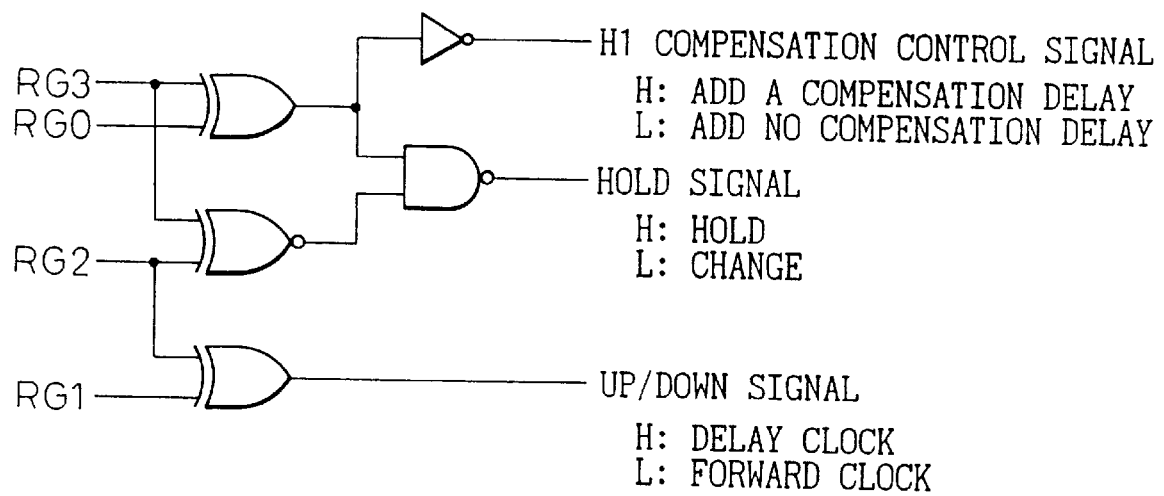
FIG. 42 is a diagram showing a configuration of a phase judge circuit according to the sixth embodiment.

FIG. 42 is a diagram showing a configuration of the phase judge circuit 312 according to the sixth embodiment. FIG. 43 is a truth table of this circuit. Comparison between FIGS. 38 and 39 shows that the phase judge circuit 308 of the fifth embodiment has an added function of judging whether or not the input signal value is different in the immediately two preceding cycles. As to Qa, Qc and Qd for which the input signal value is different in the immediately preceding two cycles, the correction control signal H1 assumes a H level, while in the case of Qb, Qe and Qf for which the input signal value remains the same in the immediately preceding two cycles, on the other hand, the compensation control signal H1 assumes a L level.

Figure 44:
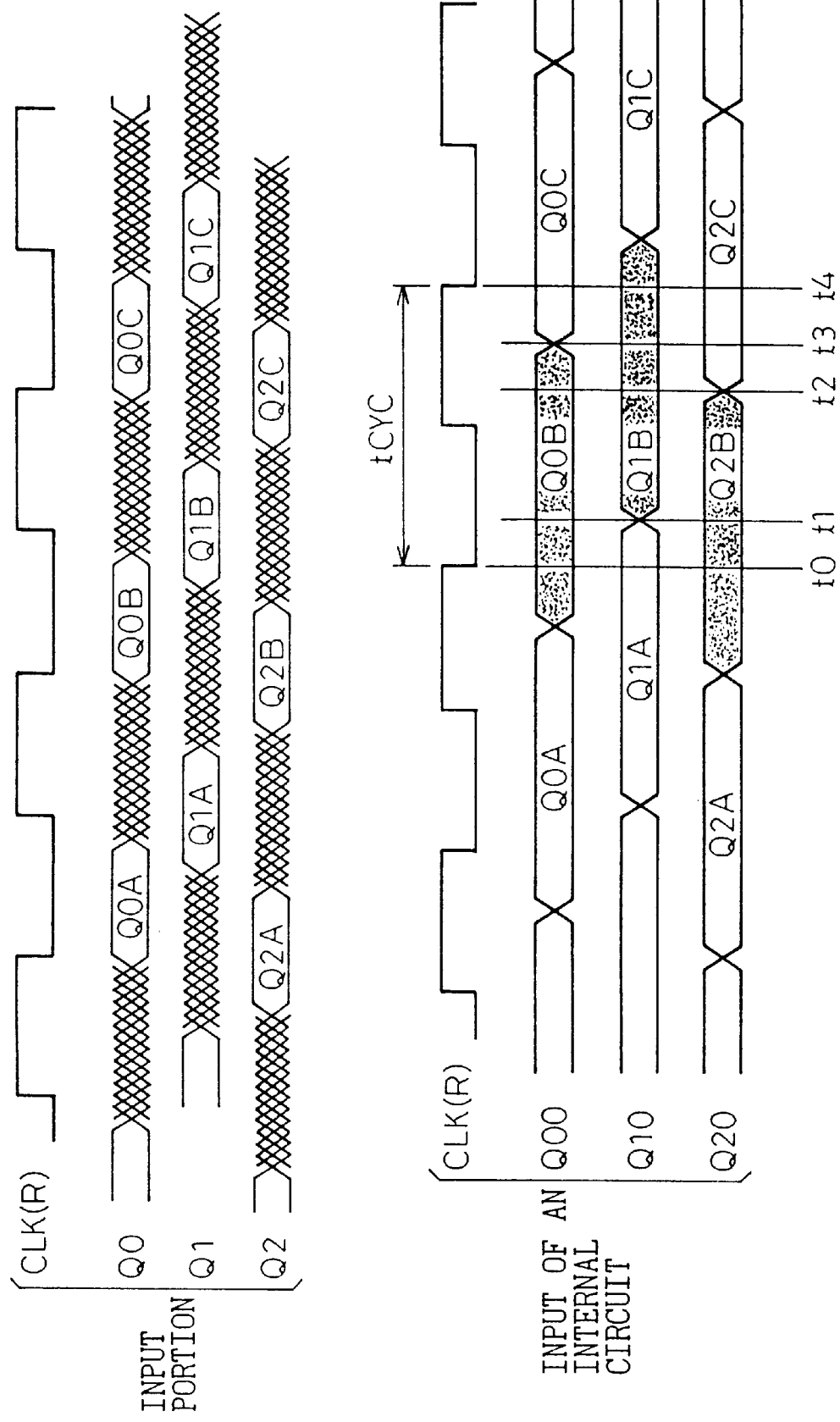
FIG. 44 is a diagram for explaining the problem points of the input circuit according to the invention shown in FIG. 8.

In the first to sixth embodiments described above, the receiving-end semiconductor device has a basic configuration shown in FIG. 8, and includes an input timing adjusting circuit for each input circuit, by which each input signal can be retrieved at optimum timing. This in turn poses the problem of different phases of the signals output from the input circuits. FIG. 44 is a diagram for explaining this problem. In FIG. 44, input signals as applied to input circuits 53-0, 53-1, . . . , 53-n are assumed to be Q0, Q1, Q2, and output signals of the respective input circuits as applied to the internal circuit 55 are assumed to be Q00, Q10, Q20, respectively. When the phases of the input signals Q0, Q1, Q2 are displaced as shown, the input timing adjusting circuits 54-0, 54-1, . . . , 54-n adjust the phase of the internal clock in such a manner that the input circuits 53-0, 53-1, . . . , 53-n retrieve the input signals Q0, Q1, . . . , Qn at a most appropriate timing. The phase of the signals Q00, Q10, Q20 output from the input circuits and applied to the internal circuit 55 are also displaced in similar fashion. FIG. 45 is a diagram showing the cycles taken by the signals Q00, Q10, Q20 in one clock cycle. Characters t0 to t4 designate the timing shown in FIG. 44. As shown in FIG. 45, during the period of t0 to t1, Q00 and Q20 take the forms of Q0B and Q2B, respectively, having the same cycle, while Q10 assumes the form Q1A of the previous cycle. In similar fashion, during the period of t2 to t3, Q00 and Q10 assume the form of signals Q0B and Q1B having the same cycle, while Q20 is a signal Q2C in the next cycle. If the internal circuit 55 executes the process based on the signals between t0 and t1 or between t2 and t4, different sets of signals would be processed, leading to the problem of a processing error.

The embodiment explained below solves this problem. Specifically, even when the clock is out of phase with the signal at the receiving end, or even when a phase difference develops between the clock input circuit and an input circuit for other signals in the semiconductor device at the receiving end, fast delivery of signals becomes possible.

Figure 46:
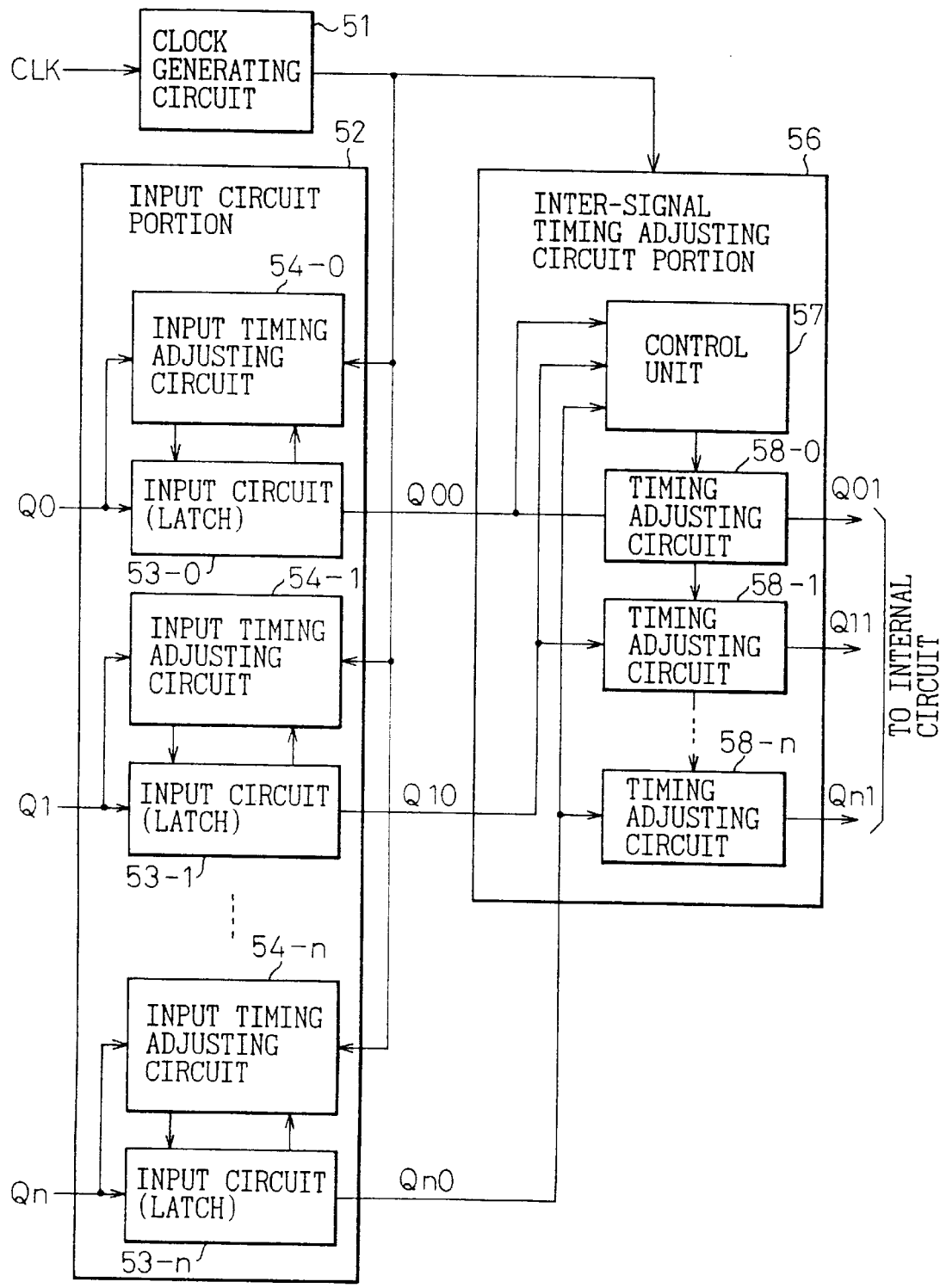
FIG. 46 is a diagram showing a basic configuration according to a seventh embodiment of the invention.

FIG. 46 is a diagram showing a basic configuration of a semiconductor device according to a seventh embodiment of the invention. As shown in FIG. 46, the semiconductor device according to the seventh embodiment includes, in addition to the basic configuration of the invention shown in FIG. 8, an inter-signal timing adjusting circuit for detecting the phase difference between output signals of the input circuits and adjusting them to be in phase with each other. The semiconductor device system according to the seventh embodiment is assumed to take the form as shown in FIG. 3.

Figure 47:
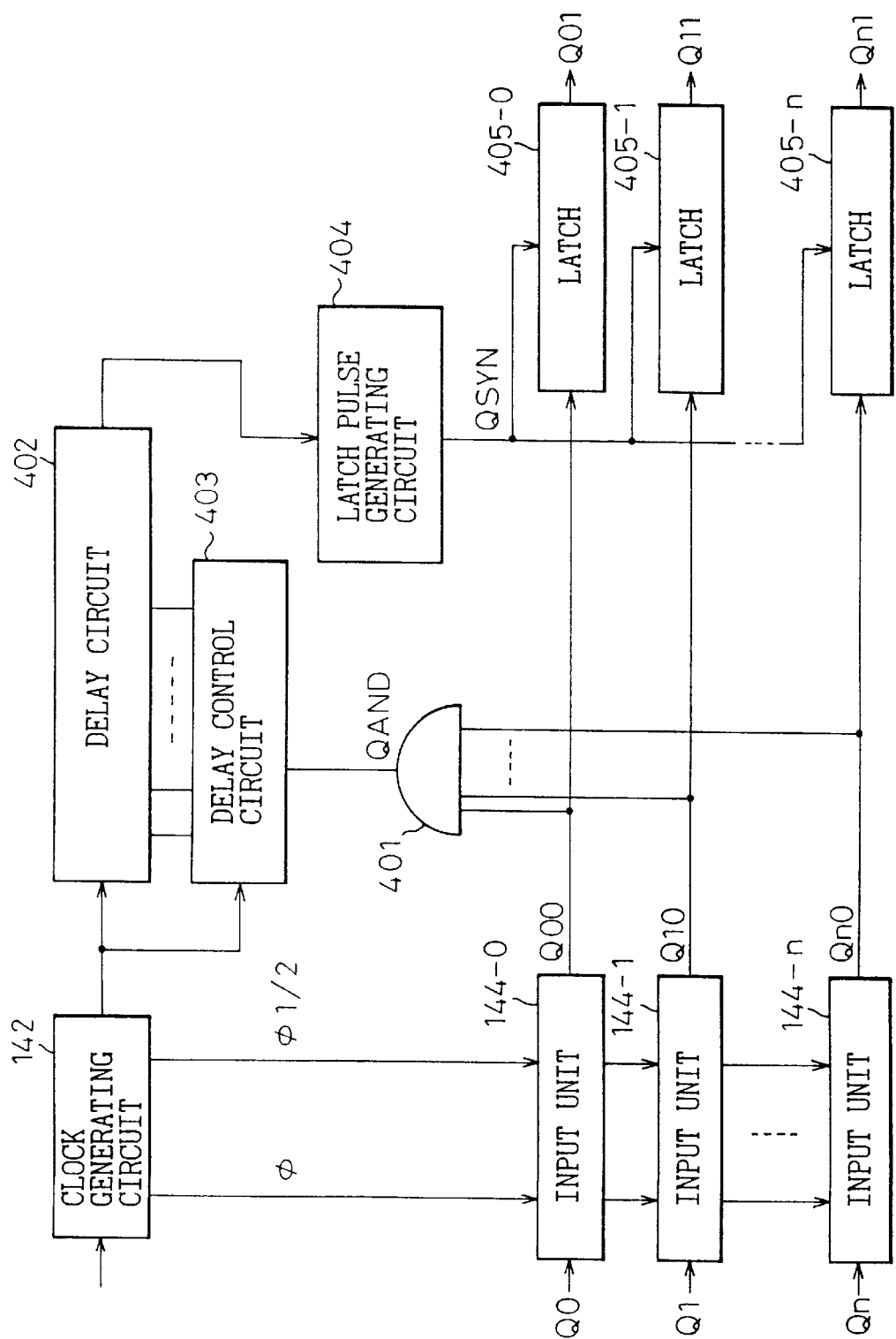
FIG. 47 is a diagram showing a configuration of a semiconductor device at the receiving end according to the seventh embodiment of the invention.

FIG. 47 is a diagram showing a configuration of a clock input circuit, input sections and an inter-signal timing adjusting circuit of the receiving-end semiconductor device according to the seventh embodiment.

As shown in FIG. 47, the receiving-end semiconductor device according to the seventh embodiment includes a clock input circuit 142 supplied with a clock transmitted from the driving-end semiconductor device for generating internal clocks φ and φ1/2, input sections 144-0, 144-1, . . . , 144-n for retrieving as an input signal thereto the signal transmitted from the driving-end semiconductor device, an AND gate 401 for calculating the logic product of the outputs of the input sections, a delay circuit 402, a delay control circuit 403, a latch pulse generating circuit 404, and latch circuits 405-0, 405-1, . . . , 405-n for latching the outputs of the input sections 144-0, 144-1, . . . , 144-n in accordance with the latch pulse QSYN output from the latch pulse generating circuit 404. The clock input circuit 142 and the input sections 144-0, 144-1, . . . , 144-n are identical to the corresponding ones of the second embodiment. The clock input circuit 142 has a configuration as shown in FIG. 23, and each input section has a configuration as shown in FIG. 24. As a result, the input circuit of the semiconductor device according to the seventh embodiment can constantly adjust the out-of-phase condition during the operation of the semiconductor device. In the seventh embodiment, however, the adjusting operation is performed only when the mode signal is input and indicates the input timing adjust mode.

Figure 48:
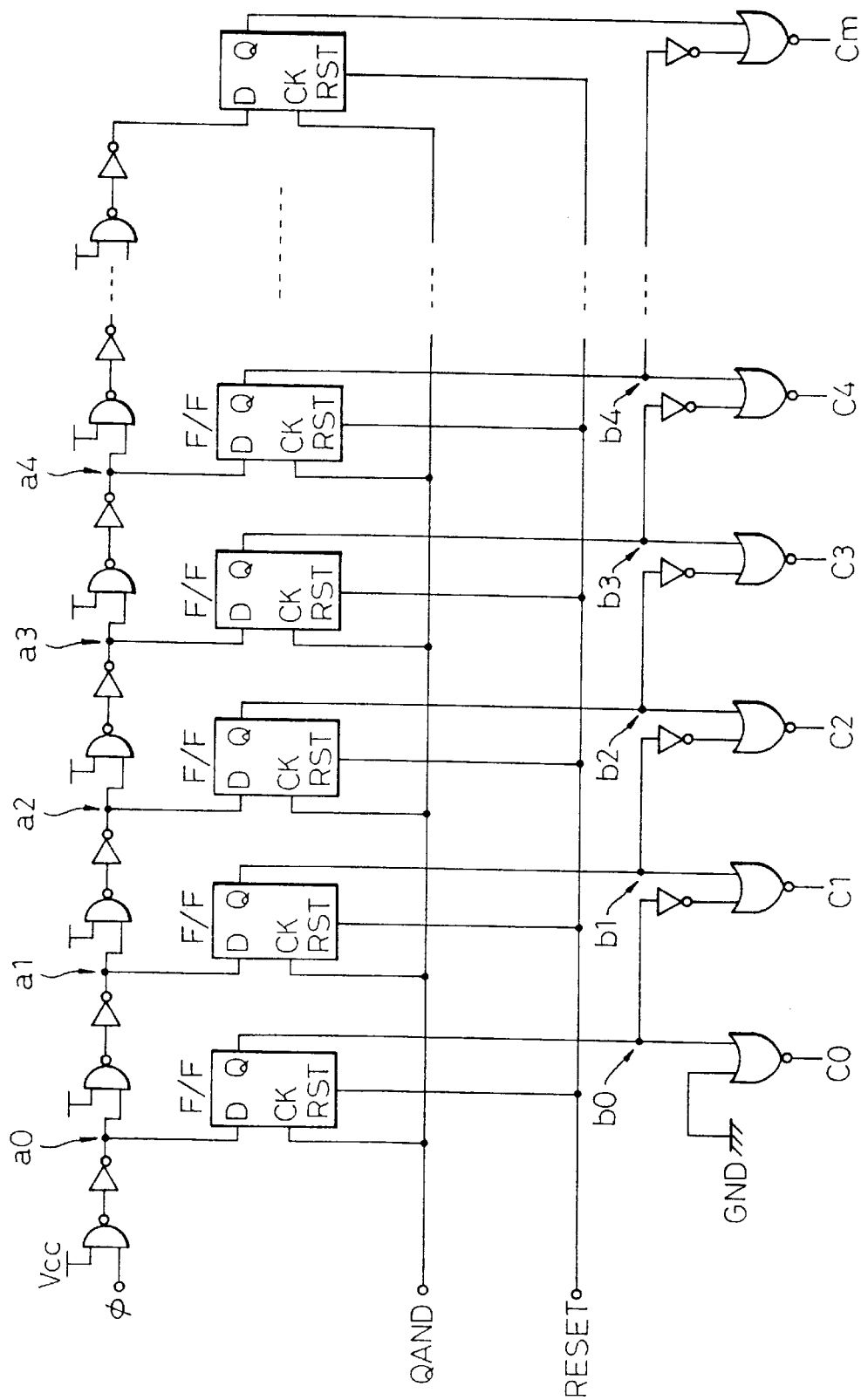
FIG. 48 is a diagram showing an example configuration of a delay control circuit according to the seventh embodiment.
Figure 49:
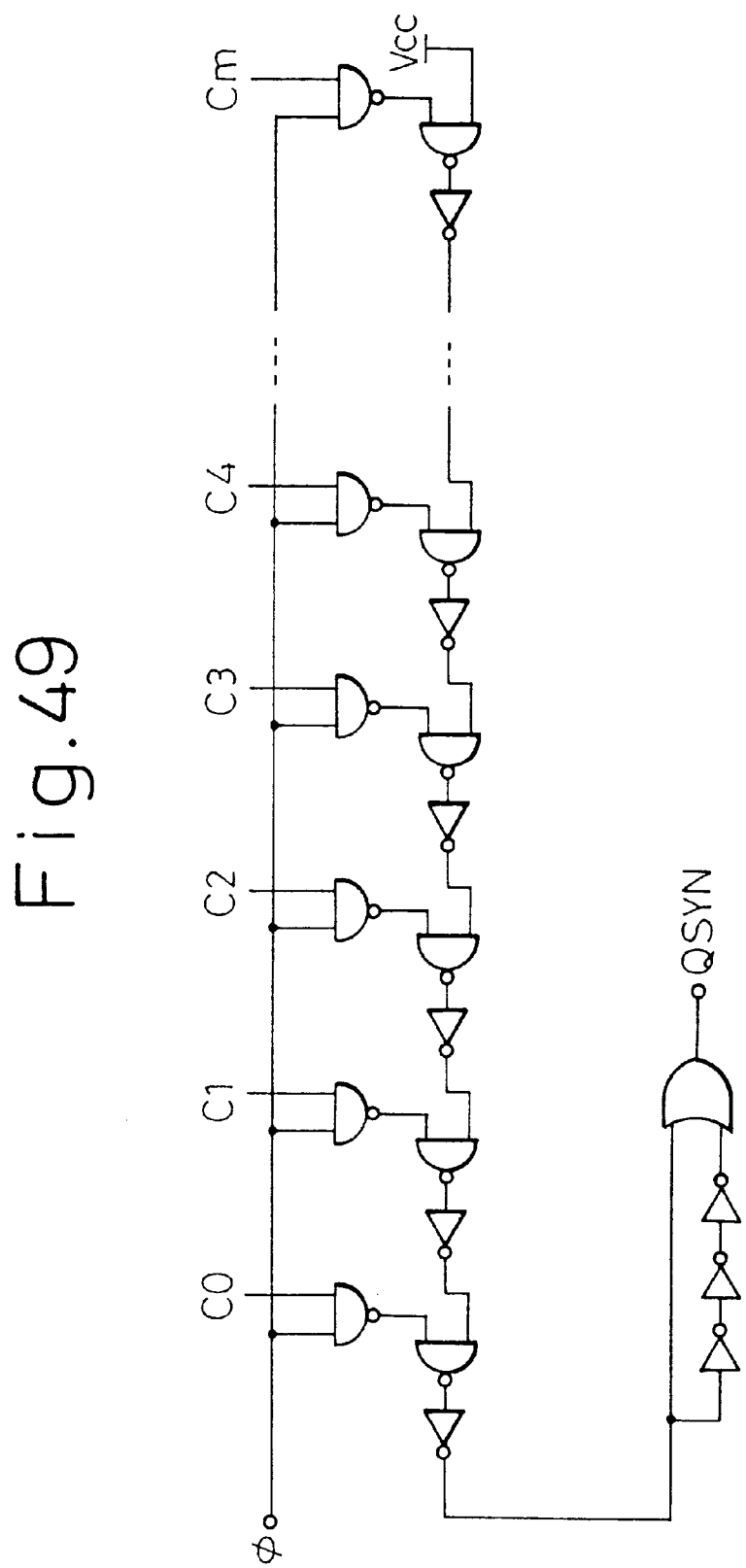
FIG. 49 is a diagram showing a configuration of a delay circuit and a latch pulse generating circuit according to the seventh embodiment.
Figure 50:
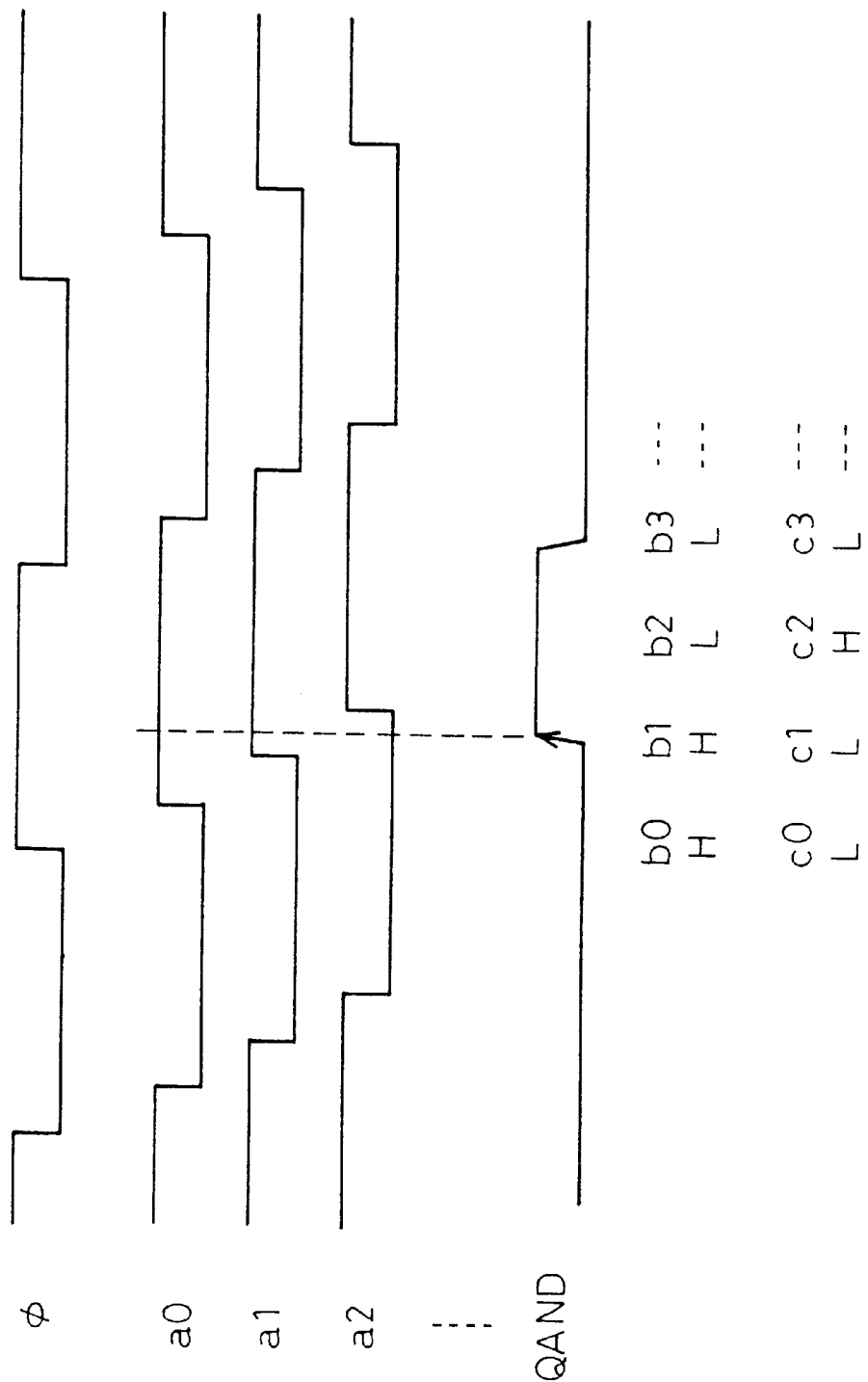
FIG. 50 is a diagram for explaining the operation of the delay control circuit according to the seventh embodiment.

FIG. 48 is a diagram showing a configuration of the delay control circuit 403 shown in FIG. 47. FIG. 49 is a diagram showing a configuration of the delay circuit 402 and the latch pulse generating circuit 404. FIG. 50 is a time chart showing the operation of the delay control circuit 403. As shown in FIG. 47, the output QAND of the AND gate 401 assumes a H level when all the outputs Q00, Q10, ..., Qn1 of the input sections 144-0, 144-1, ..., 144-n are "high" (H). The input signal applied in the receiving timing adjust mode changes in such a pattern that it assumes a H level only in specific cycles with successive L levels. If all the outputs Q00, Q10, ..., Qn1 assume a H level in the cycle portion when the input signal is at H level, the output pulse QAND assume a H level. The rising edge of this output QAND represents the timing when the most delayed input signal rises. The period when QAND remains H represents a period during which the outputs Q00, Q10, ..., Qn1 are all signals of the same cycle. Once the outputs of the input sections 144-0, 144-1, ..., 144-n are latched by the latch circuits 405-0, 405-1, ..., 405-n, respectively, during this period, therefore, it follows that all the outputs become uniform. The signals a0, a1, ..., am shown in FIG. 48 are progressively delayed and undergo a change as shown in FIG. 50. With the rise of the output QAND, a flip-flop F/F latches the signals a0, a1, ..., am. The values latched so, however, are different depending on the timing when the output QAND rises. Among the signals b0, b1, ..., bm in FIG. 48, for example, those up to b1 are H, while subsequent signals assume a L level. Upon application of these signals to the NOR gate string of FIG. 48, only the output associated with the change point assumes a H level. In FIG. 23, only c2 assumes a H level. When these signals c0, c1, ..., cn are applied to the delay circuit 402, only the NAND gate of the delay circuit for which c is at H level opens. The delay amount of the clock φ is determined by the position of the NAND gate where it opens. The last NOR gate generates a pulse QSYN of a predetermined width from the rising edge of the clock φ. In this way, QSYN is output immediately after the rise of QAND, and the latch circuits 405-0, 405-1, ..., 405-n latch the outputs Q00, Q10, ..., Qn0, respectively, of the input sections 144-0, 144-1, ..., 144-n during the period when QAND is at H level.

Figure 51:
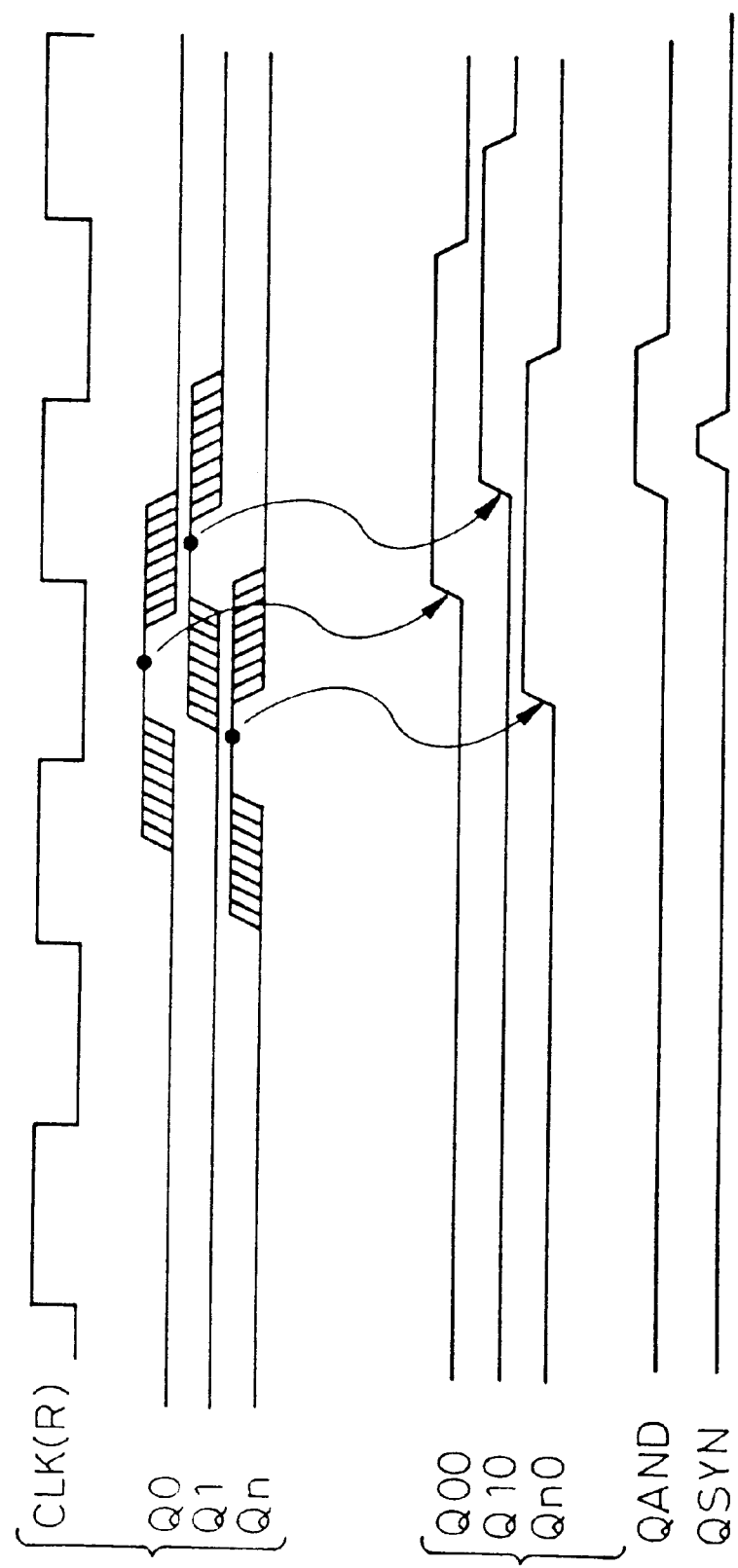
FIG. 51 is a diagram for explaining the principle of the input timing adjustment according to the seventh embodiment.

FIG. 51 is a diagram for explaining the principle of input timing adjustment for the semiconductor device according to the seventh embodiment. As shown in FIG. 51, input signals Q0, Q1, ..., Qn are displaced from the clock CLK (R) and from each other at the same time. These signals Q0, Q1, ..., Qn, if to be retrieved, are required to be so retrieved when they are stable. Specifically, these signals are desirably latched at the time points designated by dots. In view of this, the input circuit adjusts the phase of the internal clock in such a manner as to latch the signals at the time points indicated by dots thereby to output Q00, Q10, ..., Qn0. For a one-pulse signal, QAND assumes a H level when all the outputs Q00, Q10, ..., Qn0 assume a H level, and latch pulses QSYN are output accordingly. At the time point when the outputs Q00, Q10, ..., Qn0 are all retrieved, they are latched by a latch circuit in a subsequent stage.

Figure 52:
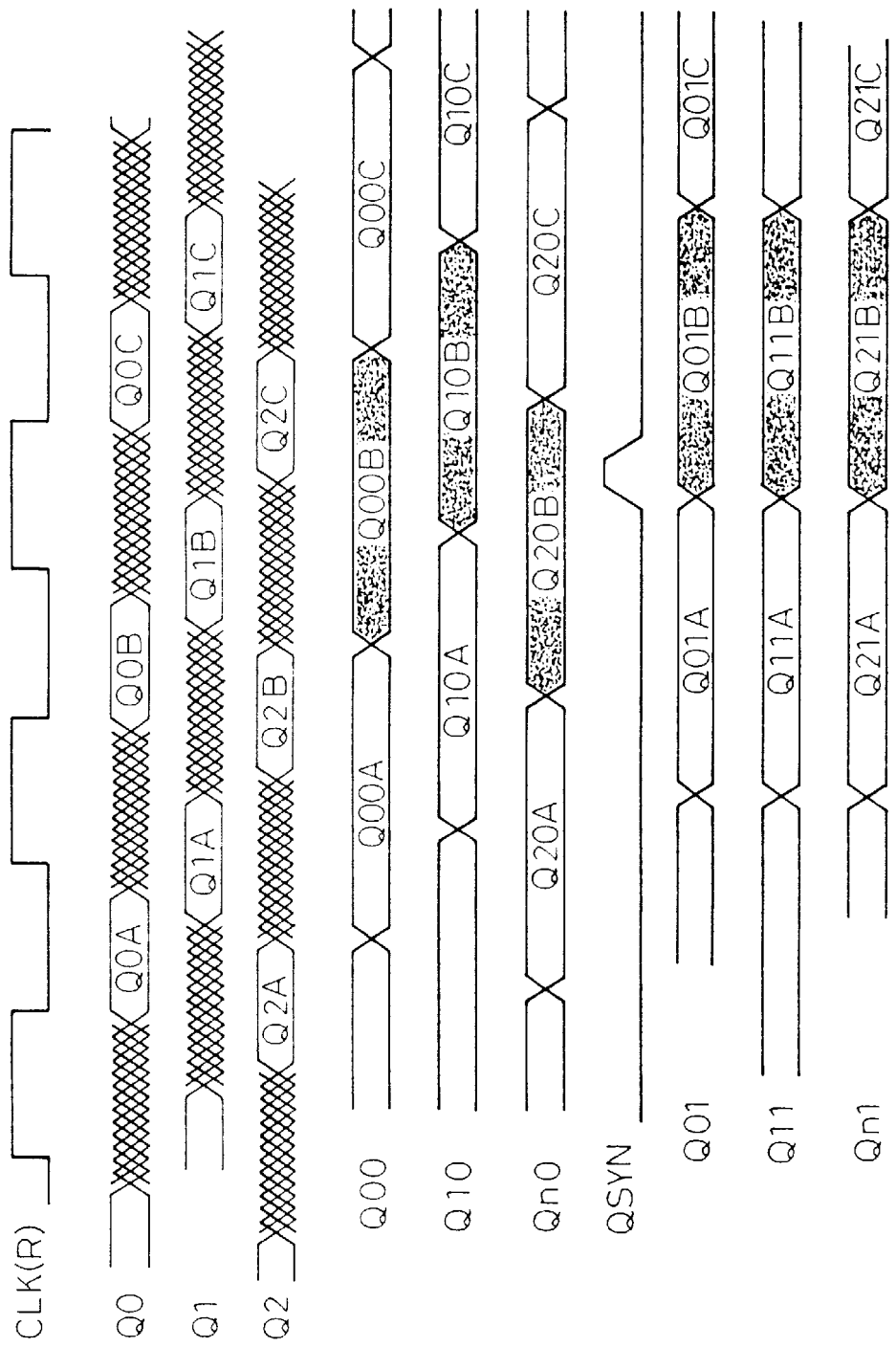
FIG. 52 is a diagram showing the operation of the input timing adjustment according to the seventh embodiment.

FIG. 52 is a diagram showing the input timing adjustment according to the seventh embodiment. As shown in FIG. 52, the input signals Q0, Q1, ..., Qn are stable only during a limited period. Each input circuit retrieves the input signals and outputs the outputs Q00, Q10, ..., Qn0 during this limited stable period. Then, at the time point when all the outputs Q00, Q10, ..., Qn0 of the same cycle are retrieved, a QSYN signal is output, then, all the outputs are latched at the latch circuit in the next stage to produce outputs Q01, Q11, ..., Qn1.

Figure 53:
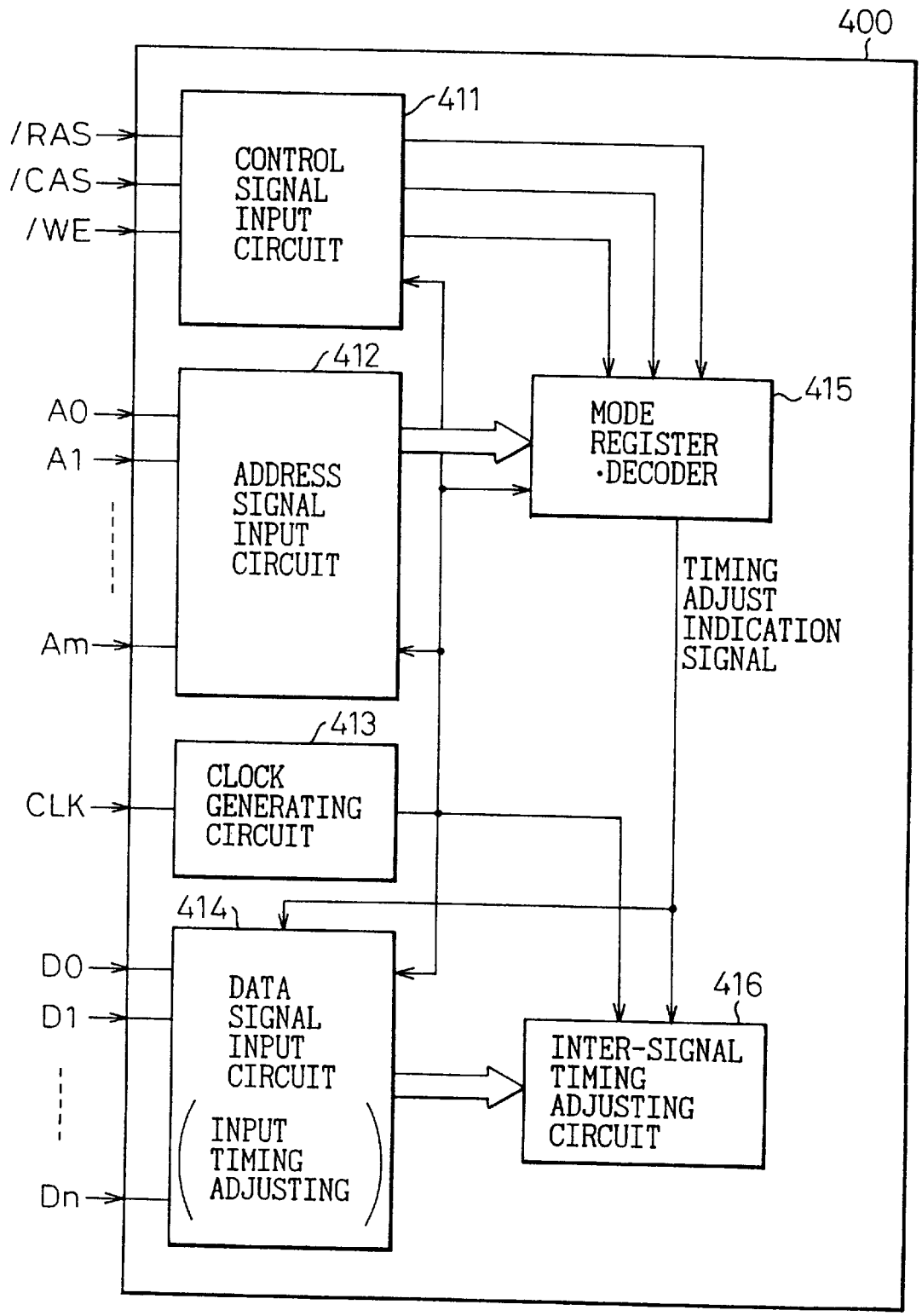
FIG. 53 is a diagram showing a general configuration of a semiconductor device according to the seventh embodiment.

FIG. 53 is a diagram showing a general configuration of a semiconductor device according to the seventh embodi-ment including a SDRAM, as an example. A SDRAM 400 includes a control signal input circuit 411 supplied with signals /RAS, /CAS, /WE, etc., an address signal input circuit section 412 supplied with an address signal, a clock generating circuit 413 supplied with a clock CLK, a data signal input circuit section 414 supplied with a data signal, a mode register/decoder 415, and an inter-signal timing adjusting circuit 416. The corresponding circuits according to the first embodiment described above are applied to the data signal input circuit section 414 and the inter-signal timing adjusting circuit 416. As described earlier, the SDRAM is required to process the input and output of data signals at high speed, while the control signals and address signals are not required to be processed at such a high speed but at a lower speed, compared with the data signals. Thus, the mode indication signal is made of a combination of signals applied at signal terminals at comparatively low speed, i.e., a combination of a control signal and an address signal. The mode register/decoder 415 judges whether or not the control signal has instructed a mode register to be set, followed by judging a specific process from the value of the address signal.

Figure 54:
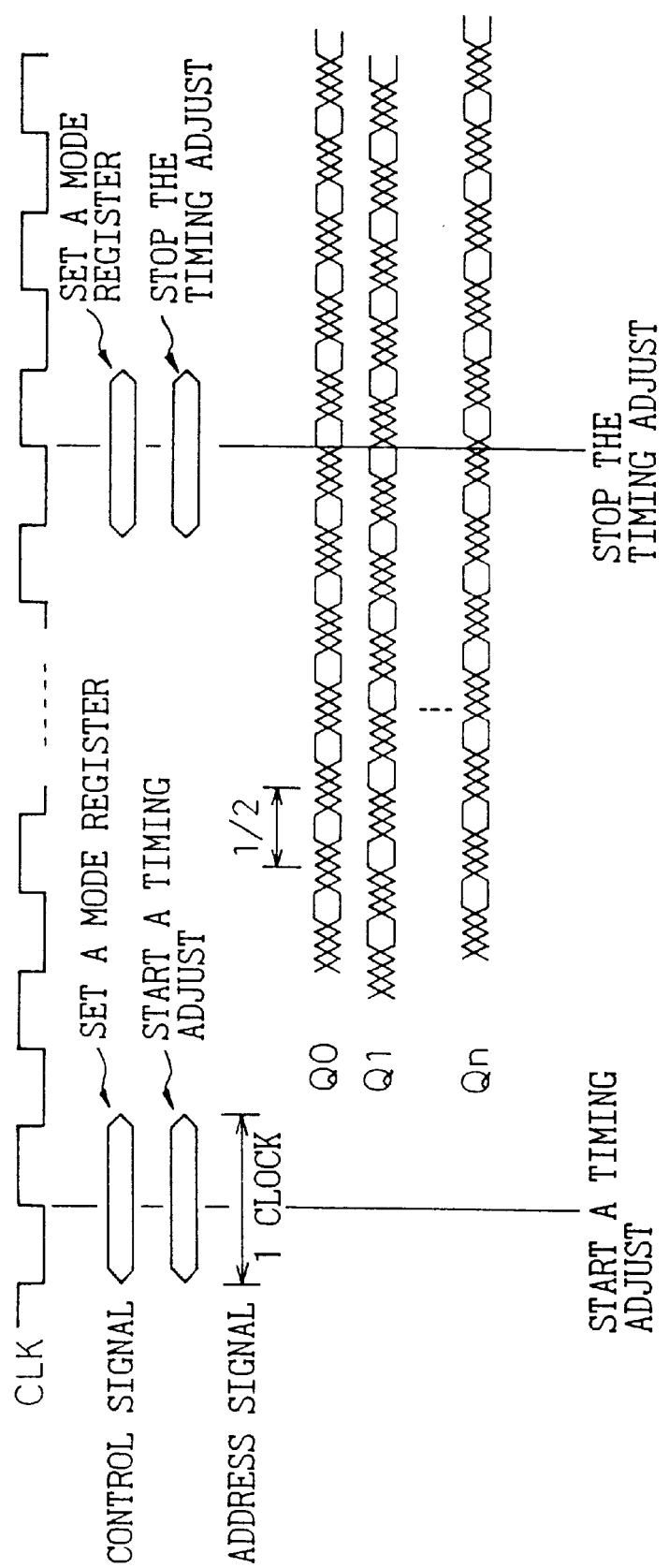
FIG. 54 is a diagram showing the switching of the operation mode according to the seventh embodiment.

FIG. 54 is a diagram for explaining the judgement of the operation mode and the input timing adjust mode according to the seventh embodiment. As shown in FIG. 54, the mode register/decoder 415, upon receipt of an instruction to set the mode register from the control signal, detects that the process is for matching the input timing by the address signal, and starts the process of adjusting the input timing as described above. After the control signal instructs the mode register to be set and the address signal gives an instruction to terminate the process of matching the input timing, then the timing adjustment is terminated and the adjustment value at that particular point is maintained.

Figure 55:
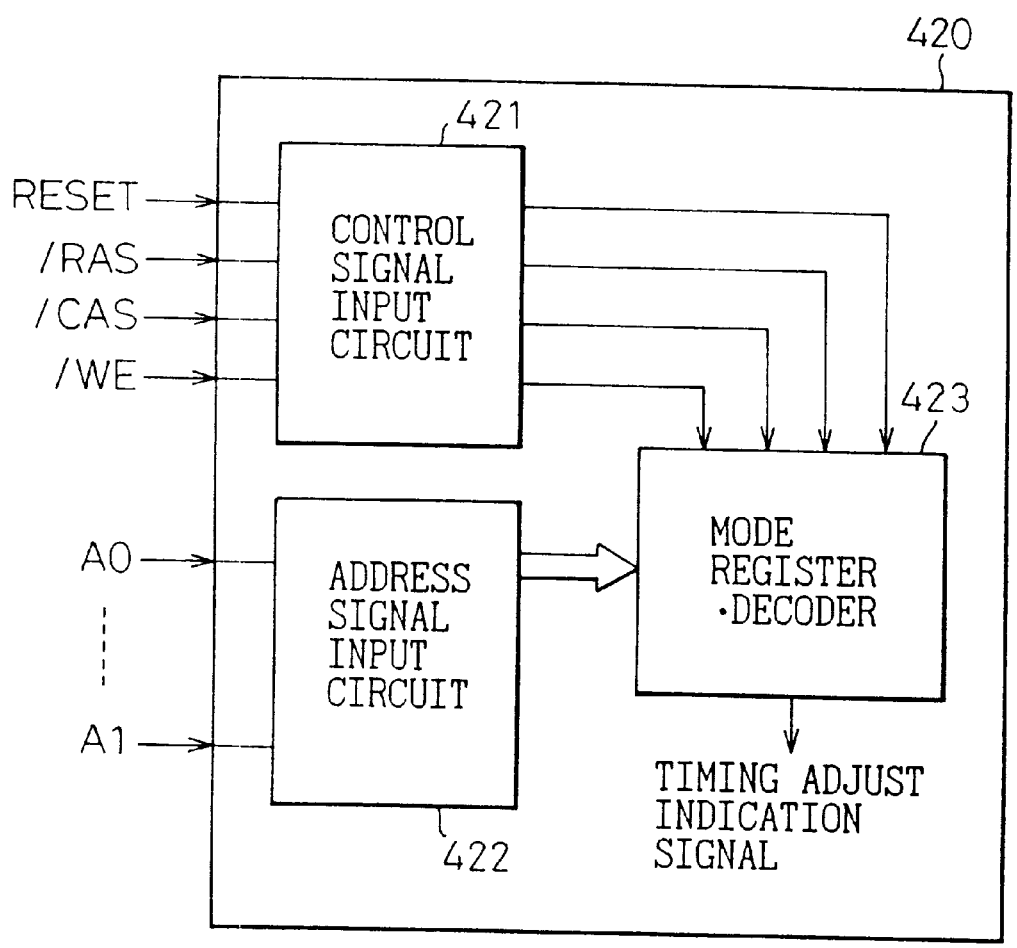
FIG. 55 is a diagram showing a modification comprising a signal terminal for indicating the timing adjustment.

FIG. 55 is a diagram showing a modification including another signal input terminal for indicating the input timing adjust mode. Upon application of a reset signal thereto, the interior of the SDRAM is reset and the input timing adjust mode starts anew.

Figure 56:
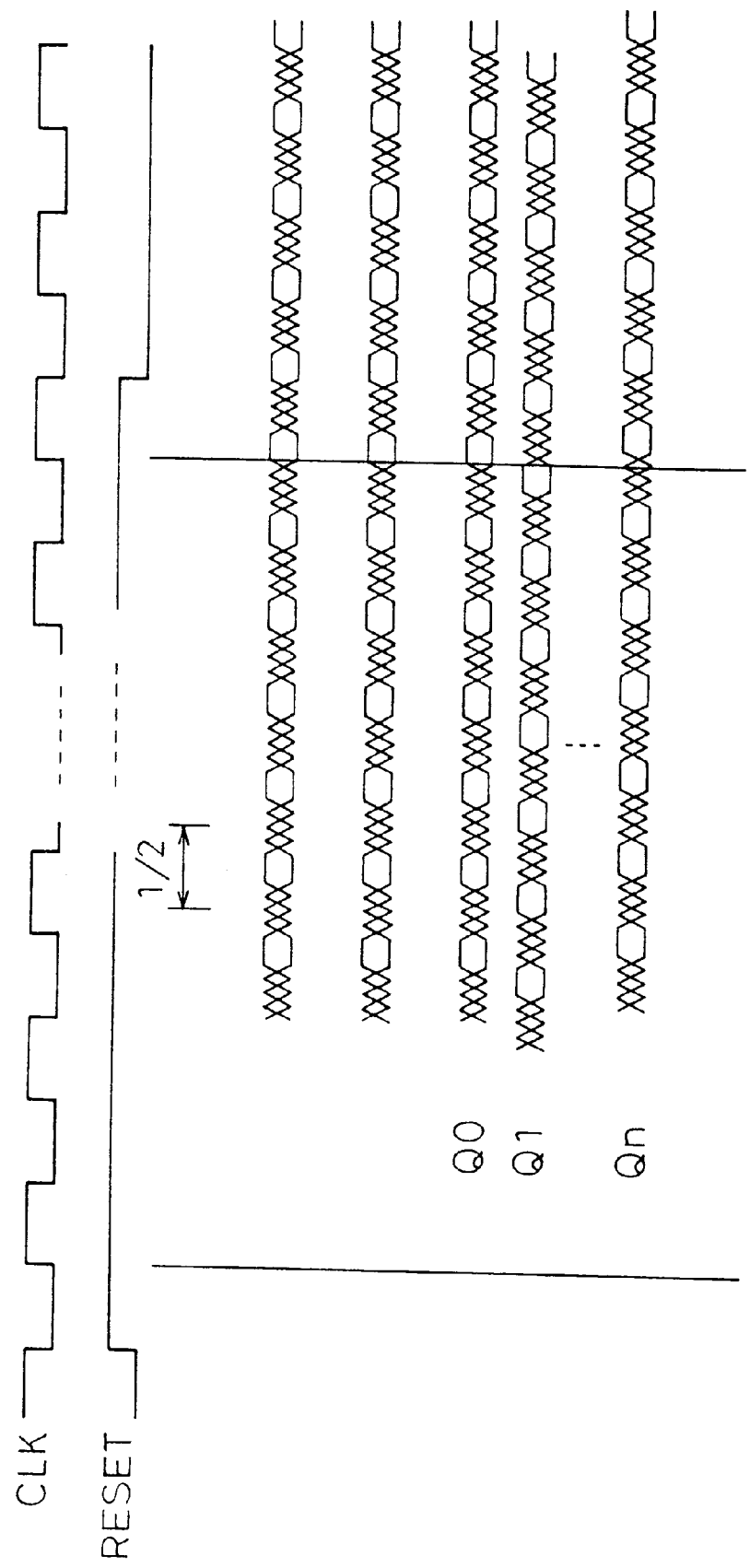
FIG. 56 is a diagram showing the switching of the operation mode according to a modification.

FIG. 56 is a diagram for explaining the operation mode judgement and the input timing adjust mode according to this modification. This diagram is the same as FIG. 54 except that the instruction for the input timing adjust mode is given by the reset signal.

Figure 57:
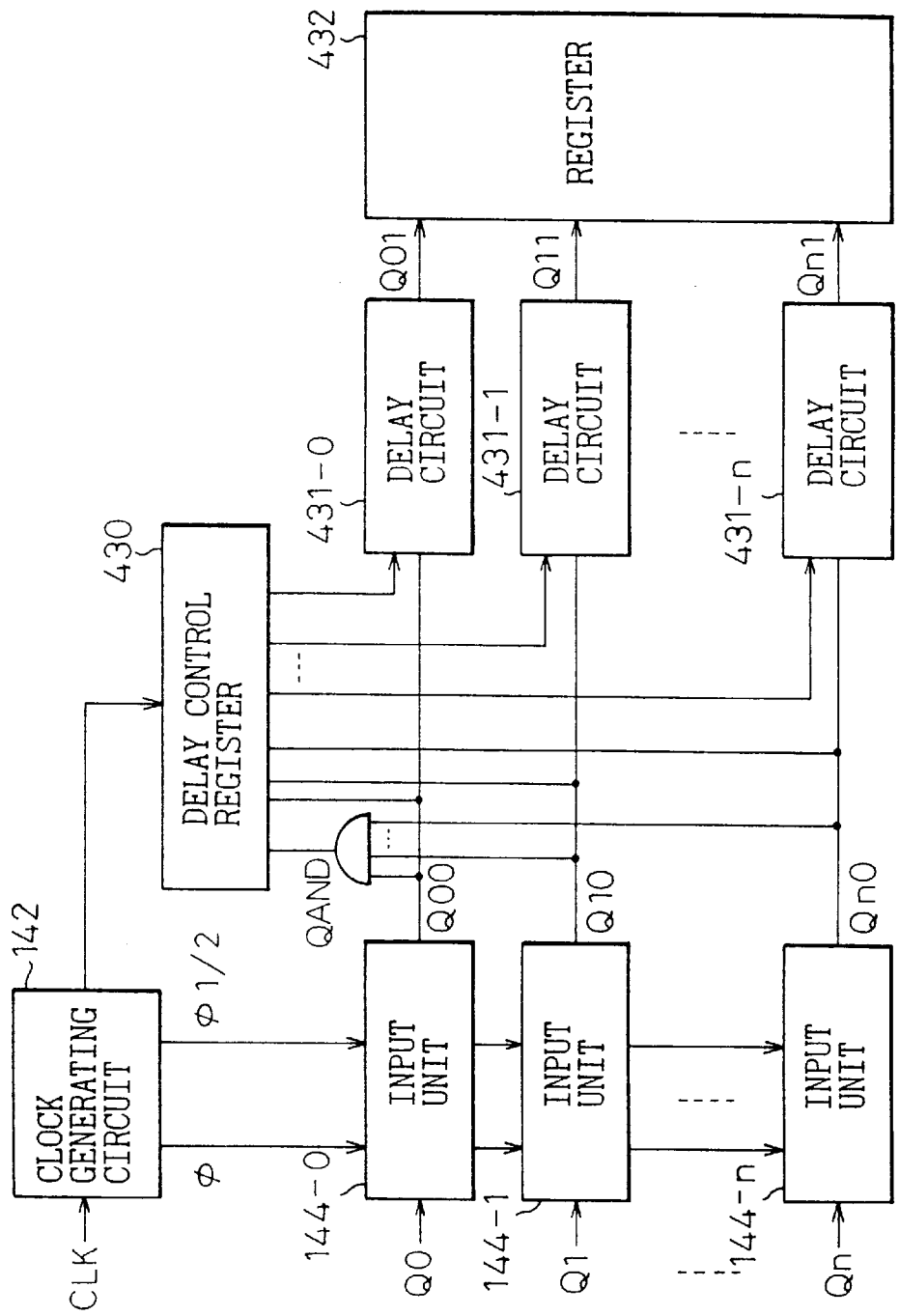
FIG. 57 is a diagram showing a configuration of a semiconductor device at the receiving end according to an eighth embodiment of the invention.

FIG. 57 is a diagram showing a configuration of a semiconductor device according to an eighth embodiment. This embodiment is different from the seventh embodiment in that the latch circuits 405-0, 405-1, ..., 405-n are replaced by delay circuits 431-0, 431-1, 431-n, and a delay control register 430 is further included accordingly. Also, the delay circuit 402 and the delay control circuit 403 of the seventh embodiment are also removed from this embodiment, and the internal circuit is shown to include a register 432 for receiving these signals. The delay control register 430 is supplied with the outputs Q00, Q10, ..., Qn0 of the input circuits as well as the output QAND. The delay control register 430 sets the delay amount at the delay circuits 431-0, 431-1, ..., 431-n in conformance with the most delayed one of the outputs Q00, Q10, ..., Qn0. For this purpose, the delay control register 430 calculates the exclusive OR of QAND and Q00, Q10, ..., Qn0 thereby to calculate and store the delay amounts of Q00, Q10, ..., Qn0. On the basis of the values thus stored, the delay amount is set for the delay circuits 431-0, 431-1, ..., 431-n.

The receiving timing of the input signal is adjusted in adjust mode, and after completion of the adjust mode, the adjusted value is maintained. A mode register/decoder is provided for recognizing the adjust mode by a mode indication signal applied thereto from an external source. During this receiving timing adjust mode, a signal having a predetermined signal pattern is output from the driving-end semiconductor device. This pattern, for example, assumes a different logic value only during a specific one of the cycles when the logic value remains the same.

The data signal is required to be input to and output from the SDRAM at high speed, while the other signals including control signals and address signals can be input or output with a lower speed than the data signals. In view of this, a mode indication signal can be produced by combining the signals input to signal terminals at comparatively low speed, i.e., by combining the values of the input signals having a long period. Also, a dedicated input signal terminal may be provided for applying the mode indication signal. The mode indication signal can be a reset signal, for example. An arrangement can thus be made in which upon receipt of a reset signal, the adjust mode is entered automatically for a predetermined length of time. In such a case, the input signal of a predetermined signal pattern desirably continues to be applied during a predetermined length of time after an instruction is given to terminate the receiving timing adjust mode.

Figure 58:
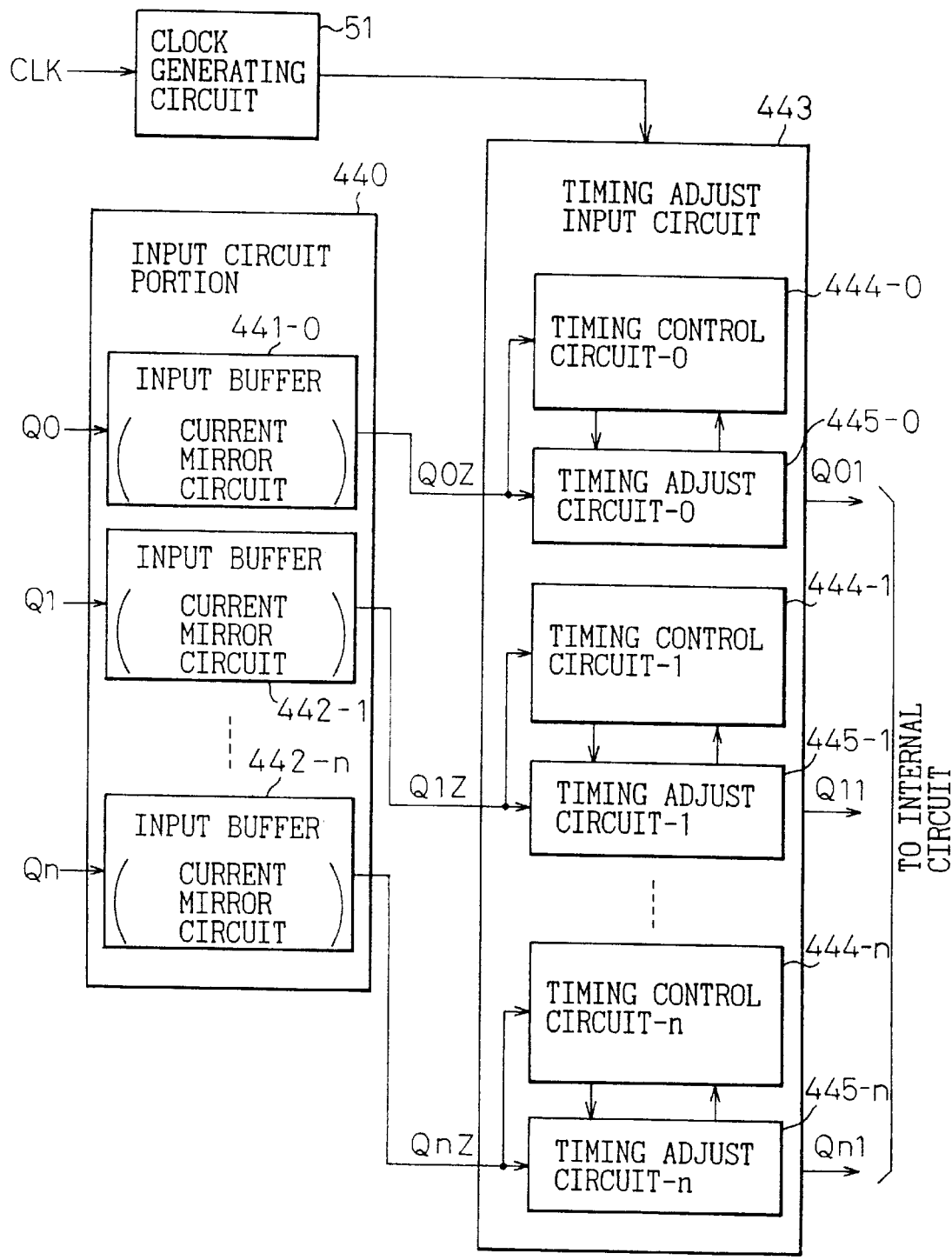
FIG. 58 is a diagram showing a basic configuration of a semiconductor device at the receiving end according to a ninth embodiment of the invention.

FIG. 58 is a diagram showing a basic configuration of a semiconductor device according to a ninth embodiment of the invention. As shown in FIG. 58, the semiconductor device according to the ninth embodiment of the invention includes an input circuit section having a plurality of input buffers 441-0, 441-1, . . . , 441-n such as current mirror circuits, and also a timing adjust input circuit 443 for retrieving the output of each input buffer with the delay amount thereof adjusted in such a manner as to enable the output of each input buffer to retrieve a predetermined internal clock optimally. The timing adjust input circuit 443 includes each of timing adjusting circuits 445-0, 445-1, . . . , 445-n for adjusting the input signal timing, and each of timing control circuits 444-0, 444-1, . . . , 444-n as a combination, respectively, for each input signal. This combination specifically includes a delay circuit with a selectable delay amount for delaying the outputs of the input buffer circuits 441-0, 441-1, . . . , 441-n, a signal input circuit for retrieving the outputs of the input buffer circuits in synchronism with an internal clock, a phase judge circuit for judging the phase of the outputs of the input buffer circuits with respect to the internal clock, and a delay control circuit for controlling the delay amount of the delay circuit to assure a predetermined phase of the outputs of the input buffer circuits with respect to the internal clock on the basis of the judgement at the phase judge circuit.

Figure 59:
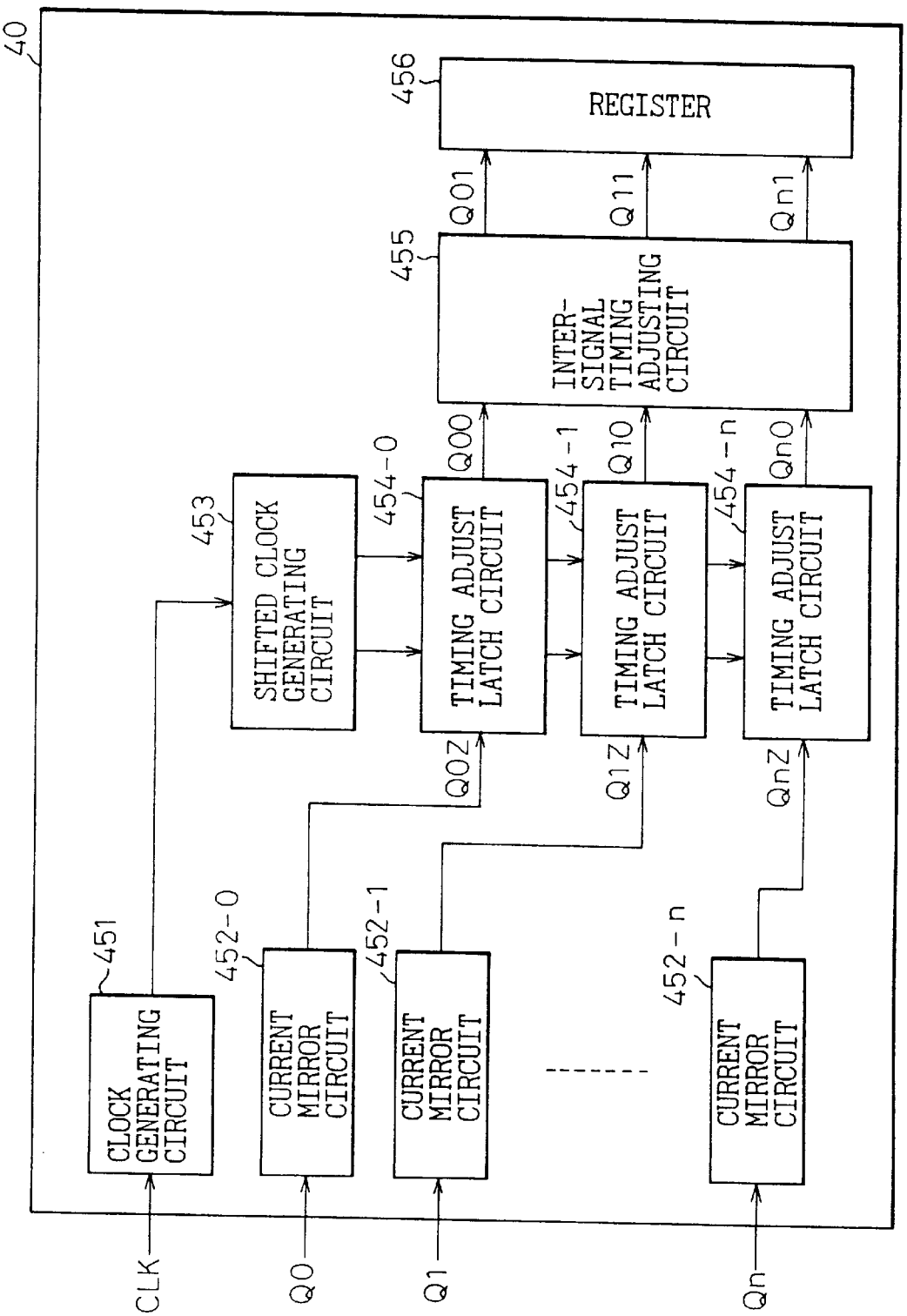
FIG. 59 is a diagram showing a configuration of a semiconductor device at the receiving end according to the ninth embodiment.

FIG. 59 is a diagram showing a configuration of a semiconductor device according to a ninth embodiment. This embodiment is different from the seventh embodiment in that the present embodiment includes an inter-signal timing adjusting circuit 455 arranged in the vicinity of the register 456 for receiving an input signal in the internal circuit, that timing adjusting latch circuits 454-0, 454-1, . . . , 454-n and a shift clock generating circuit 453 are arranged in the vicinity of the inter-signal timing adjusting circuit 455, and that the input section includes only current mirror circuits 452-0, 452-1, . . . , 452-n. Even when the inter-signal timing adjusting circuit 455 adjusts the signals in phase with each other, a phase difference may develop between the inter-signal timing adjusting circuit 455 and the register 456 if the distance therebetween is long. For this reason, the inter-signal timing adjusting circuit 455 is preferably arranged in the vicinity of the register 456. The input circuit for retrieving the input signal is also preferably arranged in the same vicinity. For this purpose, according to the ninth embodiment, the input circuit of the seventh embodiment is divided into a current mirror circuit and a timing latch circuit for adjusting and latching the input timing. The current mirror circuits 452-0, 452-1, . . . , 442-n are arranged in the vicinity of signal terminals, and the timing latch circuits 454-0, 454-1, . . . , 454-n are arranged in the vicinity of the inter-signal timing adjusting circuit 455. Accordingly, the shift clock generating circuit 453 is also desirably arranged in the vicinity of the timing latch circuits 454-0, 454-1, . . . , 454-n.

Figure 60:
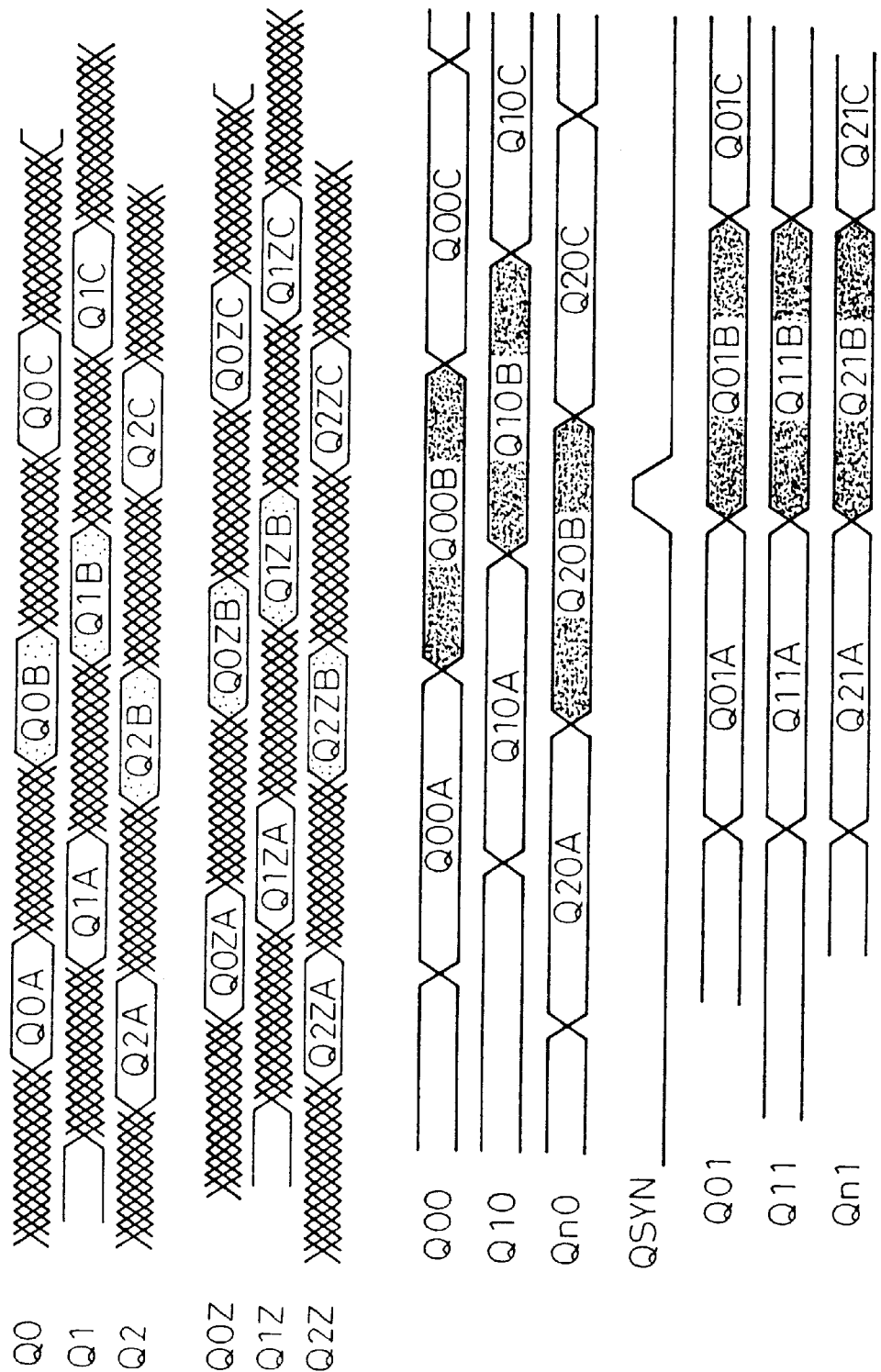
FIG. 60 is a diagram showing the operation of input timing adjustment according to the ninth embodiment.

FIG. 60 is a diagram for explaining the input timing adjustment according to the ninth embodiment. The operation of this embodiment is different from that of the seventh embodiment shown in FIG. 52 only in that the input signals are sent to the internal timing latch circuits 454-0, 454-1, . . . , 454-n in an unstable state.

Figure 61:
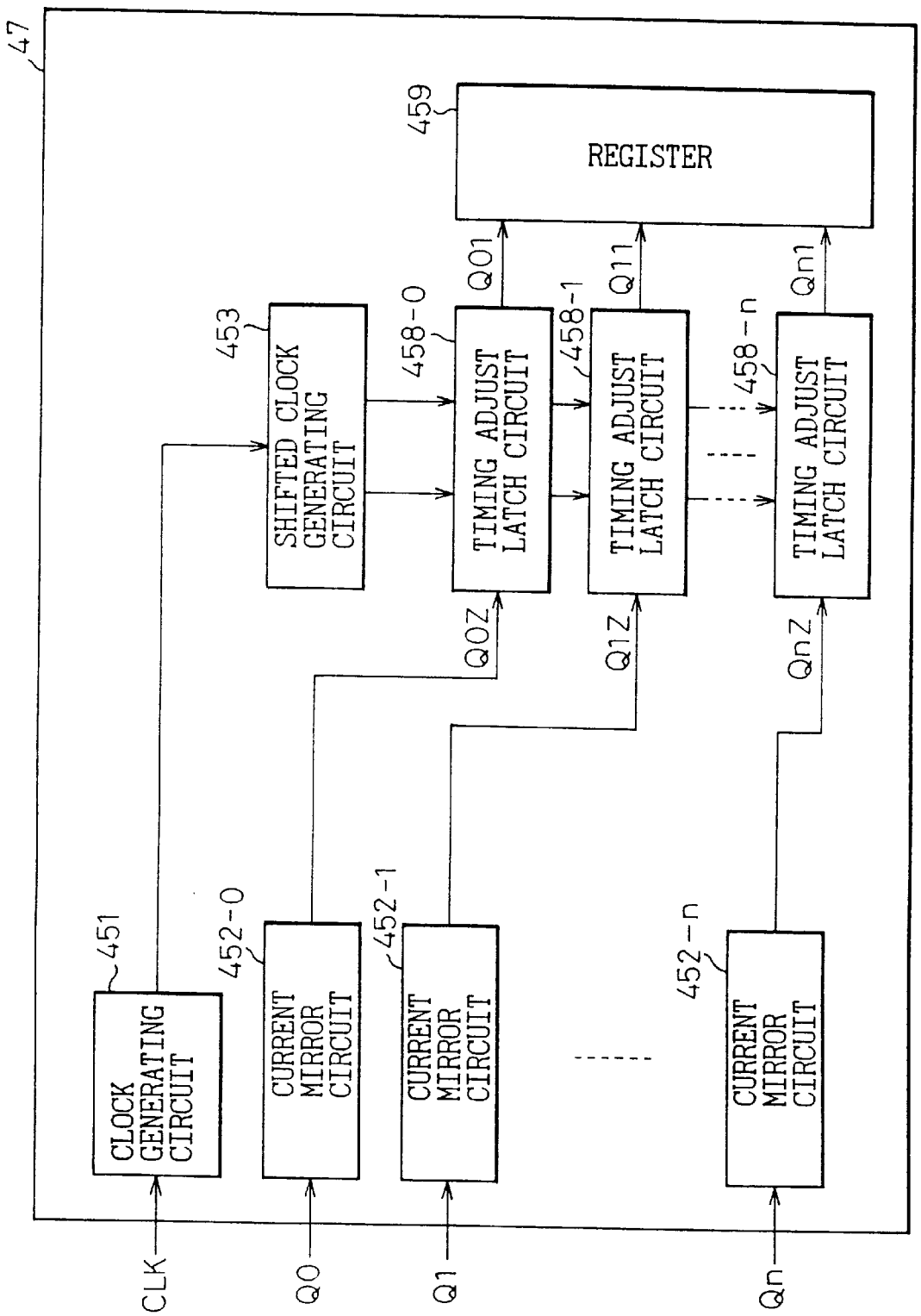
FIG. 61 is a diagram showing a configuration of a semiconductor device at the receiving end according to a tenth embodiment of the invention.

FIG. 61 is a diagram showing a configuration of a semiconductor device according to a tenth embodiment. According to this embodiment, as in the ninth embodiment, current mirror circuits 452-0, 452-1, . . . , 452-n are arranged in the vicinity of the input signal terminals, but the timing adjusting latch circuits 454-0, 454-1, . . . , 454-n and the inter-signal timing adjusting circuit 455 are replaced by timing adjusting latch circuits 458-0, 458-1, . . . , 458-n.

Figure 62:
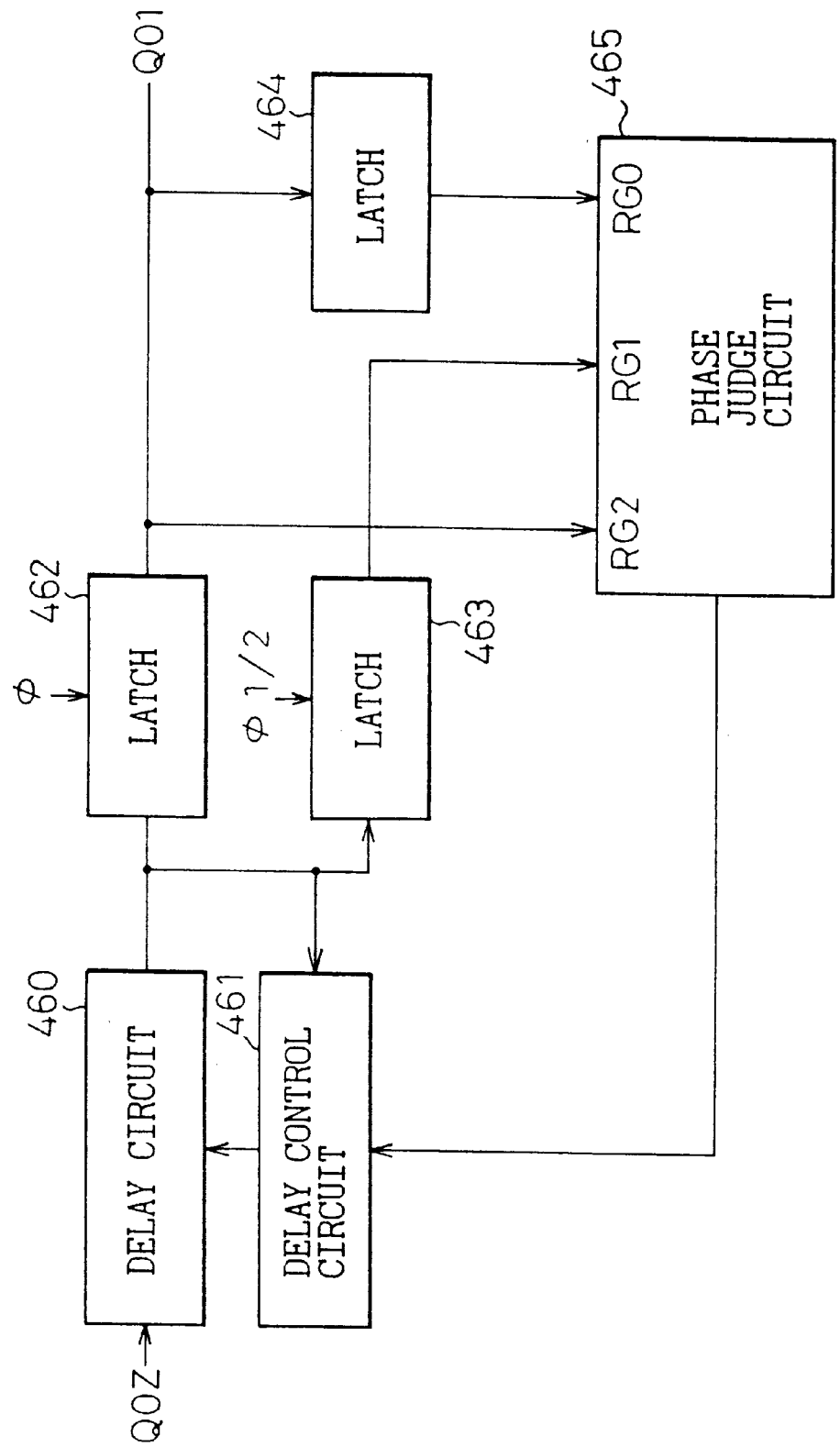
FIG. 62 is a diagram showing a configuration of a timing adjustment delay circuit according to the tenth embodiment of the invention.

FIG. 62 is a diagram showing a configuration of the timing adjusting latch circuits 458-0, 458-1, . . . , 458-n. These timing adjusting latch circuits are not for delaying the clock but are adapted to adjusting the delay amount of the input signal-to match the phase of the input signals Q0Z, Q1Z, . . . , Q2Z with the phase of the clock Q and the clock $\phi 1/2$ produced from the shift clock generating circuit 453. The delay circuit 460, the delay control circuit 461, the latch circuits 462, 463, 464 and the phase judge circuit 465 are similar to those shown in FIG. 32, respectively, and will not be described in more detail.

Figure 63:
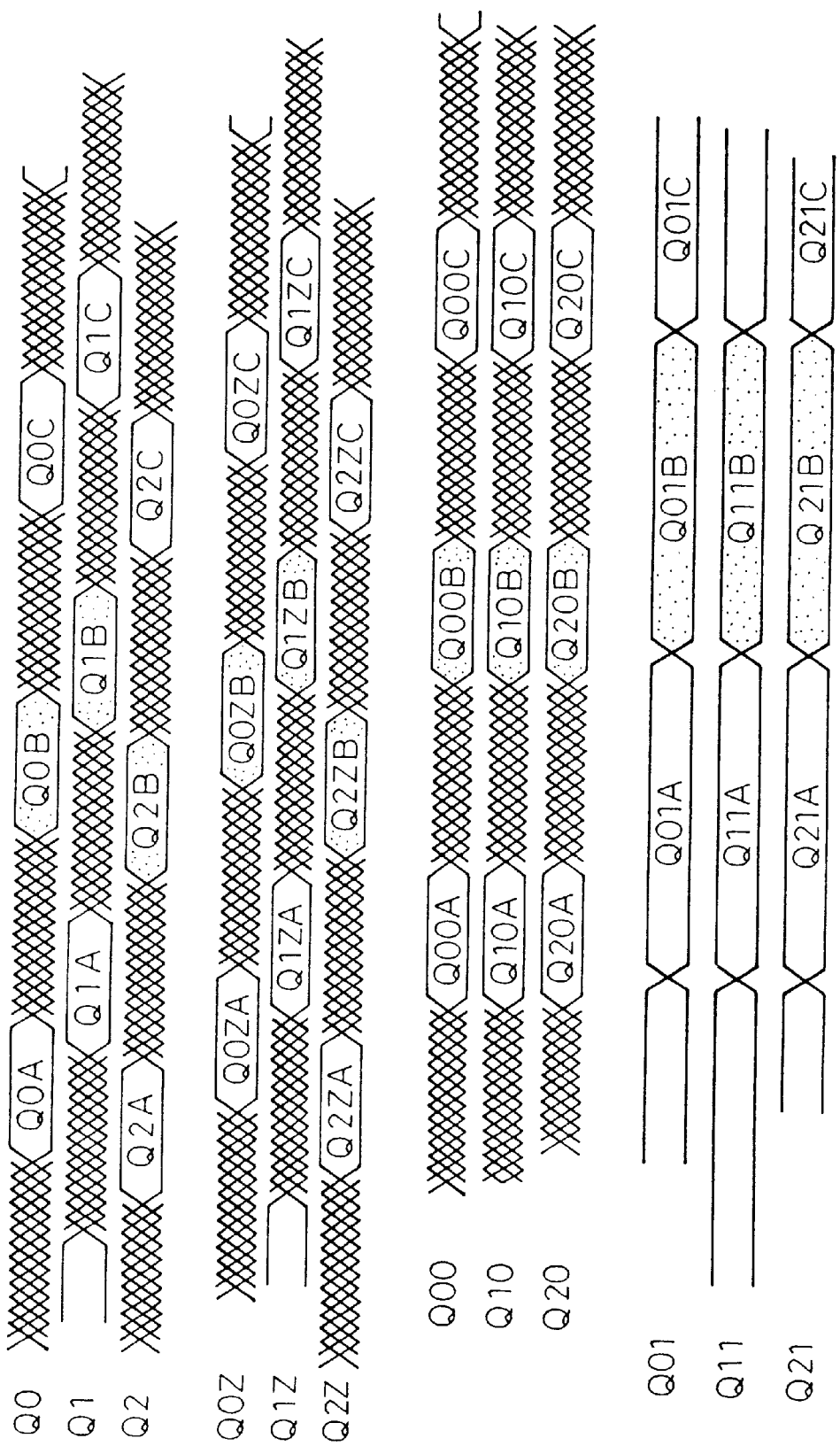
FIG. 63 is a diagram showing the operation of input timing adjustment according to the tenth embodiment.

FIG. 63 is a diagram showing the timing adjusting operation according to the tenth embodiment. Characters Q0, Q1, Q2 designate input signals applied to current mirror circuits 452-0, 452-1, . . . , 452-n, respectively, characters Q0Z, Q1Z, Q2Z input signals to the timing adjusting latch circuits 454-0, 454-1, . . . , 454-n, respectively, characters Q00, Q10, Q20 the signals set in phase in the timing adjusting latch circuit, and characters Q01, Q11, Q21 outputs from the timing adjusting latch circuits. As shown in FIG. 63, the signals are retrieved by the latch circuit after being set in phase in such a manner as to be optimally retrieved by a predetermined internal clock in the timing adjusting latch circuits 454-0, 454-1, . . . , 454-n. The signals output from the timing adjusting latch circuits, therefore, are in phase with each other. In this way, in the semiconductor device according to the tenth embodiment, the delay amount of the input signals is adjusted in such a manner as to be optimally retrieved by a predetermined internal clock. Even in the case where a plurality of input signals are involved, therefore, this adjustment performed for each input signal can set all the input signals in phase, thereby eliminating the need of any other means for timing adjustment.

Figure 64:
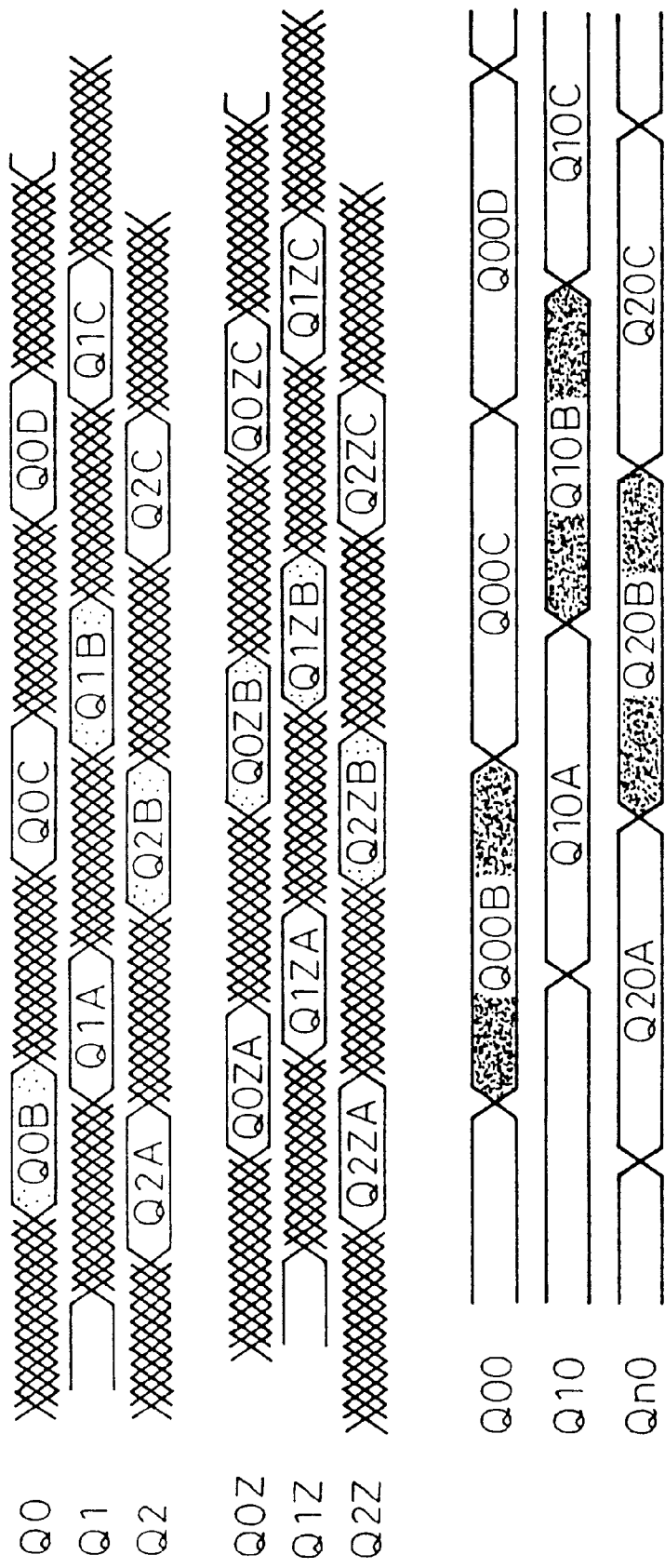
FIG. 64 is a diagram for explaining the problem points of a skew as long as not less than one clock cycle.

FIG. 64 shows the case where the displacement (skew) between input signals is not less than one clock cycle. In this case, as in the seventh embodiment, the outputs Q00, Q10, . . . , Qn0 retrieved by the input circuits as input signals have the portions of the same cycle not interposed on each other. As a result, in the configuration shown in FIG. 47, the QAND never rises to H level and therefore, it is impossible to set the input signals in phase. The 11th embodiment provides a solution to this problem.

Figure 65:
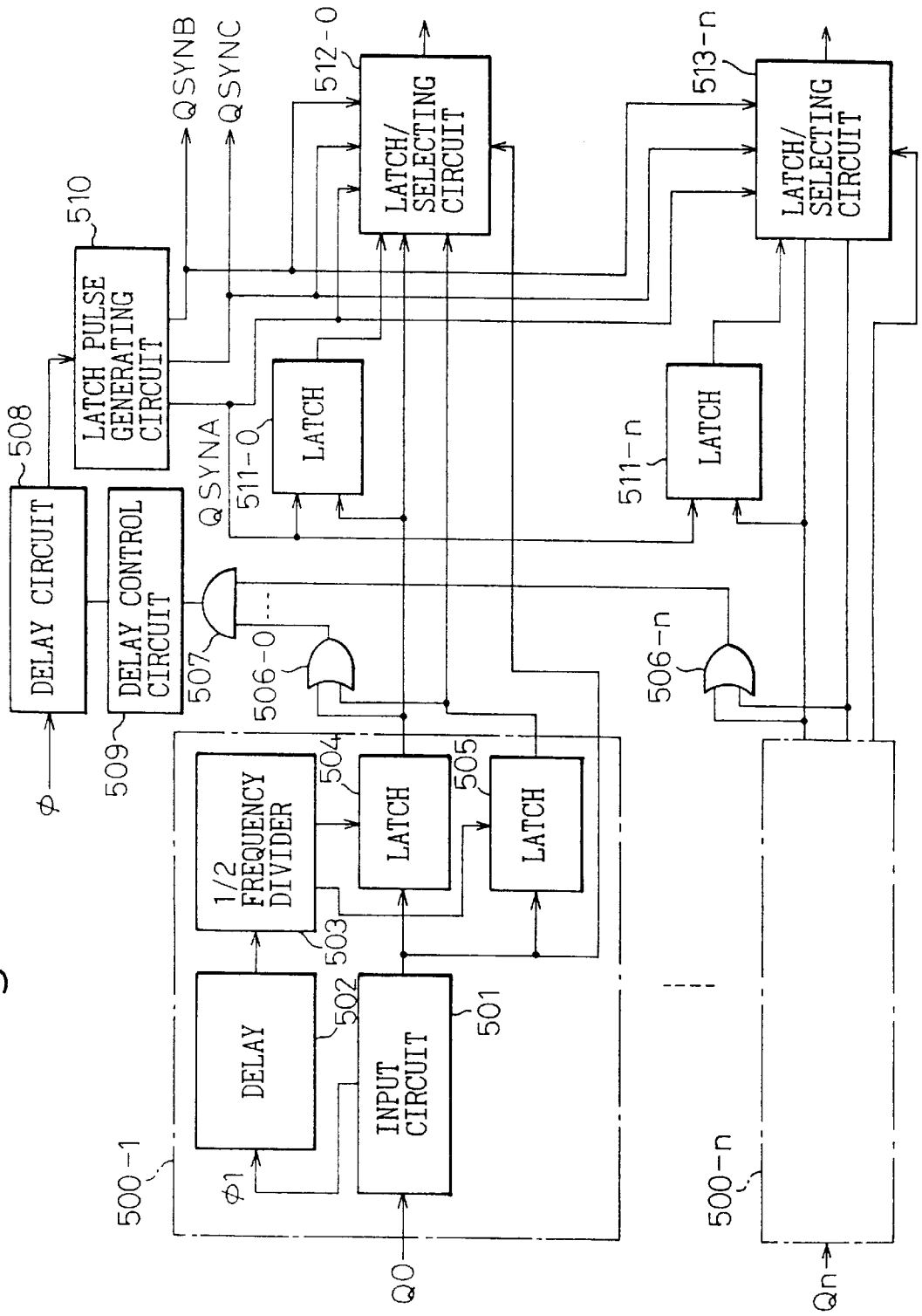
FIG. 65 is a diagram showing a configuration of a semiconductor device at the receiving end according to an 11th embodiment of the invention.

FIG. 65 is a diagram showing a configuration of the 11th embodiment. This embodiment is different from the seventh embodiment in that the input circuit 501 of this embodiment further includes a delay circuit 502, a 1/2 frequency divider circuit 503 and latch circuits 504, 505, and in that outputs QSYNA, QSYNB, QSYNC are produced from the latch pulse generating circuit 510.

Figure 66:
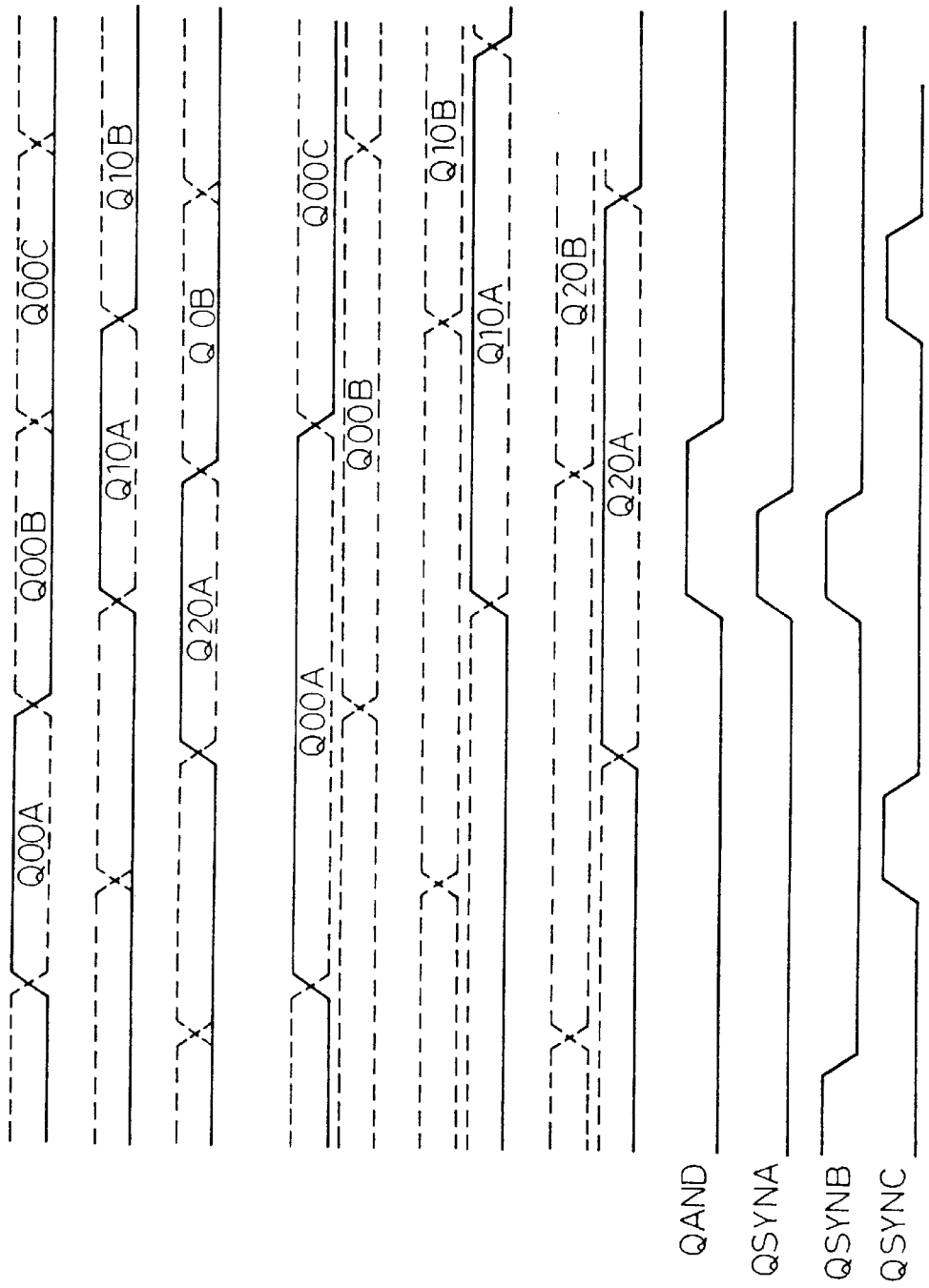
FIG. 66 is a diagram showing the operation of input timing adjustment according to the 11th embodiment.
Figure 67:
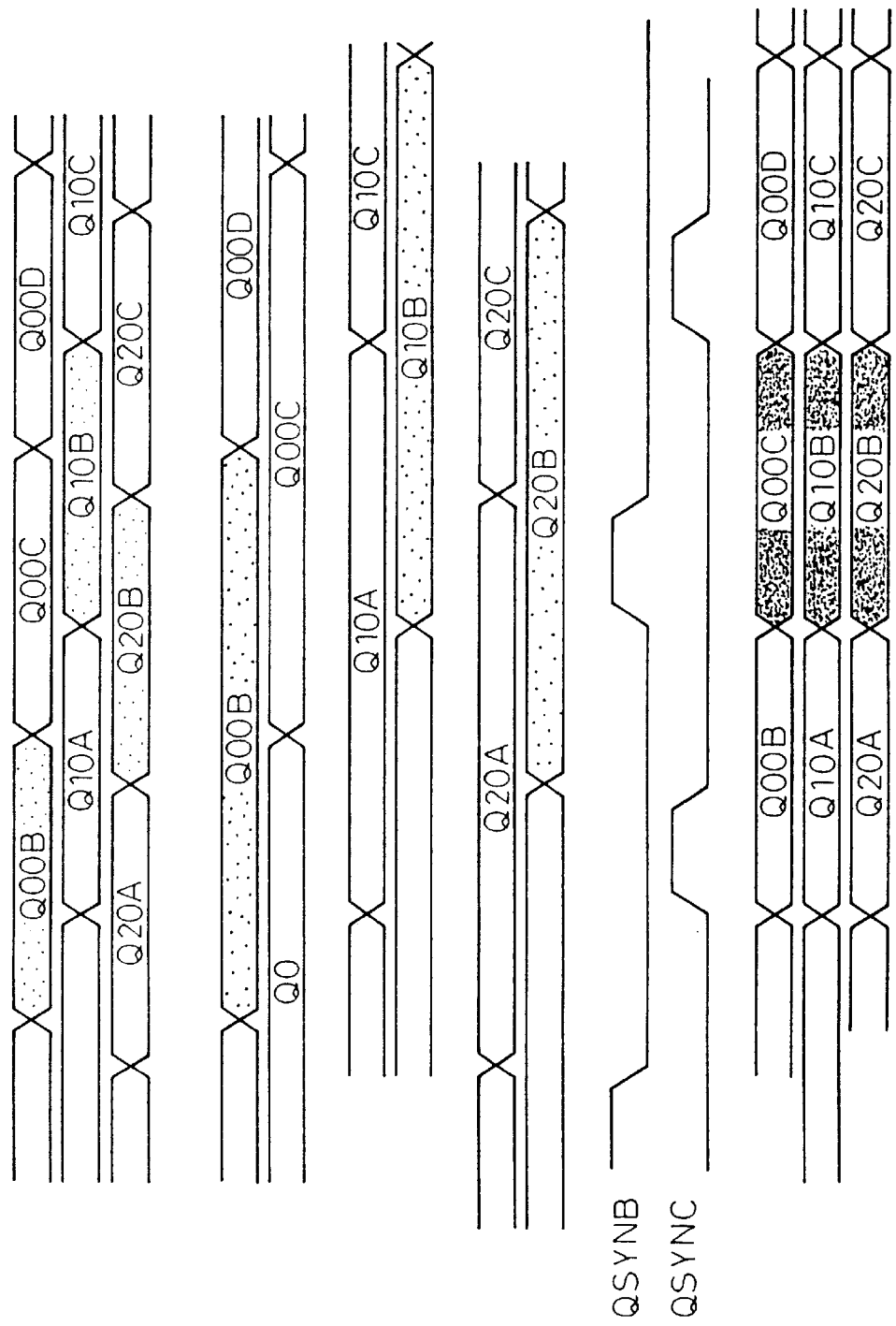
FIG. 67 is a diagram showing the operation of input timing adjustment according to the 11th embodiment.

FIGS. 66 and 67 are diagrams for explaining the operation of the semiconductor device according to an 11th embodiment. The operation of the 11th embodiment will be explained with reference to these diagrams.

The 1/2 frequency divider circuit 503 outputs a 1/2 frequency-divided clock of opposite phase having a half frequency of the clock. In accordance with the 1/2 frequency-divided clock of opposite phase, the latch circuits 504, 505 latch the output of the input circuit 501. The latch circuit 504 thus latches Q00A, and the latch circuit 505 Q00B. The same can be said of the other input signals. After an OR gate 506-0 produces a logic sum of the outputs of the latch circuits 504 and 505, a signal is output which indicates the period during which the signals Q00A and Q00B are at H level. In other words, an input signal widened to three clock cycles is produced. Consequently, when this signal is input to an AND gate 507, the output QAND indicates the period during which the input signal widened to three clock cycles is superposed. In the case where the phase difference between input signals is not more than three clock cycles, QAND turns to H level. After that, as in the first embodiment, QSYNA is generated. The latch circuits 504 and 505 hold the latched input signal over two clock cycles, and the signals output from the latch circuits 504 and 505 are out of phase from each other by one clock cycle. The latch circuit 511-0 performs the operation for holding the signal output from the latch circuit 504 for another one clock cycle. The outputs of the latch circuits 504, 505 and the latch circuit 511-0 are applied to a latch/select circuit 512-0. In accordance with the delay amount of each input signal, therefore, the latch/select circuit 512-0 selects and latches one of them. Characters QSYNB and QSYNC designate latch signals for this operation.

Figure 68:
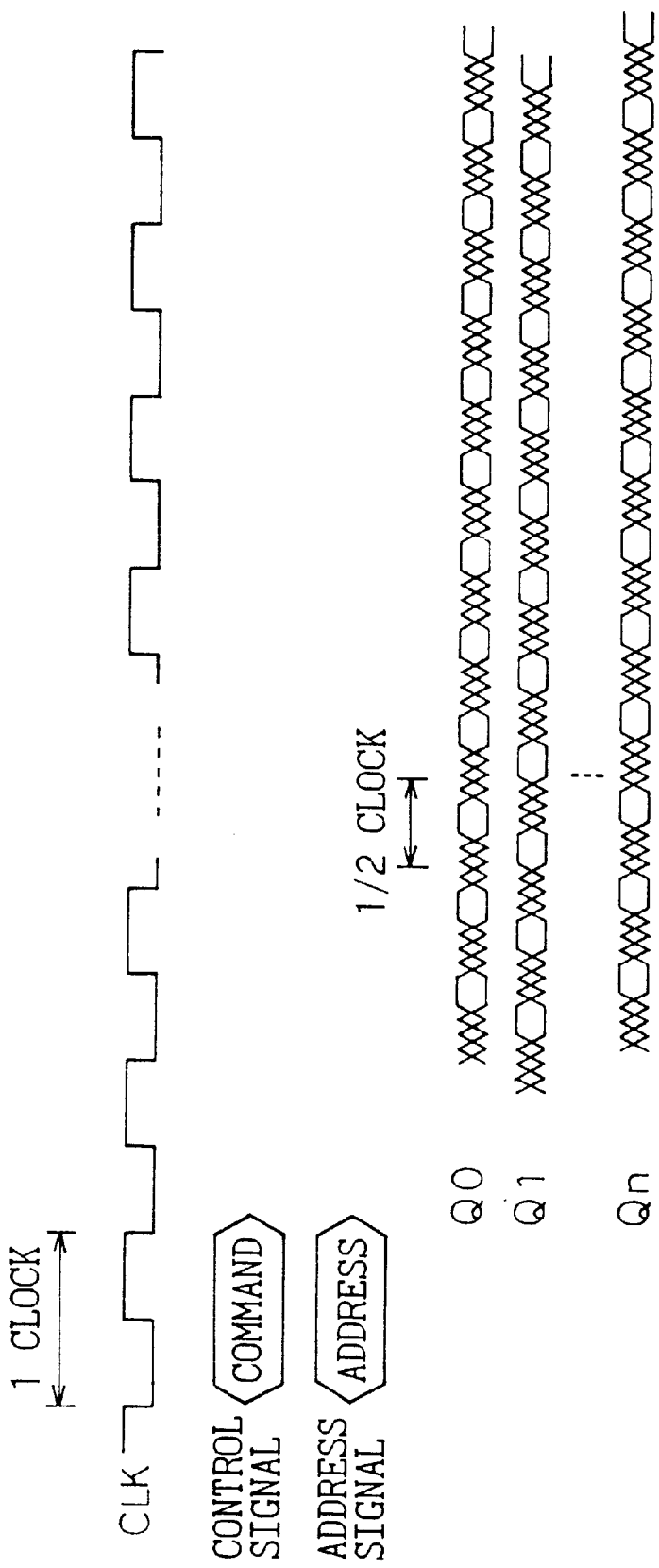
FIG. 68 is a diagram showing an input signal according to a 12th embodiment of the invention.

FIG. 68 is a diagram showing input signals according to a 12th embodiment. In the 12th embodiment, a data signal is input with a frequency twice as high as the clock CLK. Continuous data signals, once retrieved, are converted into parallel signals and processed. According to the 12th embodiment, this conversion is effected using the configuration shown in the 11th embodiment.

Figure 69:
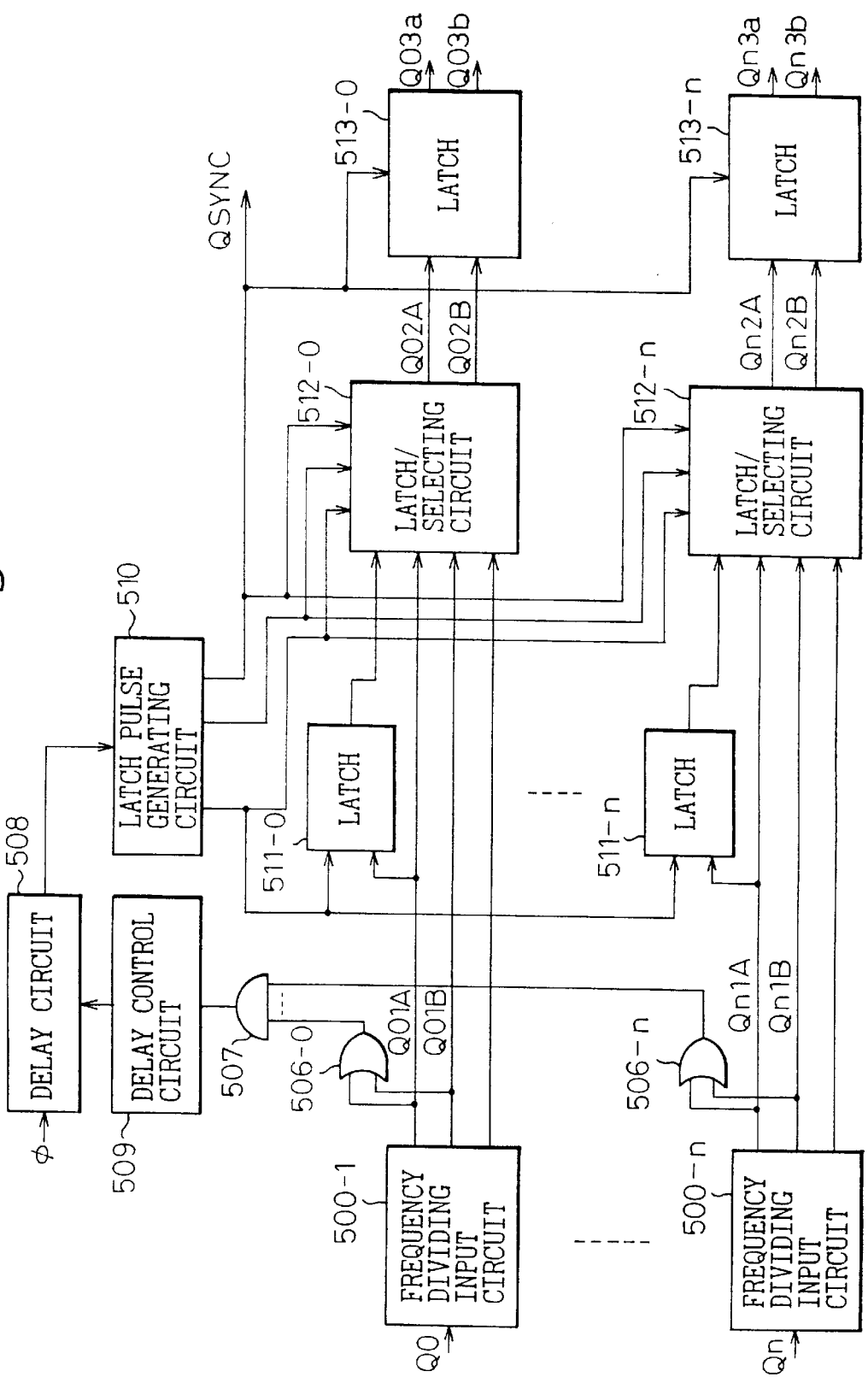
FIG. 69 is a diagram showing a configuration of a semiconductor device at the receiving end according to the 12th embodiment of the invention.

FIG. 69 is a diagram showing a configuration of a semiconductor device according to the 12th embodiment. This embodiment, different from the 11th embodiment, further includes latch/select circuits 512-0, . . . , 512-$n$ for producing two continuous signals and latch circuits 513-0, . . . , 513$n$ for latching the output signals thereof.

Figure 70:
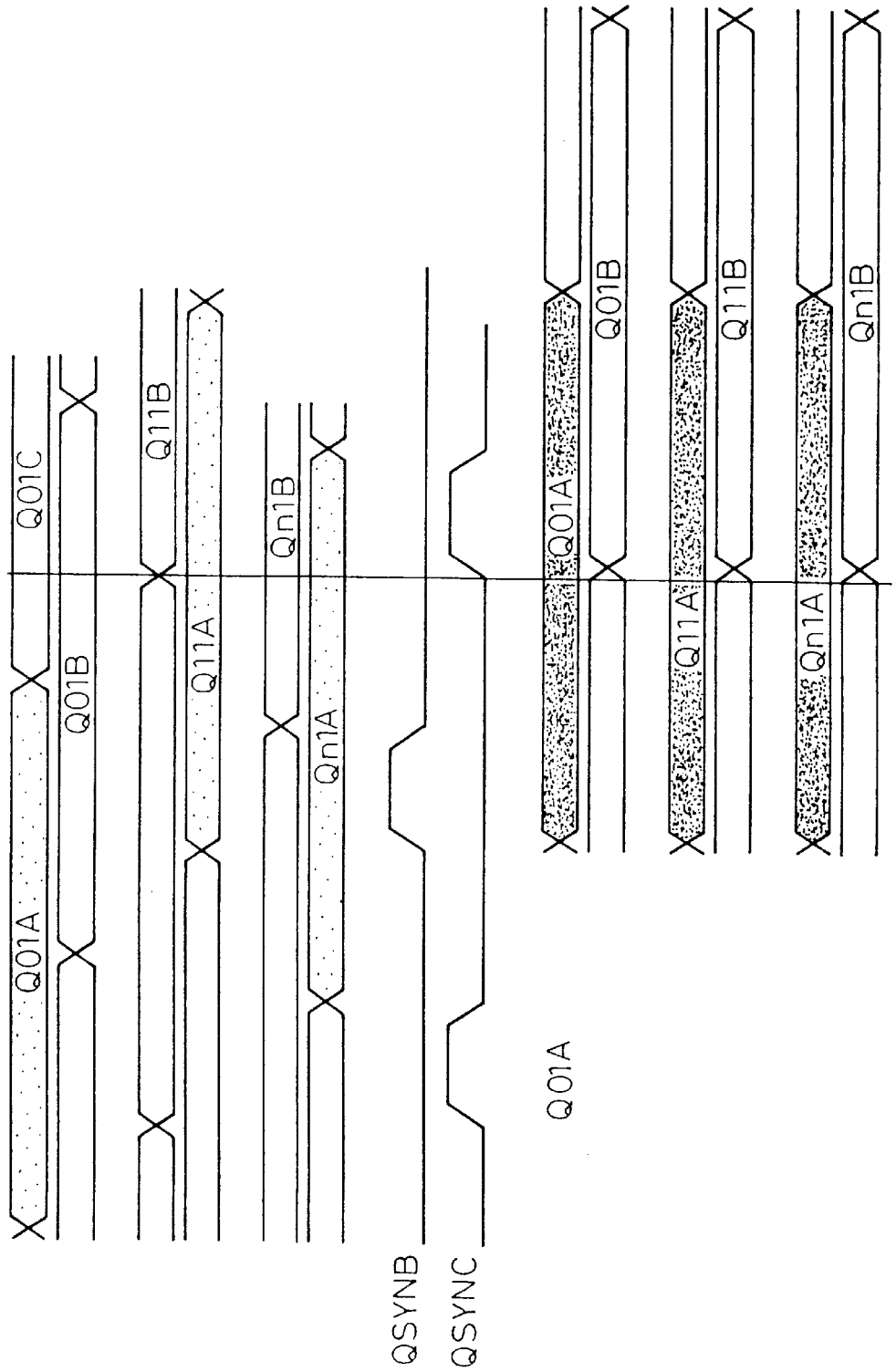
FIG. 70 is a diagram showing the operation of input timing adjustment according to the 12th embodiment.
Figure 71:
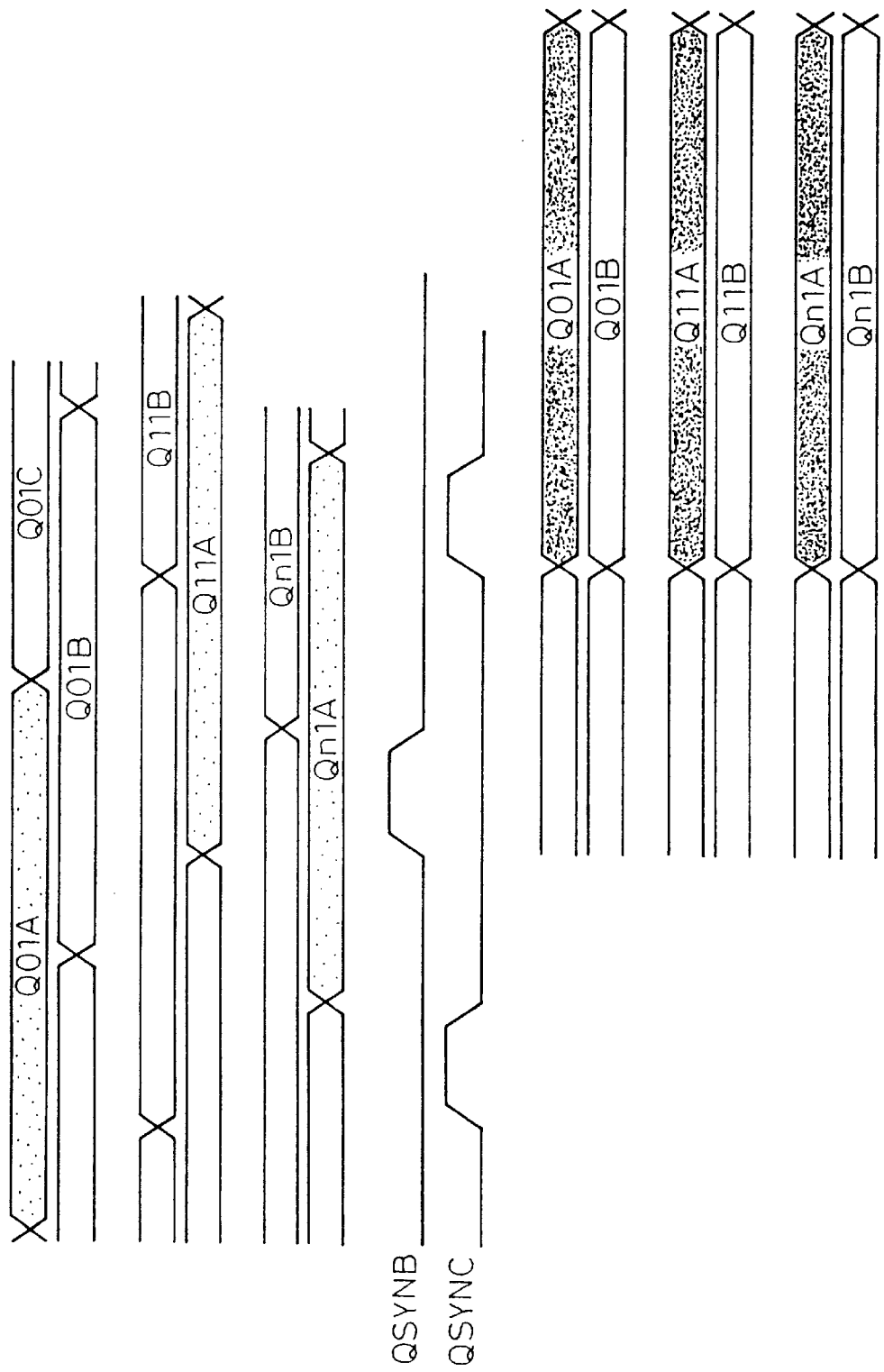
FIG. 71 is a diagram showing the operation of input timing adjustment according to the 12th embodiment.

FIGS. 70 and 71 are diagrams for explaining the operation of a semiconductor device according to the 12th embodiment. The operation of the 12th embodiment will be explained with reference to these diagrams.

The latch circuit 511-1 outputs Q00B delayed from Q01A by one clock cycle. The latch/select circuits 512-0, . . . , 512-$n$ output signals of the same clock cycle in phase with each other. Specifically, the signal Q01B of the next cycle is output behind Q01A by one clock cycle. Nevertheless, Q01A and Q01B are in phase with each other, and so are Q01B and Q11B. These signals are latched by the latch circuits 513-0, . . . , 513-$n$ in synchronism with QSYNC, so that the phases of all the Q02A, Q02B, Q12A, Q12B output from the latch circuits 513-0, . . . , 513-$n$ are coincident with each other. As a result, the signals are converted in parallel.

Figure 72:
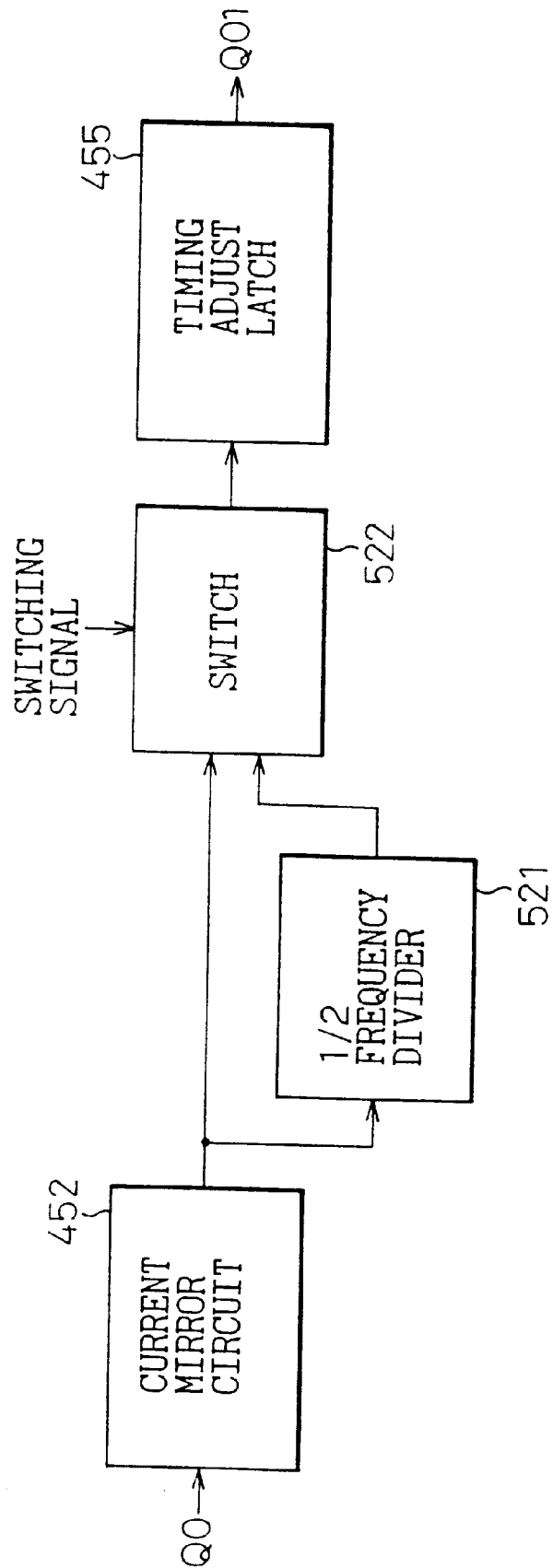
FIG. 72 is a diagram showing a configuration of a semiconductor device at the receiving end according to a 13th embodiment of the invention.

FIG. 72 is a diagram showing a configuration of a 13th embodiment. The 13th embodiment is capable of adjusting the input timing even in the case where the input signal is out of phase by one clock cycle or more in the tenth embodiment. As shown in FIG. 72, the present embodiment includes a 1/2 frequency divider circuit 521 for dividing the frequency of the output signal of the current mirror circuit 452 by one half, and a switching circuit 522 for switching the signal applied to the timing adjusting latch circuit 455 between the output of the current mirror circuit 42 and the output of the 1/2 frequency divider circuit 521. In this case, in the initial stage of the receiving timing adjust mode, the output of the 1/2 frequency divider circuit is switched and applied to the timing adjusting latch circuit 455 by the switching operation. After that, the output of the current mirror circuit 452 is switched to the timing adjusting latch circuit 455. In such a case, in the receiving timing adjust mode, an input signal is applied having a pattern changing at intervals of four clock cycles or more.

In the seventh to 13th embodiments described above, an input signal changing with a predetermined pattern is required for resynchronizing the input signal retrieved with the input timing thereof adjusted. For this purpose, it is necessary to provide the adjust mode and output a signal changing with the above-described pattern from the driving end in adjust mode. The delay amount of a circuit is varied with the temperature and the source voltage. It is necessary, therefore, that an adjust mode is provided regularly to retrieve an input signal at an optimum timing and resynchronize it even under such a change and thereby to resynchronize the signals. It is however desirable that an input signal can be retrieved at an optimum timing by constant feedback control and resynchronized without any adjust mode.

As described above, in the second to sixth embodiments, the feedback adjustment is carried out to retrieve the input signal at an optimum timing without any adjust mode. It is thus possible to retrieve the input signal at an optimum timing and resynchronize it by constant feedback control for any input signal. A 14th embodiment makes possible such an operation. According to the 14th embodiment, taking into account the fact that the input timing signal for each input circuit corresponds to the phase of the signal output from the input circuit, the most delayed input signal is detected using the input timing signal.

Figure 73:
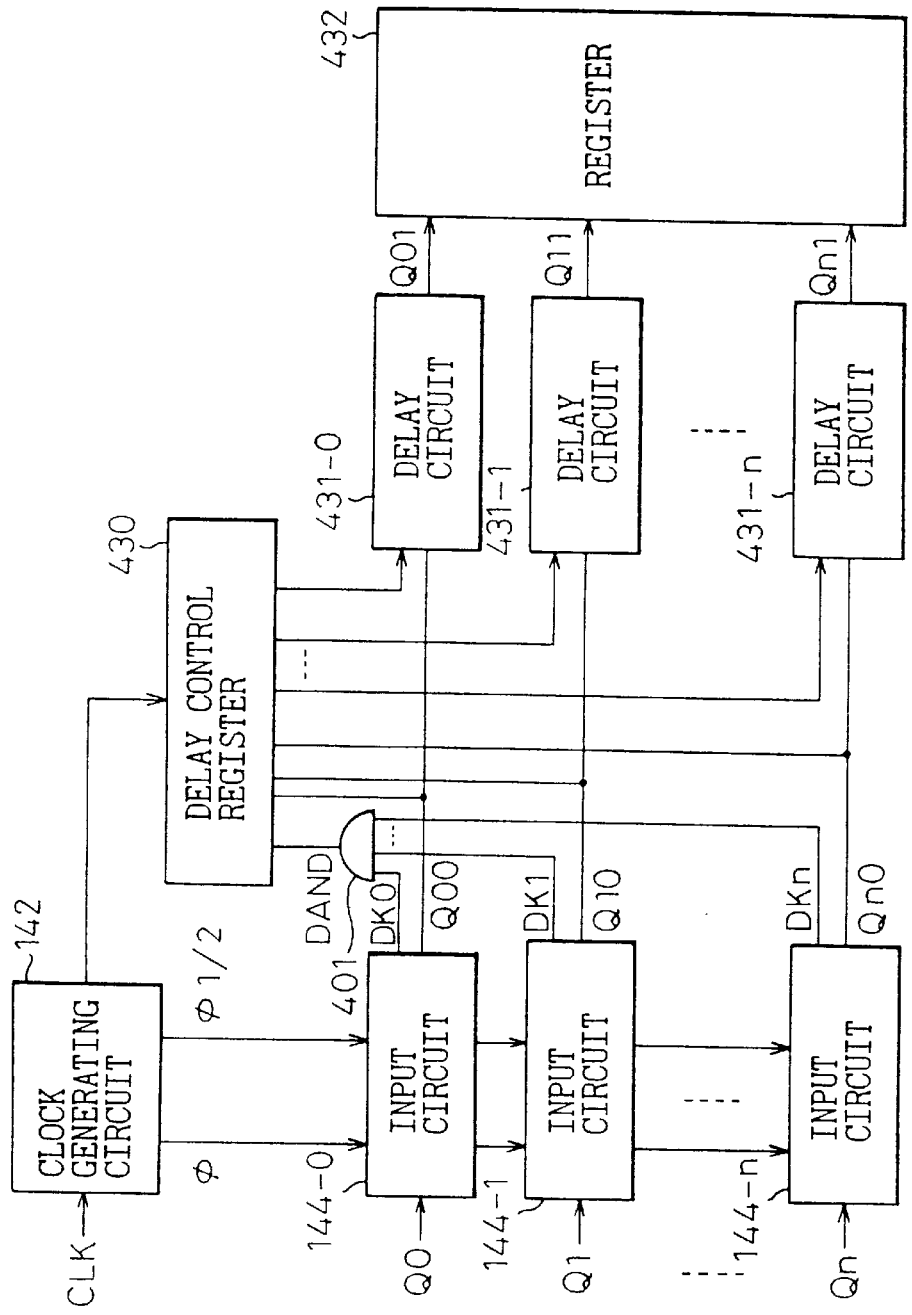
FIG. 73 is a diagram showing a configuration of a semiconductor device at the receiving end according to a 14th embodiment of the invention.
Figure 74:
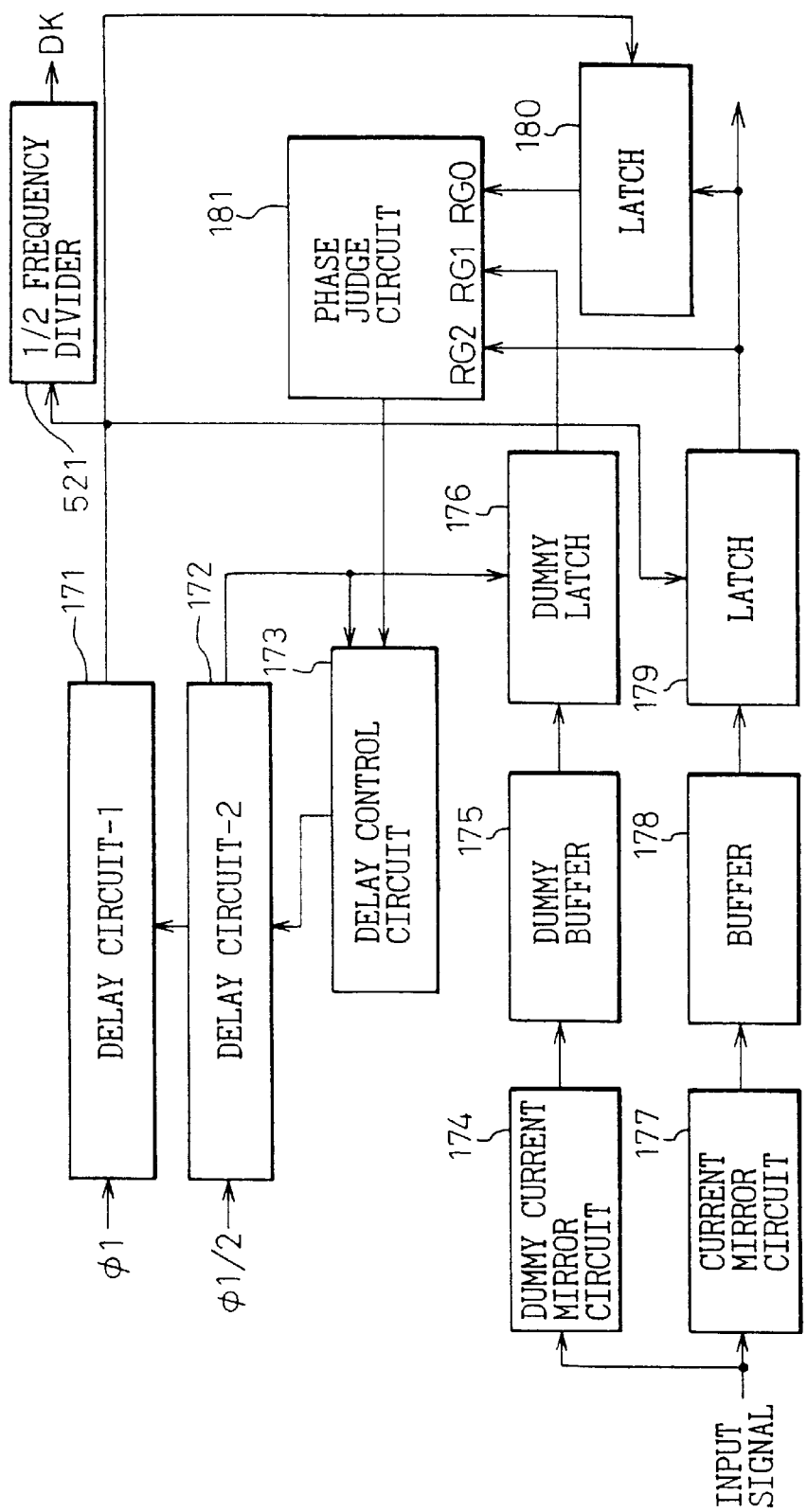
FIG. 74 is a diagram showing a configuration of an input circuit according to the 14th embodiment.

FIG. 73 is a diagram showing a configuration of a receiving-end semiconductor device according to the 14th embodiment. As shown in FIG. 73, the present embodiment is identical to the seventh embodiment shown in FIG. 47 except that signals DK0, . . . , DKn obtained by frequency-dividing the input timing signals are used as the signals input to the AND gate 401. FIG. 74 is a diagram showing a configuration of an input circuit according to the 14th embodiment. As shown, this input circuit is the same as the corresponding circuit shown in FIG. 24 except that a 1/2 frequency-divider circuit 521 is further provided.

Figure 75:
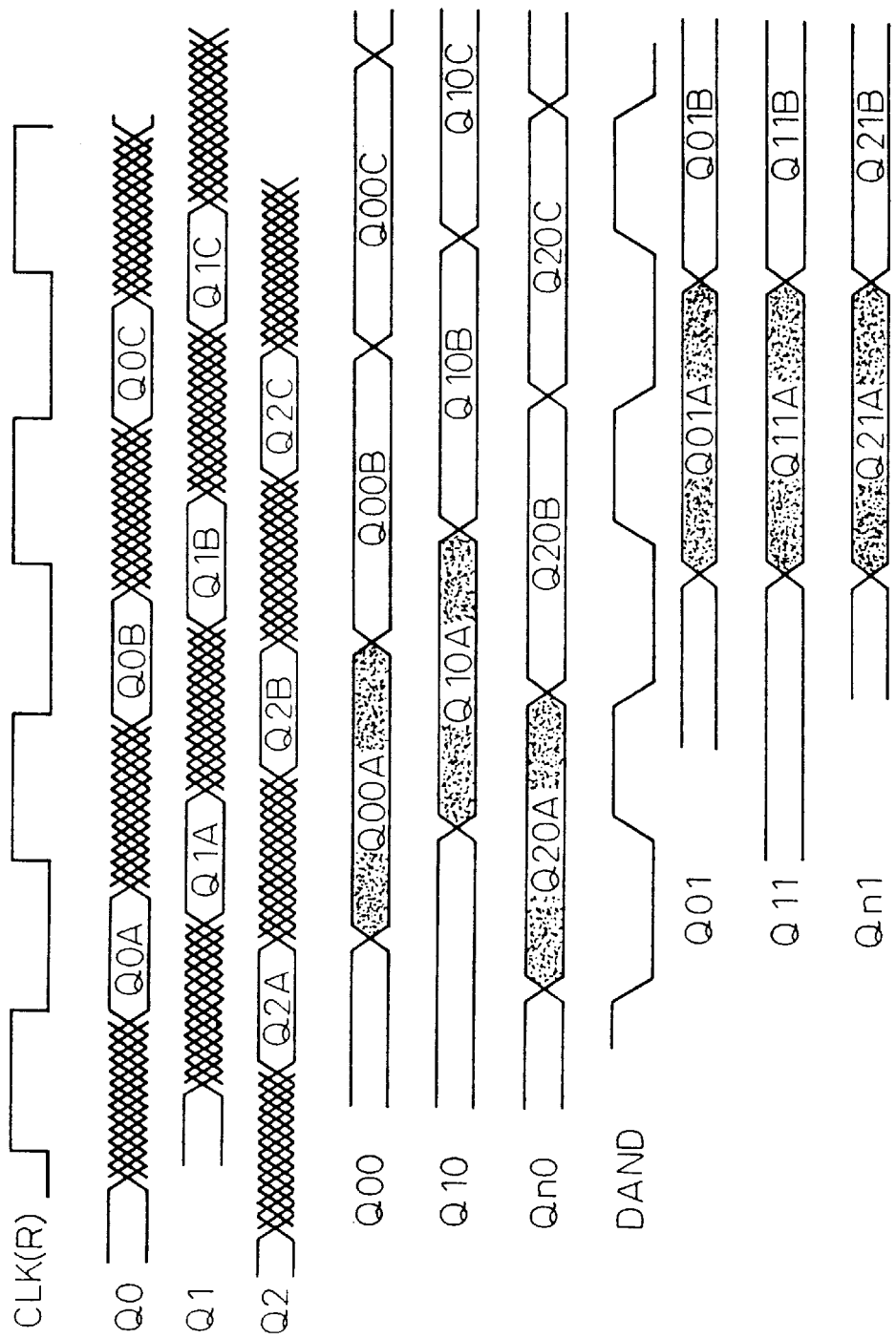
FIG. 75 is a diagram showing the operation of input timing adjustment according to the 14th embodiment.

FIG. 75 is a diagram for explaining the operation of a semiconductor device according to the 14th embodiment. Each input timing signal DCLK has the same period as the clock and rises immediately before the change of the outputs Q00, Q10, . . . , Qn0 of each input circuit. Once the input timing signal DCLK is frequency-divided by the 1/2 frequency divider circuit 521, therefore, signals DK0, . . . , DKn that change substantially the same way as Q00, Q10, . . . , Qn0 are produced. If the signals DK0, DKn are set in phase with each other at the time of powering on for resetting, the signals DK0, . . . , DKn constitute signals changing with a period twice as long as the clock changing at the rising edge of the input timing signal DCLK. As a result, by applying the signals DK0, . . . , DKn to the AND gate 401, the resynchronization is made possible as in the seventh embodiment.

In the case where the input signal retrieved by the input circuit is applied to the internal circuit, an inter-signal timing adjusting circuit is preferably arranged in the vicinity of the internal circuit. Further, the input section is preferably realized by an input buffer such as a current mirror circuit, and the latch circuit and the input timing adjusting circuit can be arranged in the vicinity of the internal circuit.

A plurality of the input timing adjusting circuits are desirably arranged in a cluster to share a delay circuit for adjusting the phase of the clock. As a result, the circuit can be reduced in scale.

In the case where the input signal is out of phase by one clock cycle or more, all the outputs of a plurality of the input circuits are not overlaid one on another, and therefore the logic product thereof is absent. In such a case, therefore, a parallel conversion circuit is provided in the input circuit for converting two continuous input signals into parallel signals after being retrieved into the input circuit and for detecting the period during which these outputs are superposed on each other. The inter-signal timing adjusting circuit is adapted to adjust the outputs having the same cycle of the parallel conversion circuit to be in phase with each other. Further, in the SDRAM, the cycle of the data signal may be shorter than that of the clock so that a plurality of continuous cycles of the input signal may form a combination. In such a case, the continuous input signals are converted into parallel signals using the parallel conversion circuit. At the same time, the inter-signal timing adjusting circuit adjusts the outputs of a set of parallel conversion circuits into phase. As described above, in the seventh to 13th embodiments, even in the case where the received clock and the input signal have a phase difference due to the different transmission times required along different signal routes, the signals are retrieved free of out-of-phase condition. In addition, the retrieved and output signals are not out of phase and therefore an operation error is eliminated.

The receiving-end semiconductor device according to the first to 13th embodiments has an input timing adjusting circuit for each input circuit, as shown in FIG. 8. As a result, even in the presence of a skew between the input signals, each input signal can be retrieved at an optimum timing. Such a semiconductor device, however, requires an input timing adjusting circuit for each input signal, and therefore poses the problem of an increased circuit size. In many semiconductor device systems, the skew between input signals is small in spite of a large skew present between the clock and input signals due to the wiring and loads. A preferable alternative in such a case is to provide an input timing adjusting circuit described above for one representative input signal, while the remaining input signals are retrieved in synchronism with the same input timing signal. By doing so, not only is the circuit scale considerably reduced but the input signals can be retrieved at a substantially optimum timing.

Also, in a semiconductor device system, as shown in FIG. 1, the inter-signal skew is minimized by arranging as parallel as possible the wirings for transmitting signals from the driving-end semiconductor device 11 to the receiving-end semiconductor device 12. The result can be that the skew is reduced to a negligibly small size between the clock and the input signals applied to the terminals of the receiving-end semiconductor device. The internal circuit of the receiving-end semiconductor device operates in synchronism with the internal clock generated from the received clock, and therefore the internal clock is required to be distributed among various internal portions. Further, since each such portion operates in synchronism with the internal clock, it is necessary that the distributed internal clocks should have a small phase difference. In the case where the internal clocks are distributed among many internal units, the wiring from the internal clock generating circuit to clock destinations is lengthened and the need arises for a multiplicity of clock buffers midway. The internal clocks thus distributed, therefore, are delayed considerably behind the input clock. In the case where the input circuit retrieves the input signal in synchronism with the internal clock thus delayed, a skew, no matter how small it is between the clock and the input signal at the input terminal, often leads to a large phase difference between the internal clock used by the input circuit to retrieve the input signal, i.e., the input timing signal and the input signal. In such a case, as described above, an input timing adjusting circuit is provided for one representative input signal, and the input signal is retrieved in synchronism with the input timing signal adjusted by the input timing adjusting circuit. For the input timing to be appropriately adjusted, however, it is necessary to provide a shift clock generating circuit as shown in FIG. 16 at either the driving end or the receiving end. Further, there occurs the need of input timing adjustment with a delay circuit and a delay control circuit. This poses the problem of a larger circuit size. A circuit capable of input timing adjustment, therefore, is required to be as small as possible.

In the case where the phase difference developed between the delayed clocks distributed by a clock distribution system and the input signals is a problem, the clock distribution system is considerably increased in size and the delay amount thereof fluctuates with temperature and source voltage. The phase difference thus is liable to fluctuate in accordance with the environment. It is thus impossible to retrieve the input signal at a satisfactory timing simply by displacing the timing by a predetermined amount. This phase difference constitutes a delay in the distribution system for distributing the internal clocks, that is to say, it is considered as a phase difference between the input clock and the distributed clock. In view of this, according to the 15th embodiment, an adjustment is made to eliminate the phase difference between the input clock and the distributed clock.

Figure 76:
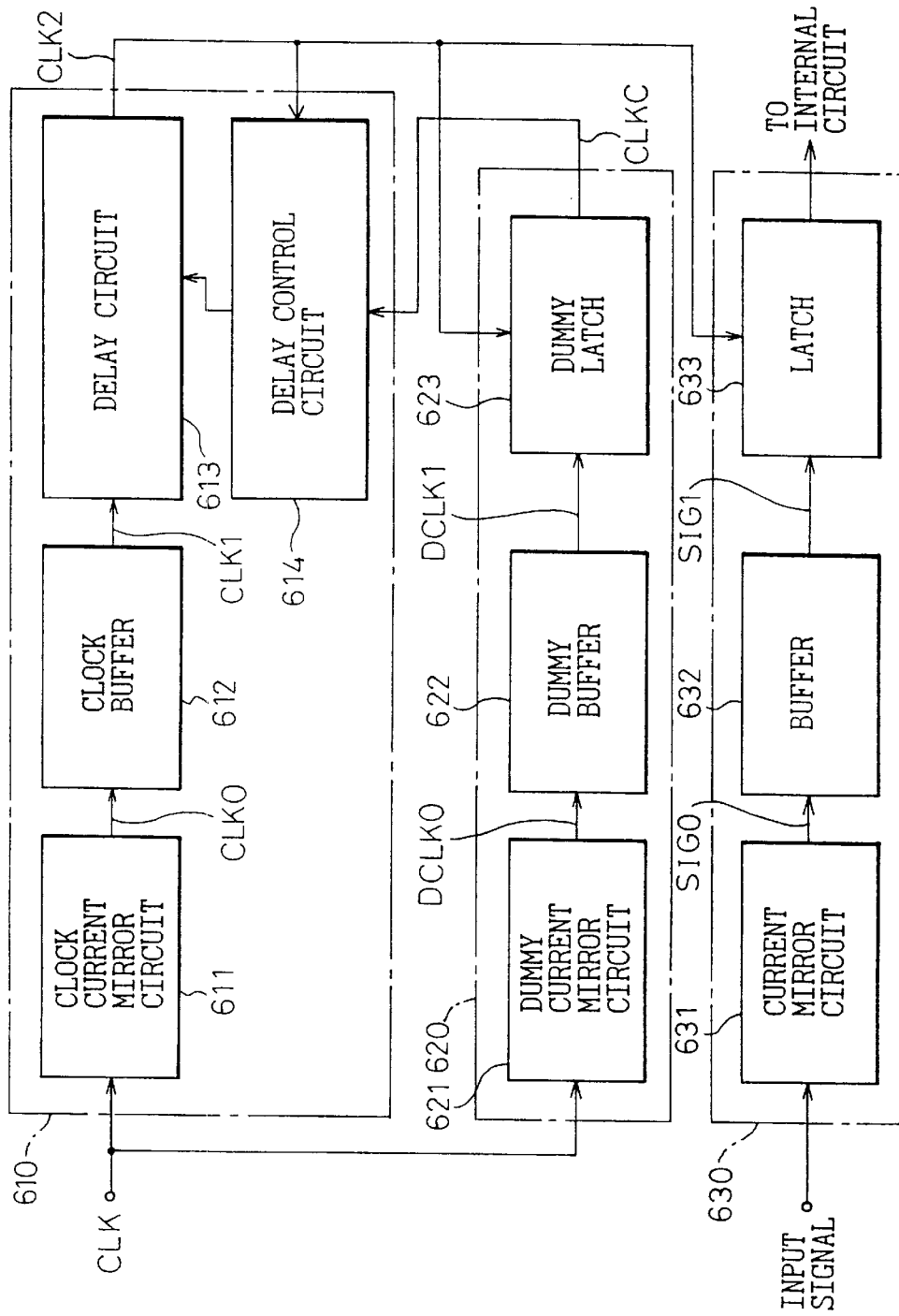
FIG. 76 is a diagram showing a configuration of an input section of a semiconductor device according to a 15th embodiment of the invention.

FIG. 76 is a diagram showing a configuration of the internal clock generating circuit and the signal input circuit of a receiving-end semiconductor device according to the 15th embodiment of the invention.

In FIG. 76, reference numeral 610 designates a clock generating circuit for generating an internal clock CLK2 from an external clock CLK, numeral 620 a dummy input circuit, and numeral 630 a signal input circuit. Although FIG. 76 shows only one signal input circuit, there actually exist as many signal input circuits as input signals. Also, although only one dummy input circuit 62C is provided and shared by all the signal input circuits, it may be provided for each set of a plurality of signal input circuits or for each signal input circuit. The clock generating circuit 610, like the conventional clock input circuit, includes a clock current mirror circuit 611 for receiving an input external clock CLK accurately, and a clock buffer circuit 612 for buffering the output of the clock current mirror circuit 611. Further, there are provided a delay circuit 613 and a delay control circuit 614 for controlling the delay amount in the delay circuit 613.

The signal input circuit 630, like the conventional signal input circuit, includes a current mirror circuit 631 for receiving an input signal, an input buffer circuit 632 and a latch circuit 633. The signal input circuit 630 is generally arranged in the vicinity of the signal input terminal, and is according to the present embodiment. The dummy input circuit 620 has a configuration equivalent to the signal input circuit 630, and includes a current mirror circuit 631 supplied with an external clock CLK, an input buffer circuit 632, a dummy current mirror circuit 621 corresponding to the latch circuit 633, a dummy input buffer circuit 622, and a dummy latch circuit 623. The dummy input circuit 620 is also arranged in the vicinity of the clock input terminal supplied with the external clock CLK. Each current mirror circuit, each buffer circuit and each latch circuit are identical to the conventional ones, respectively. The description of the current mirror circuit and the buffer circuit, therefore, will be omitted herein. The latch circuit has a configuration as shown in FIG. 20, and the delay circuit 613 and the delay control circuit 614 a configuration as shown in FIG. 19.

Figure 77:
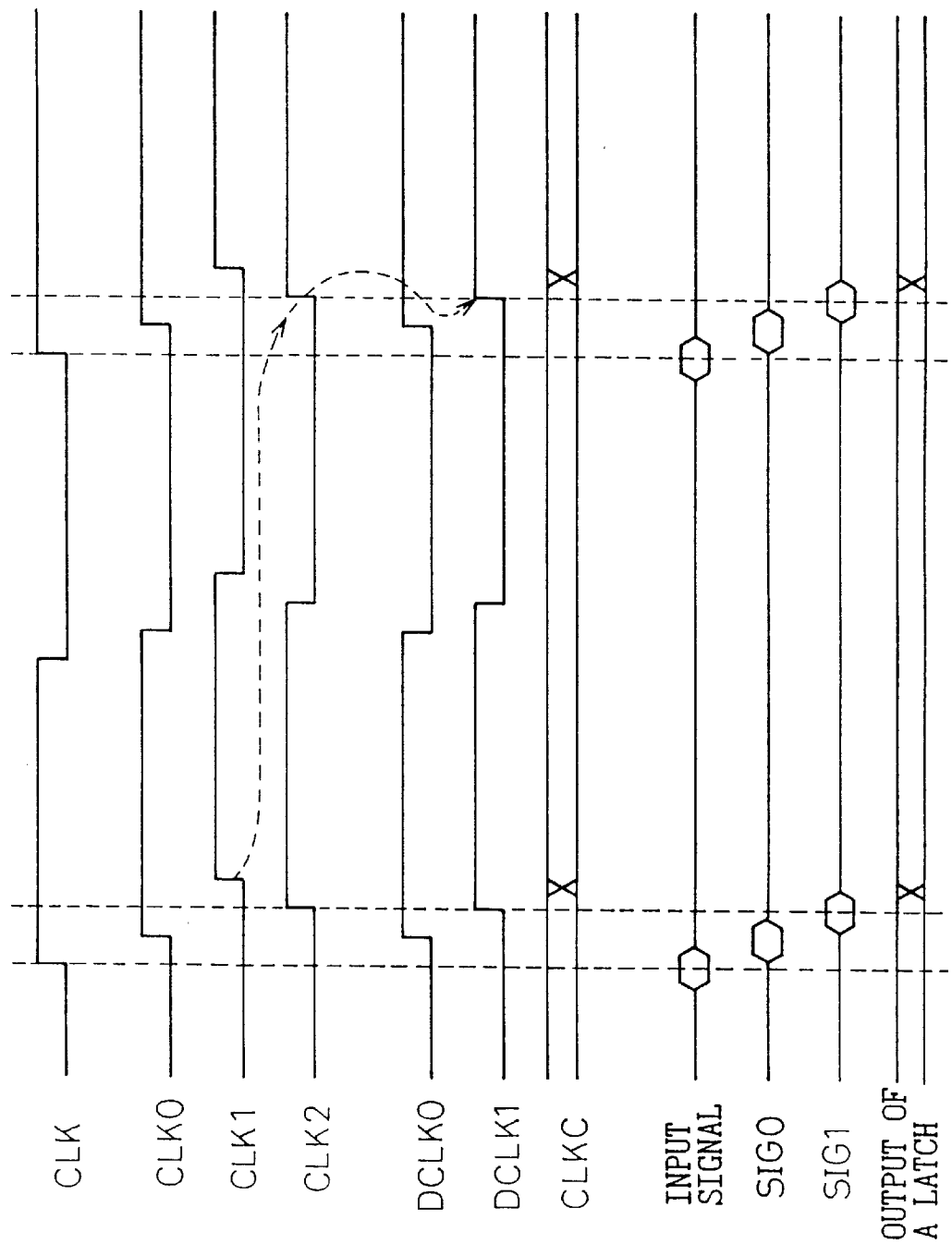
FIG. 77 is a time chart showing the operation of the 15th embodiment.

FIG. 77 is a time chart showing the operation of the configuration of FIG. 76.

As shown in FIG. 77, the input signal is applied in such a manner as to be effective before and after the rising edge of the external clock CLK. The output CLK0 of the clock current mirror circuit 611 and the output CLK1 of the clock buffer circuit 612 assume the form as shown due to the delay in the respective circuits. As shown by dashed arrow, the CLK1 is delayed by the delay circuit 613 and output behind the clock by about one cycle. The output SIG0 of the current mirror circuit 631 and the output SIG1 of the input signal buffer circuit 632 have an effective period as shown due to the delay of the input signals caused in the respective circuits. The dummy current circuit 621 is supplied with the external clock CLK. The dummy current circuit 621 and the dummy buffer circuit 622, however, produce outputs DCLK0 and DCLK1 as shown, respectively, due to the same delay caused as in the current mirror circuit 631 and the input signal buffer circuit 632. Specifically, DCLK1 rises at an optimum timing with respect to the effective period of SIG1. Consequently, the amount of delay in the delay circuit 613 is adjusted in such a manner that the internal clock CLK2 rises at the same timing as DCLK1. The dummy latch circuit 623 latches DCLK1 in accordance with the internal clock CLK2. Depending on whether DCLK1 rises before or after the internal clock CLK2, the CLKC of the dummy latch circuit 623 produces different outputs. In accordance with CLKC, therefore, the up/down counter of the delay control circuit 614 is counted up or down, and the delay amount in the delay circuit 613 is adjusted by feedback in such a manner that the internal clock CLK2 rises at the same timing as DCLK1.

Figure 78:
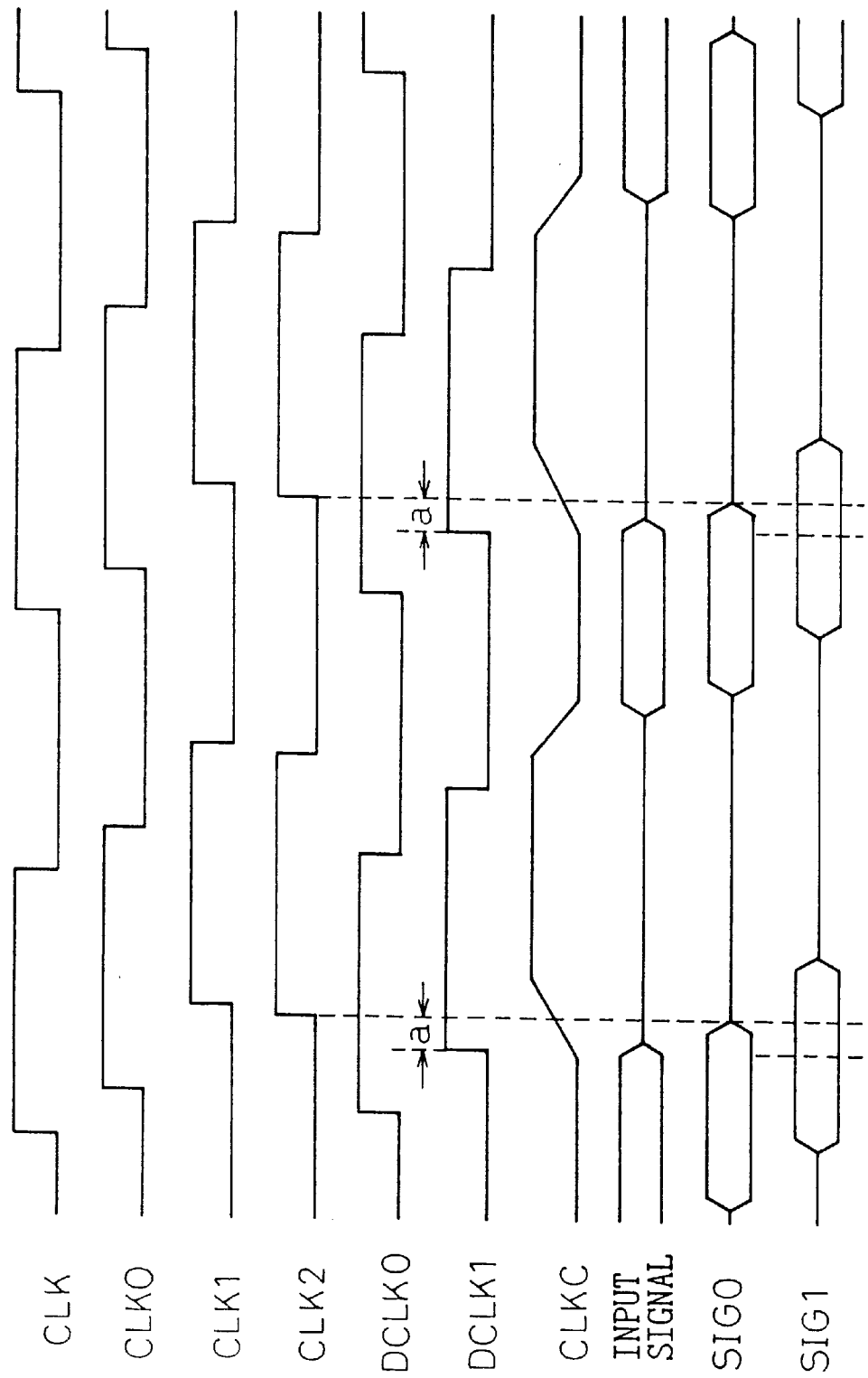
FIG. 78 is a time chart for explaining the operation of the 15th embodiment.
Figure 79:
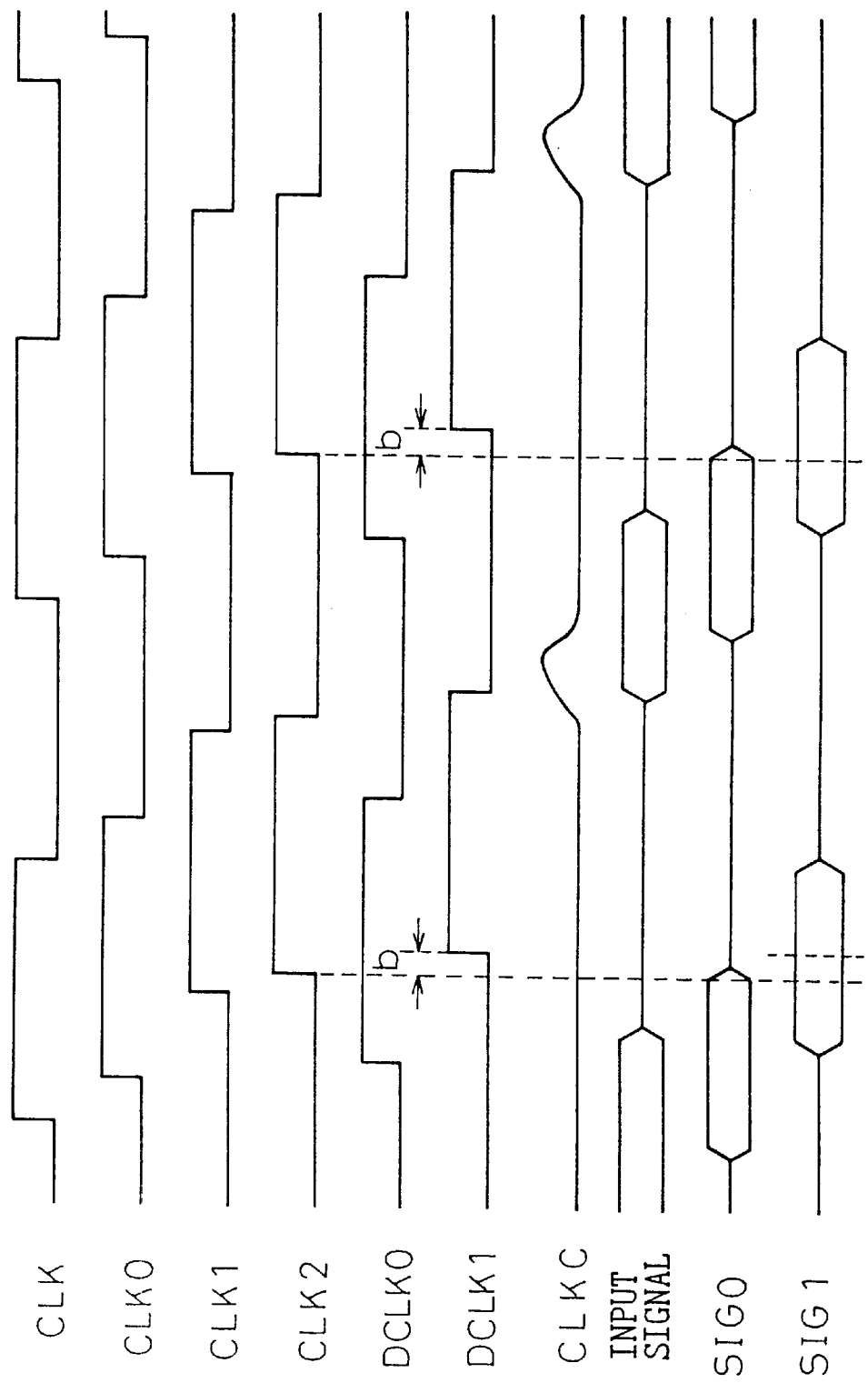
FIG. 79 is a time chart for explaining the operation of the 15th embodiment.

FIG. 78 is a time chart showing the case in which DCLK1 is in advance of the internal clock CLK2, and FIG. 79 is a time chart showing the case in which DCLK1 is delayed behind the internal clock CLK2.

As shown in FIG. 78, the input signal is assumed to be effective for an appropriate period before and after the rising edge of the external clock CLK. Also, assume that the DCLK1 output from the dummy buffer circuit 622 is advanced with respect to the internal clock CLK2 output from the clock generating circuit 610 and is input to the dummy latch circuit 623. In such a case, the output CLKC of the dummy latch circuit 623 undergoes a change as shown, and remains at H level as long as the internal clock CLK2 is at H level. The delay control circuit 614 reduces the delay amount in the delay circuit 613 at the falling edge of the internal clock CLK2 with CLKC at high level. As a result, the internal clock CLK2 changes in such a manner that the rising edge thereof coincides with that of DCLK1. Conversely, in the case where DCLK1 is delayed by b behind the internal clock CLK2, CLKC remains L substantially over the entire period as shown. The delay control circuit 614 increases the delay amount in the delay circuit 613 at the falling edge of the internal clock CLK2 with CLKC at L level. The result is that the internal clock CLK2 changes in such a manner that the rising edge thereof coincides with that of DCLK1.

As described above, according to the 15th embodiment, as compared with the case in which an external clock is applied to a dummy input circuit equivalent to the signal input circuit and latched by the internal clock, the direction in which the signal is latched by the internal clock through the signal input circuit is detected. On the basis of the result of this detection, an optimum timing is attained by adjustment. Regardless of the temperature conditions or the source voltage, therefore, the input signal can be retrieved at an always optimum timing.

Figure 80:
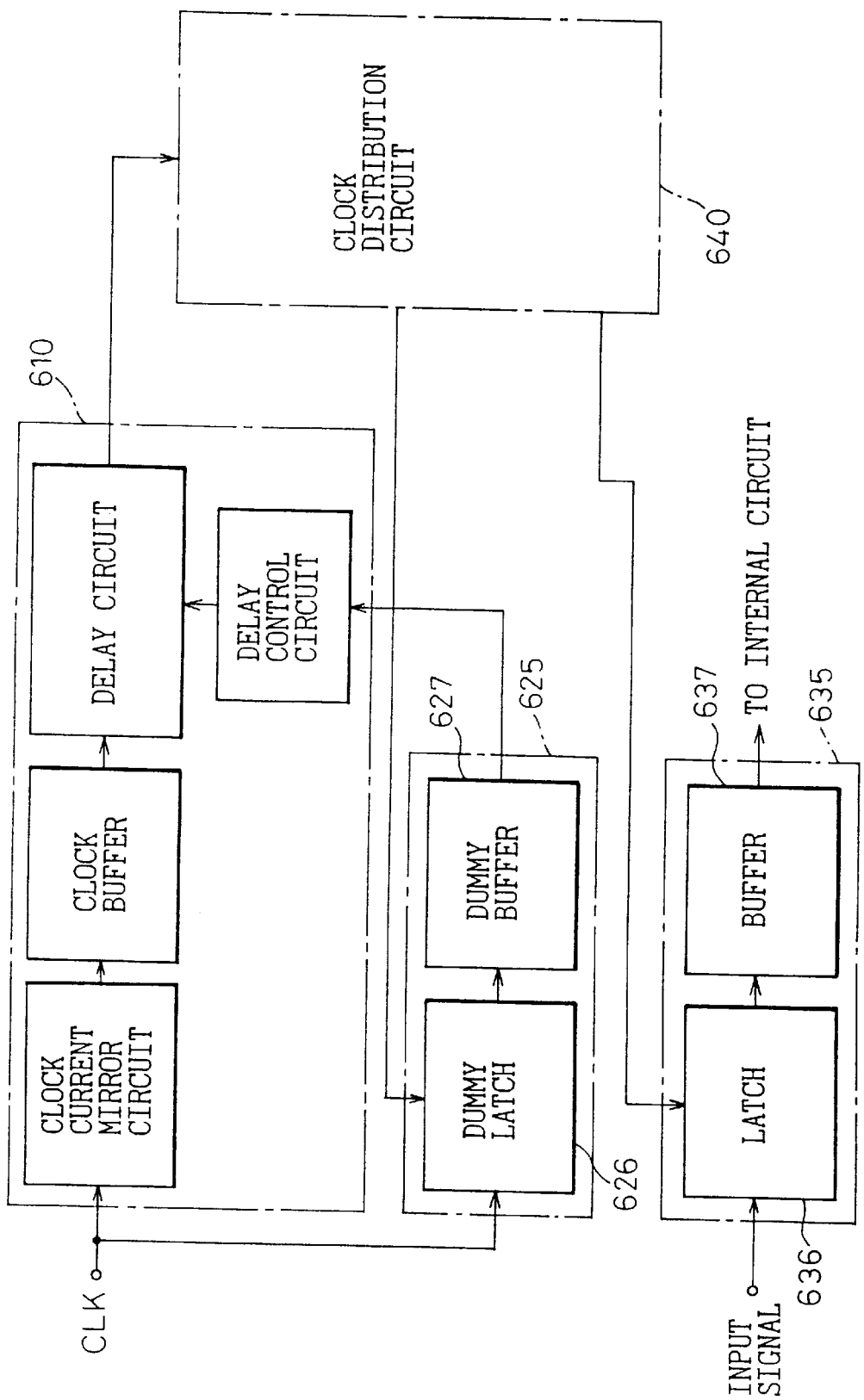
FIG. 80 is a diagram showing a configuration of an input section of a semiconductor device according to a 16th embodiment.

FIG. 80 is a diagram showing a configuration of the clock generating circuit and the signal input circuit of a semiconductor device according to a 16th embodiment. The difference of this embodiment from the 15th embodiment lies in a clock distribution circuit 640 provided for distributing the internal clock generated from the clock generating circuit among the various parts in the semiconductor device. The difference, therefore, is that the internal clock distributed from the clock distribution circuit 640 is applied to the dummy input circuit 625 and the signal input circuit 635, and that the dummy input circuit 625 and the signal input circuit 635 are of a latch type in which the external clock CLK or the input signal is applied directly to the latch circuit.

As described already, the use of a current mirror circuit at the portion receiving an external signal is for the purpose of accurately retrieving the signal change. The signal retrieval error directly constitutes a timing error, and therefore, a current mirror circuit capable of accurately retrieving the signal change has been conventionally used. The current mirror circuit, in spite of its capability of retrieving the signal change accurately, has a problem of large power consumption as current constantly flows therethrough. An application of the invention, on the other hand, makes it possible to adjust the input signal to be retrieved at an appropriate timing in the semiconductor device. Even without using the current mirror circuit, therefore, no timing error occurs at the time of signal retrieval. Consequently, as shown in the diagram, the signal input circuit 35 can be configured of the input signal latch circuit 636 and the buffer circuit 637 without using the current mirror circuit. The dummy input circuit 625 also of course is configured of an equivalent dummy latch circuit 626 and a dummy buffer circuit 627. This can reduce power consumption.

Figure 81:
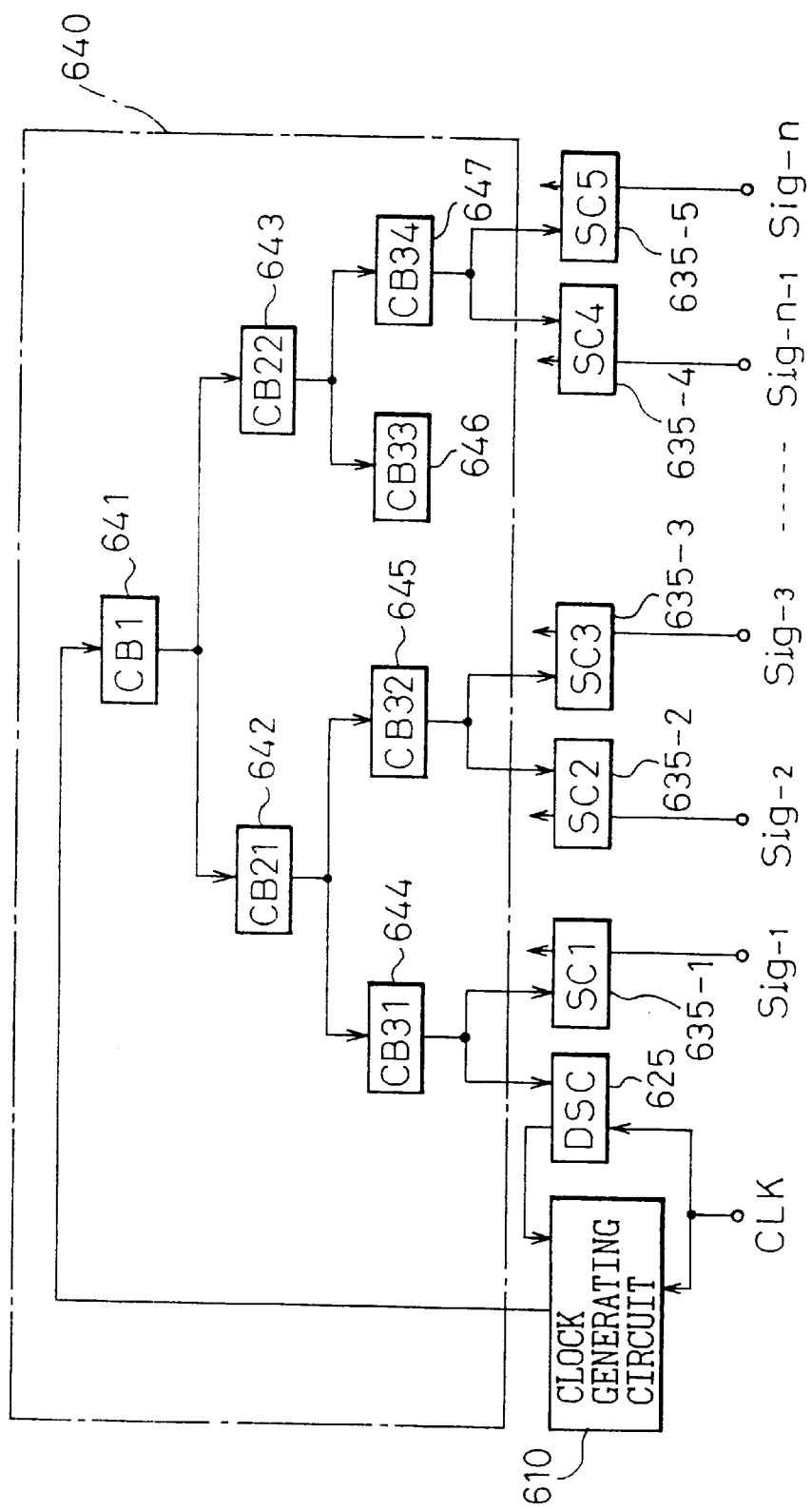
FIG. 81 is a diagram showing a configuration of a clock distribution circuit, and an arrangement of a clock generating circuit, a signal input circuit and a dummy input circuit according to the 16th embodiment.

FIG. 81 is a diagram showing an example layout of the clock distribution circuit 640, the clock generating circuit 610, the dummy input circuit (DSC) 625 and a plurality of signal input circuits.

As shown in the diagram, this semiconductor device is supplied with a plurality of signals Sig-1, Sig-2, . . . , Sig-n and therefore includes signal input circuits (SC-1, SC-2, ..., SC-n) 35-1, 35-2, ..., 35-n for the respective input signals. The clock distribution circuit 640 distributes the internal clock from the clock generating circuit 610 in the semiconductor device via buffer circuits (CB1, CB21, ..., CB34) 641 to 647. All these routes are equidistant with an equal wiring length to the destinations and an equal number of buffer circuits arranged in each route. Consequently, in FIG. 81, the internal clocks applied to the signal input circuits 635-1, 635-2, ..., 635-n and the dummy input circuit 625 are all in phase with each other. If the dummy input circuit 625 judges the extent to which the phase of the internal clock is advanced of that of the external clock and the delay amount in the clock generating circuit 610 is adjusted on the basis of the judgement, then, all the signal input circuits 635-1, 635-2, ..., 635-n can retrieve the input signals Sig-1, Sig-2, ..., Sig-n at an appropriate timing.

Figure 82:
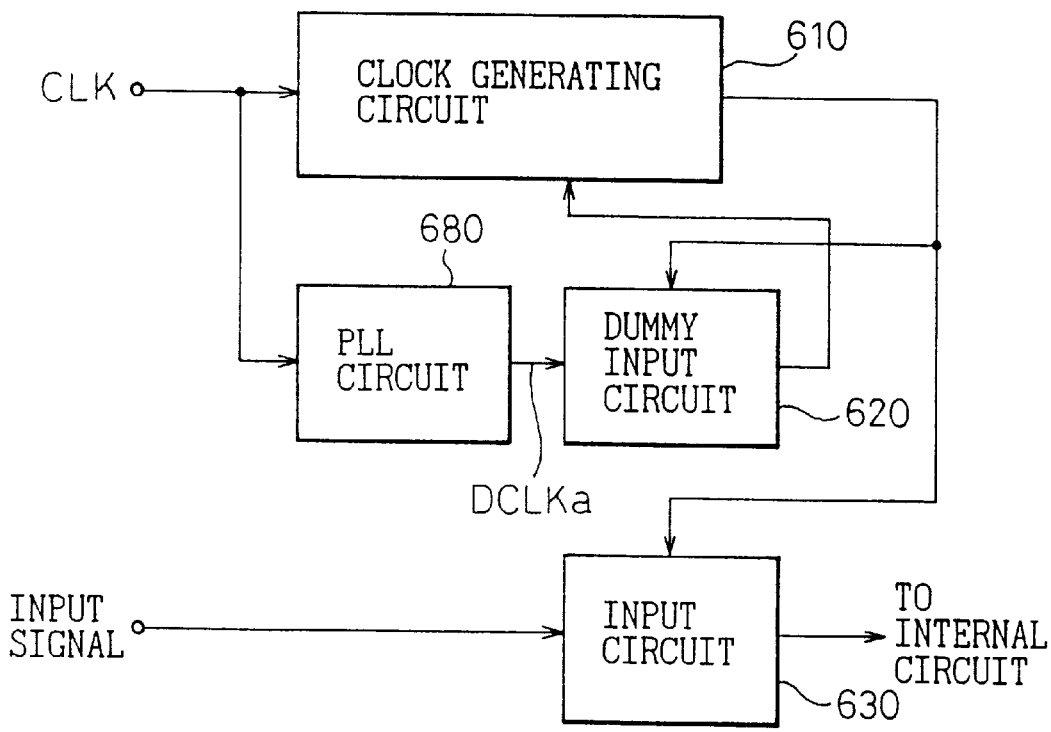
FIG. 82 is a diagram showing a configuration according to a 17th embodiment of the invention.
Figure 83:
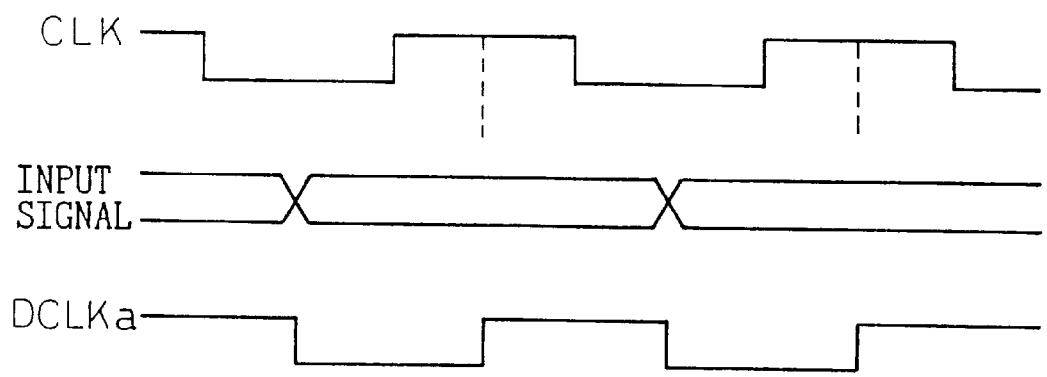
FIG. 83 is a diagram showing the operation of the 17th embodiment.

FIG. 82 is a diagram showing a configuration of the clock generating circuit and the signal input circuit of a semiconductor device according to a 17th embodiment. FIG. 83 is a time chart showing the operation of the 17th embodiment. A clock generating circuit 610, a dummy input circuit 620 and an input circuit 630 are identical to the corresponding circuits in the 15th embodiment. The difference of this embodiment from the 15th embodiment resides in the provision of a PLL circuit 680. According to the first embodiment, the input signal is effective for a predetermined length of time before and after the rising edge of the external clock. In spite of this, the input signal may remain effective for a predetermined length of time about the phase displaced with respect to the leading or falling edge of the external clock. As shown in FIG. 83, in the 17th embodiment, the input signal is switched at the time point when CLK is at L level just intermediate between the leading and falling edges of the external clock CLK and is shown to be retrieved at an exactly intermediate point between the leading and falling edges of CLK at H level. For the dummy input circuit to judge the timing, a signal changing at a point just intermediate between the leading and falling edges of the CLK at H level in phase with the input signal is required to be input to the dummy input circuit. Such a signal may be generated by delaying the external clock CLK. In such a case, however, the problem is caused by an error occurring in the circuit for delaying the CLK, which makes an accurate judgement impossible. For this reason, as shown in FIG. 82, the external clock CLK is delayed by one-fourth of the clock cycle to generate a signal DCLKa, which is applied to the dummy input circuit. A DLL (delay locked loop) circuit can also be used in place of the PLL circuit.

It will thus be understood from the foregoing description that according to the present invention, even if the received clock and the input signal are out of phase with each other due to the difference in transmission time through signal routes, the input signal is retrieved free of phase displacement. The input establishment time, therefore, can be reduced to a minimum length required for circuit operation. In addition, the signal retrieved and output is resynchronized, thereby eliminating both the out-of-phase condition and an operation error at the same time.

What is claimed is:

1. A semiconductor device comprising:
   a clock generating circuit for generating a clock and a shift clock displaced from said clock by a predetermined amount of phase and selectively producing said clock and said shift clock, and
   a signal output circuit for producing an output signal in synchronism with selected one of said clock and said shift clock produced by said clock generating circuit;
   wherein said device operates in a selected one of several modes including a normal mode for producing said output signal in synchronism with said clock and a receiving-end timing adjust mode for producing said output signal in synchronism with said shift clock.

2. A semiconductor device according to claim 1, wherein said clock generating circuit includes:
   a clock source for generating a basic clock;
   a plurality of stages of shift delay circuits having the same selectable delay amount, the output of a preceding stage being input into a subsequent stage, said basic clock being input to the first stage;
   a clock phase comparator circuit for comparing the phase of the output in the last stage of said shift delay circuits with the phase of said basic clock;
   a delay control circuit for controlling the delay amount of said plurality of stages of shift delay circuits in such a manner that the phase of the output in said last stage coincides with the phase of said basic clock on the basis of the result of comparison at said clock phase comparator circuit; and
   a selection circuit adapted to be switched for producing selected one of said basic clock and the output of said last stage as a clock in said normal mode and producing the output of a predetermined stage as said shift clock in said receiving timing adjust mode.

3. A semiconductor device according to claim 1, further comprising an output timing adjusting circuit for comparing the phase of said output signal with the phase of said clock and adjusting the phase of said output signal and the phase of said clock into a predetermined relation.

4. A semiconductor device comprising:
   a clock generating circuit for generating an internal clock on the basis of a received clock;
   an input buffer circuit for receiving an input signal applied thereto from an external source; and
   an input circuit for retrieving and outputting said input signal in synchronism with said internal clock supplied from said clock generating circuit;
   wherein said input circuit includes:
   a delay circuit with a selectable delay amount for delaying an output of said input buffer circuit;
   an input circuit portion for retrieving the output of said input buffer circuit in synchronism with said internal clock;
   a phase judge circuit for judging a phase of the output of said input buffer circuit with respect to said internal clock by judging an output signal value of said input circuit portion; and
   a delay control circuit for controlling the delay amount of said delay circuit in such a manner that the output of said input buffer circuit has a predetermined phase relation with respect to said internal clock, on the basis of the result of judgement at said phase judge circuit.

5. A semiconductor device according to claim 4, further comprising a mode register/decoder for recognizing a mode indication signal input thereto from an external source for indicating the receiving timing adjust mode for the input signal;
   wherein said delay control circuit changes the delay amount on the basis of the result of judgement at said phase judge circuit during said receiving timing adjust mode and holds the delay amount during the remaining time.

6. A semiconductor device according to claim 5, further comprising a 1/2 frequency divider circuit for frequency-dividing the output of said input buffer circuit by one half, and a switching circuit for switching the signal input to said delay circuit between the output of said input buffer circuit and the output of said 1/2 frequency divider circuit;

wherein said input signal of said predetermined pattern is applied during said receiving timing adjust mode; and wherein the output of said 1/2 frequency divider circuit is switched to be applied to said delay circuit in the initial stage of said receiving timing adjust mode, and the output of said input buffer circuit is switched to be applied to said delay circuit subsequently.

7. A semiconductor device system comprising a plurality of semiconductor devices operating in synchronism with a clock and means for transmitting signals between said semiconductor devices, said semiconductor devices including a driving-end semiconductor device for producing said clock and an output signal in synchronism with said clock and a receiving-end semiconductor device for retrieving as an input signal said output signal produced from said driving-end semiconductor device in synchronism with said clock received;

said semiconductor device system operating in one of operation modes including a normal mode and a receiving timing adjust mode for adjusting a timing of retrieving said input signal at said receiving-end semiconductor device;

wherein said driving-end semiconductor device produces said output signal of a predetermined pattern during said receiving timing adjust mode;

wherein said receiving-end semiconductor device includes a clock generating circuit for generating an internal clock on the basis of said received clock, a plurality of input circuits for retrieving and producing input signals in synchronism with said internal clock supplied thereto from said clock generating circuit, and an inter-signal timing adjusting circuit for detecting a phase difference between output signals of said input circuits and adjusting said output signals into the same phase;

wherein each of said input circuits includes an input timing adjusting circuit for adjusting the retrieving timing of the input signal; and wherein said inter-signal timing adjusting circuit and said input timing adjusting circuit change the delay amount during said receiving timing adjust mode and holds the delay amount during said normal mode.

8. A semiconductor device comprising:

a clock generating circuit for generating an internal clock on the basis of an external clock applied thereto from an external source;

a signal input circuit for receiving an input signal applied thereto in synchronism with said external clock and retrieving said input signal into said semiconductor device in synchronism with the internal clock generated by said clock generating circuit; and a dummy input circuit supplied with a signal in synchronism with said input signal having the same frequency as said external clock for judging as output signal value at a time of retrieving said input signal in synchronism with the internal clock generated by said clock generating circuit thereby to judge whether a timing of retrieving said input signal of said signal input circuit is advanced or delayed with respect to said internal clock;

wherein said clock generating circuit includes a delay circuit for selectively delaying said external clock applied thereto and generating said internal clock on the basis of the result of judgement at said dummy input circuit, and a delay control circuit for controlling the delay amount of said delay circuit on the basis of the result of judgement at said dummy input circuit.

9. A semiconductor device according to claim 8, wherein said input signal remains effective for a predetermined length of time before and after the rising edge or the falling edge of said external clock; and wherein said dummy input circuit is supplied with said external clock.

10. A semiconductor device according to claim 8, wherein said input signal is displaced by a predetermined amount of phase with respect to the rising edge or the falling edge of said external clock during said effective period;

said semiconductor device further comprising an out-of-phase clock generating circuit for generating a signal having the same period as, but a different phase from, said external clock on the basis of said external clock applied thereto; and wherein said dummy input circuit is supplied with a clock in synchronism with said input signal output from said out-of-phase clock generating circuit.

11. A semiconductor device according to claim 8, wherein the signal route for transmitting said internal clock from said clock generating circuit to said signal input circuit has the same delay amount as the signal route for transmitting said internal clock from said clock generating circuit to said dummy input circuit.

12. A semiconductor device according to claim 11, wherein the signal route for transmitting said internal clock from said clock generating circuit to said signal input circuit has the same distance as the signal route for supplying said internal clock from said clock generating circuit to said dummy input circuit.

13. A semiconductor device according to claim 8, wherein said signal input circuit and said dummy input circuit are of a latch type having a latch circuit supplied with said input signal directly.

\* \* \* \* \*

UNITED STATES PATENT AND TRADEMARK OFFICE
CERTIFICATE OF CORRECTION

PATENT NO. : 6,151,274
DATED : November 21, 2000
INVENTOR(S) : Yoshihiro Takemae et al.

It is certified that error appears in the above-identified patent and that said Letters Patent is hereby corrected as shown below:

<u>Title page,</u>
Item [54], please insert the 8th inventor as follows:

-- Masao NAKANO --

Signed and Sealed this

Twentieth Day of November, 2001

Attest:

*Nicholas P. Godici*

*Attesting Officer*

NICHOLAS P. GODICI
*Acting Director of the United States Patent and Trademark Office*